(12) United States Patent
Chen et al.

(10) Patent No.: US 8,877,080 B2
(45) Date of Patent: *Nov. 4, 2014

(54) USING VACUUM ULTRA-VIOLET (VUV) DATA IN MICROWAVE SOURCES

(75) Inventors: Lee Chen, Cedar Creek, TX (US); Jianping Zhao, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 482 days.

This patent is subject to a terminal disclaimer.

(21) Appl. No.: 13/275,964

(22) Filed: Oct. 18, 2011

(65) Prior Publication Data

US 2012/0095586 A1 Apr. 19, 2012

Related U.S. Application Data

(60) Provisional application No. 61/394,303, filed on Oct. 18, 2010, provisional application No. 61/394,290, filed on Oct. 18, 2010.

(51) Int. Cl.
| | |
|---|---|
| *G01L 23/06* | (2006.01) |
| *H01L 21/67* | (2006.01) |
| *H01J 37/32* | (2006.01) |

(52) U.S. Cl.
CPC .... *H01L 21/67069* (2013.01); *H01L 21/67213* (2013.01); *H01L 21/67253* (2013.01); *H01J 2237/334* (2013.01); *H01J 37/3299* (2013.01); *H01J 37/32972* (2013.01); *H01J 37/32926* (2013.01)
USPC .......... 216/60; 216/59; 216/63; 216/67; 216/69; 438/706; 438/710; 156/345.24; 156/345.28

(58) Field of Classification Search
CPC .......... H01J 2237/32; H01J 2237/334; H01J 37/32082; H01J 37/32192; H01J 37/32935; H01J 37/3299; H01L 21/3065
See application file for complete search history.

(56) References Cited

U.S. PATENT DOCUMENTS

| | | |
|---|---|---|
| 6,486,941 B1 | 11/2002 | Hazelton et al. |
| 6,504,162 B1 | 1/2003 | Binnard et al. |
| 6,523,695 B1 | 2/2003 | Utea et al. |
| 6,577,477 B1 | 6/2003 | Lin |
| 6,590,639 B1 | 7/2003 | Yuan et al. |
| 6,686,991 B1 | 2/2004 | Binnard et al. |
| 6,758,313 B2 | 7/2004 | Binnard |
| 6,774,981 B1 | 8/2004 | Watson et al. |
| 6,842,277 B2 | 1/2005 | Watson |
| 6,987,558 B2 | 1/2006 | Yuan et al. |
| 7,072,024 B2 | 7/2006 | Novak |
| 7,161,671 B2 | 1/2007 | Shibata et al. |
| 7,299,147 B2 | 11/2007 | Shibata et al. |
| 7,417,714 B2 | 8/2008 | Binnard et al. |
| 7,659,522 B2 | 2/2010 | Kim et al. |
| 2002/0085190 A1 | 7/2002 | Nishi |
| 2002/0093637 A1 | 7/2002 | Yuan et al. |
| 2002/0109823 A1 | 8/2002 | Binnard et al. |
| 2002/0137358 A1 | 9/2002 | Binnard et al. |
| 2002/0179806 A1 | 12/2002 | Teng |
| 2003/0057619 A1 | 3/2003 | Utea et al. |

(Continued)

*Primary Examiner* — Lan Vinh
*Assistant Examiner* — Jiong-Ping Lu

(57) ABSTRACT

The invention provides an apparatus and methods for creating gate structures on a substrate in real-time using Vacuum Ultra-Violet (VUV) data and Electron Energy Distribution Function (EEDf) data and associated (VUV/EEDf)-related procedures in (VUV/EEDf) etch systems. The (VUV/EEDf)-related procedures can include multi-layer-multi-step processing sequences and (VUV/EEDf)-related models that can include Multi-Input/Multi-Output (MIMO) models.

17 Claims, 14 Drawing Sheets

(56) References Cited

U.S. PATENT DOCUMENTS

| | | | |
|---|---|---|---|
| 2003/0097205 A1 | 5/2003 | Yuan et al. | |
| 2003/0102721 A1 | 6/2003 | Ueta et al. | |
| 2003/0169412 A1 | 9/2003 | Hazelton | |
| 2003/0201162 A1* | 10/2003 | Liu et al. | 204/192.13 |
| 2003/0234918 A1 | 12/2003 | Watson | |
| 2004/0017623 A1 | 1/2004 | Watson | |
| 2004/0100007 A1 | 5/2004 | Engwall et al. | |
| 2004/0128918 A1 | 7/2004 | Yang et al. | |
| 2004/0244963 A1 | 12/2004 | Hazelton | |
| 2005/0085087 A1* | 4/2005 | Okigawa et al. | 438/710 |
| 2005/0128449 A1 | 6/2005 | Phillips | |
| 2005/0157280 A1 | 7/2005 | Novak | |
| 2005/0162802 A1 | 7/2005 | Kho et al. | |
| 2005/0174551 A1 | 8/2005 | Phillips | |
| 2006/0061751 A1 | 3/2006 | Teng et al. | |
| 2006/0087634 A1 | 4/2006 | Brown et al. | |
| 2006/0101928 A1 | 5/2006 | Binnard et al. | |
| 2006/0223317 A1* | 10/2006 | Hori et al. | 438/689 |
| 2007/0097340 A1 | 5/2007 | Yuan et al. | |
| 2007/0109534 A1 | 5/2007 | Shibata et al. | |
| 2007/0247602 A1 | 10/2007 | Binnard | |
| 2007/0252965 A1 | 11/2007 | Binnard | |
| 2008/0086440 A1 | 4/2008 | Hoey et al. | |
| 2008/0187087 A1 | 8/2008 | Kim et al. | |
| 2008/0285005 A1 | 11/2008 | Gery et al. | |
| 2009/0212702 A1 | 8/2009 | Yim et al. | |
| 2009/0304553 A1 | 12/2009 | Gordon | |
| 2010/0134445 A1 | 6/2010 | Cho et al. | |
| 2010/0186942 A1 | 7/2010 | Phillips et al. | |
| 2010/0284119 A1 | 11/2010 | Coakley et al. | |
| 2011/0008525 A1 | 1/2011 | Dalakos et al. | |

* cited by examiner

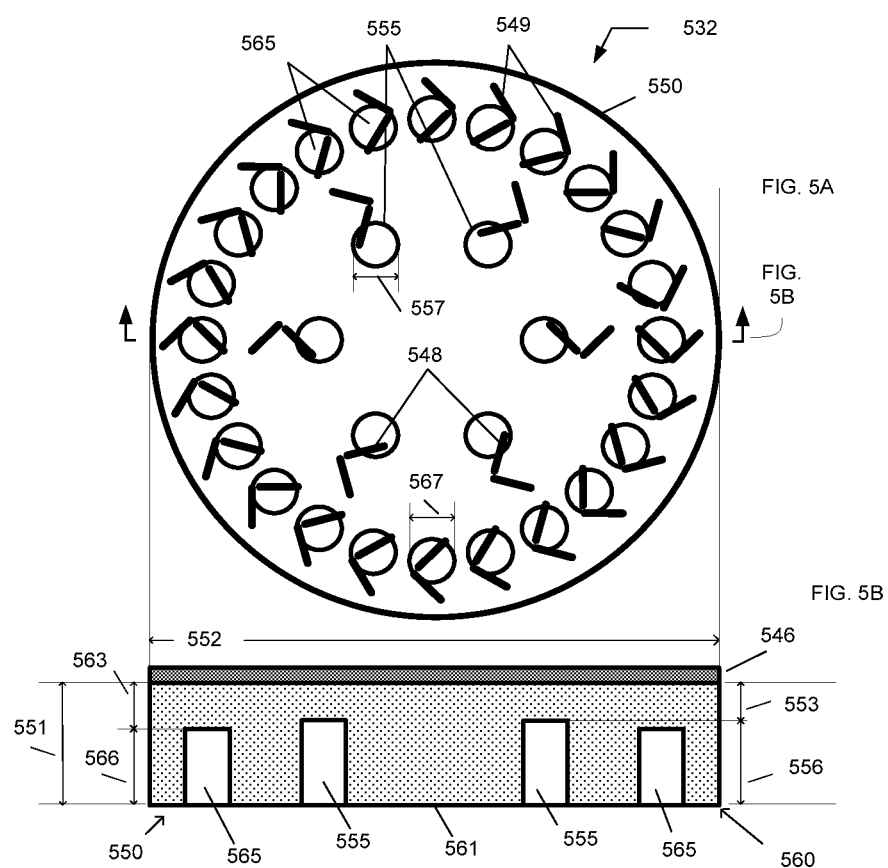

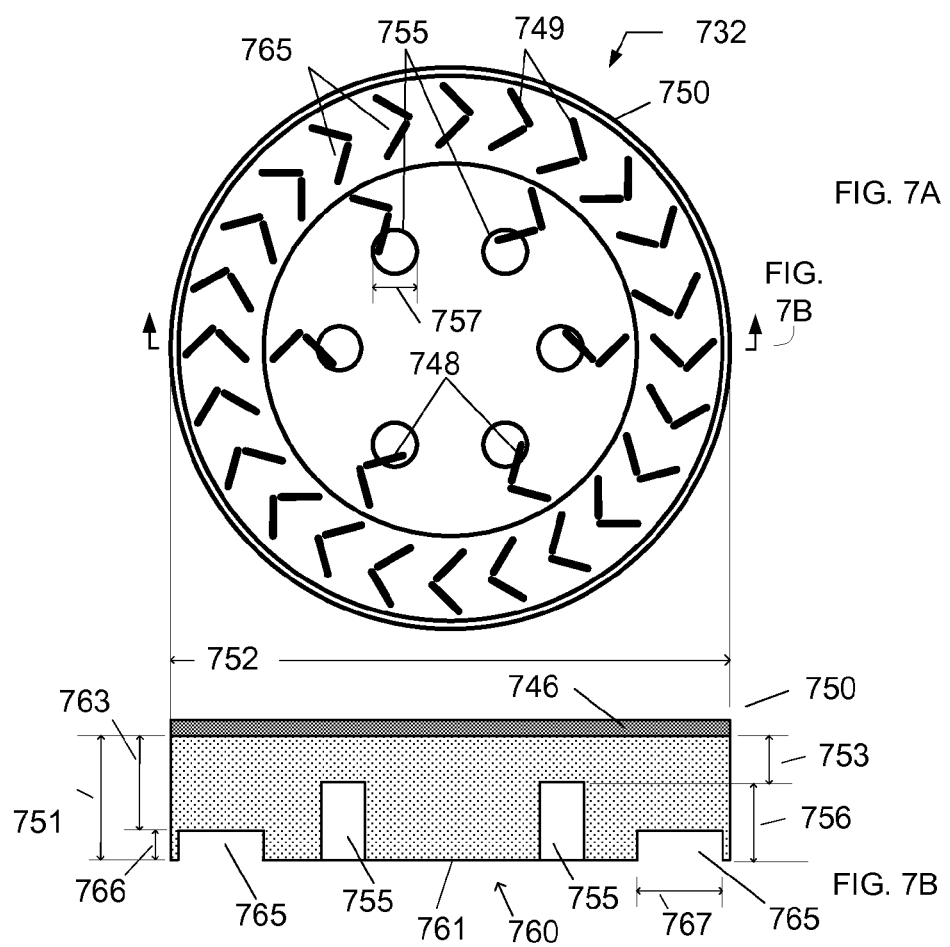

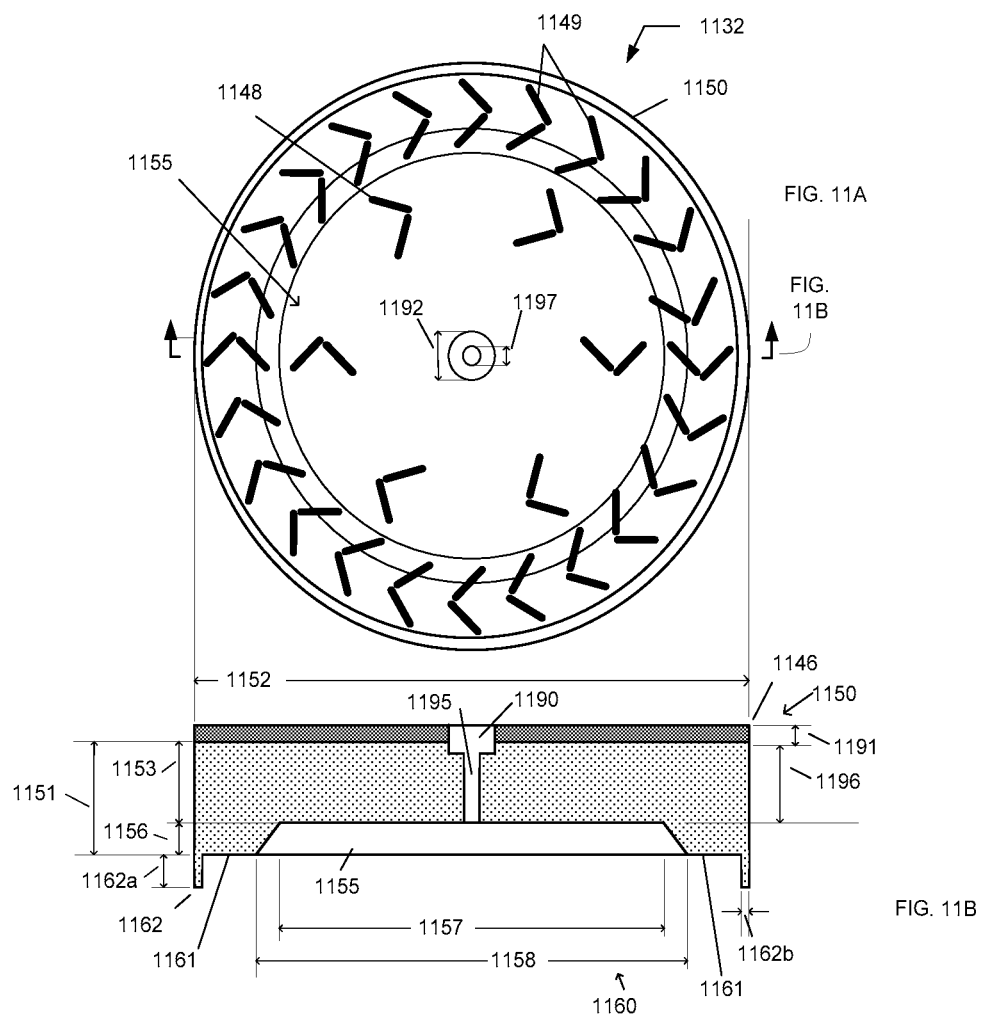

1300

1400

USING VACUUM ULTRA-VIOLET (VUV) DATA IN MICROWAVE SOURCES

CROSS-REFERENCE TO RELATED APPLICATIONS

This application is related to co-pending U.S. patent application Ser. No. 13/275,929, entitled "Using Vacuum Ultra-Violet (VUV) Data in Radio Frequency (RF) Plasma Sources", filed on even date herewith. This application is related to Provisional Application 61/394,290 filed on Oct. 18, 2010 entitled "Using VUV Data and Electron Energy Distribution Data in Radio Frequency (RF) Sources". This application is related to Provisional Application 61/394,303 filed on Oct. 18, 2010 entitled "Using VUV Data and Electron Energy Distribution Data in Microwave Sources", and the contents of these applications are herein incorporated by reference in their entireties.

BACKGROUND OF THE INVENTION

1. Field of the Invention

The present invention relates to substrate/wafer processing, and more particularly to microwave processing systems and methods for processing substrates and/or semiconductor wafers using Vacuum Ultra-Violet (VUV) Data.

2. Description of the Related Art

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

SWP sources are known to offer improved plasma processing performance, particularly for etching processes, over CCP systems, ICP systems and resonantly heated systems. SWP sources produce a high degree of ionization at a relatively lower Boltzmann electron temperature ($T_e$). In addition, SWP sources generally produce plasma richer in electronically excited molecular species with reduced molecular dissociation. However, the practical implementation of SWP sources still suffers from several deficiencies including, for example, plasma stability and uniformity.

In current semiconductor process, electronegative gases (e.g. $O_2$, NO, $N_2O$, $Cl_2$, HBr, $F_2$, $S_xF_y$, $C_xF_y$, $C_xF_yH_z$, or their mixtures, etc.) are often added into electropositive gases such as $N_2$ or inert gases (e.g. Ar) for etch, deposition, and cleaning processes. Due to the interaction between electropositive ionization (produce positive ions and electrons) and electronegative ionization (produce positive ions and negative ions along with small amount electrons), the balance between electron attachment and electron detachment may not continue. Together with other known or unknown reasons, plasma generation using mixtures of electronegative gas and electropositive gas have many kinds of problems and issues related to process control and quality.

Instability can be a problem in a plasma source. For example, plasma generation can be unstable and this instability may manifest as plasma "flickering", or the plasma source may not be tuned at certain process conditions when using a mixture of electronegative gas and electropositive gas. The instability problem can influence the process performance by restricting the process window, affecting plasma uniformity, reducing productivity by adding stabilization time, or may even cause device failure, etc.

Electromagnetic (EM) radiation can be a problem in a plasma source. For example, the electron density in the plasma is lower when one or more electronegative gases are added. As a result, the EM wave would not be blocked (absorbed) by plasma (plasma electrons), and the EM wave would propagate to the wafer area, or areas with sensitive devices attached to the plasma chamber. Such EM radiation could damage the wafer thereby causing device and process failure, or adversely affect the sensitive devices attached to the plasma chamber. Therefore, the plasma process has to be restricted to electron over-dense conditions, such as higher power or specific ranges of pressure, and this limits the process window and adds energy cost.

Uniformity can be another exemplary problem in a plasma source. In some cases, the electron density and ion density may not be uniform because the electronegative discharge is strongly dependant on the electrical field intensity. For example, there can be strong electronegative discharge with very low electron density, or there can be totally electropositive discharge with very low negative ion density, or there can be other types of discharges that can be between the two extreme conditions, depending on pressure, partial pressure (or flow rate ratio) of electronegative gas to electropositive gas, and power. If, at the plasma generation region, the electric field is not uniformly distributed, then a non-uniformly distributed electronegative discharge region and electropositive discharge region can cause a non-uniform electron density and ion density. This non-uniformity may also affect plasma stability.

Vacuum Ultra-Violet (VUV) radiation can be another exemplary problem in a plasma source. In some cases, the electron density and ion density may not be uniform and the VUV radiation can be dependent on the electron density, the ion density, and/or the electrical field intensity. For example, there can be different VUV radiation for different electron densities, and/or the VUV radiation can be dependent on pressure, partial pressure (or flow rate ratio) of electronegative gas to electropositive gas, and power. If, at the plasma generation region, the electric field is not uniformly distributed, then a non-uniformly distributed electronegative discharge region and electropositive discharge region can cause non-uniform electron density, ion density, and/or VUV radiation.

Erosion and contamination problems can also exist in a plasma source when the plasma is generated near the plasma-dielectric interface. The reactive and corrosive electronegative gas or other process gas cause dielectric plate erosion by chemical reaction and/or by physical sputtering and contamination. This induces not only plasma generation and control problems, but also reduces the lifetime of the dielectric plate, and requires extra plate cleaning processes and/or replacement. In addition, this erosion and contamination would increase particle density that may cause device/wafer failure.

The above are only several examples that would be induced by adding electronegative gas or other process gases in the plasma process chamber. The problems are not limited to those examples and are not limited to microwave plasma source, meaning that those problems can be associated to any plasma source and processes.

SUMMARY OF THE INVENTION

The invention relates to plasma generation systems that are controlled using Plasma VUV Intensity and Electron Energy Distribution control techniques.

The Plasma VUV Intensity/Electron Energy Distribution controlled processing system and the Plasma VUV Intensity and Electron Energy Distribution control techniques associated therewith can be applied to any kind of plasma generation methods, any kind of plasma sources, and any kind of plasma processes. For example, the plasma processing system can include radio frequency (RF) sources, CCP sources, ICP sources, microwave sources, microwave radial line slotted antenna (RLSA) plasma sources, surface wave plasma sources, microwave electron cyclotron resonance (ECR) sources, etc, as some examples. In the following, one or more surface wave plasmas are presented to address the novelty and concept of the invention. However, the invention should cover any kind of plasma sources, plasma generation methods, and plasma processes using the method and concept addressed herein.

In some embodiments, surface wave plasma (SWP) sources are used. The SWP source comprises an electromagnetic (EM) wave launcher configured to couple EM energy in a desired EM wave mode to a plasma by generating a surface wave on a plasma-facing surface of the EM wave launcher adjacent the plasma. The EM wave launcher comprises a slotted antenna having a plurality of slots. The plurality of slots is configured to couple the EM energy from a first region above the slotted antenna to a second region below the slotted antenna. A dielectric plate or resonator plate is positioned in the second region and has a lower surface that includes the plasma-facing surface of the EM wave launcher. The SWP source further comprises a first recess configuration formed in the plasma-facing surface, wherein the first recess configuration is substantially aligned with a first arrangement of slots in the plurality of slots, and a second recess configuration formed in the plasma-facing surface, wherein the second recess configuration is either partly aligned with a second arrangement of slots in the plurality of slots or not aligned with the second arrangement of slots in the plurality of slots. A power coupling system is coupled to the EM wave launcher and configured to provide the EM energy to the EM wave launcher for forming the plasma.

According to other embodiments, other surface wave plasma (SWP) sources are used. The SWP source comprises an electromagnetic (EM) wave launcher configured to couple EM energy in a desired EM wave mode to plasma by generating a surface wave on a plasma-facing surface of the EM wave launcher adjacent said plasma. The EM wave launcher comprises a slotted antenna having a plurality of slots formed therethrough configured to couple the EM energy from a first region above the slotted antenna to a second region below the slotted antenna, and a resonator plate positioned in the second region and having a lower surface including the plasma-facing surface of the EM wave launcher. A first recess configuration is formed in the plasma-facing surface, wherein the first recess configuration is substantially aligned with a first arrangement of slots in the plurality of slots. Additionally, means for stabilizing the plasma for a pressure in the process space ranging from about 10 mtorr to about one torr is provided, wherein the means for stabilizing the plasma is formed in the plasma-facing surface of the resonator plate. Furthermore, the SWP source comprises a power coupling system coupled to the EM wave launcher and configured to provide the EM energy to the EM wave launcher for forming the plasma.

Plasma VUV Intensity/Electron Energy Distribution controlled systems and techniques for controlling plasma generation are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

BRIEF DESCRIPTION OF THE DRAWINGS

In the accompanying drawings:

FIG. 5A illustrates a bottom view of an EM wave launcher in accordance with embodiments of the invention;

FIG. 5B illustrates a schematic cross-sectional view of a portion of the EM wave launcher depicted in FIG. 5A;

FIG. 7A illustrates a bottom view of an EM wave launcher in accordance with embodiments of the invention;

FIG. 7B illustrates a schematic cross-sectional view of a portion of the EM wave launcher depicted in FIG. 7A;

FIG. 11A illustrates a bottom view of an EM wave launcher in accordance with additional embodiments of the invention;

FIG. 11B illustrates a schematic cross-sectional view of a portion of the EM wave launcher depicted in FIG. 11A;

DETAILED DESCRIPTION OF EXEMPLARY EMBODIMENTS

Figure 1:
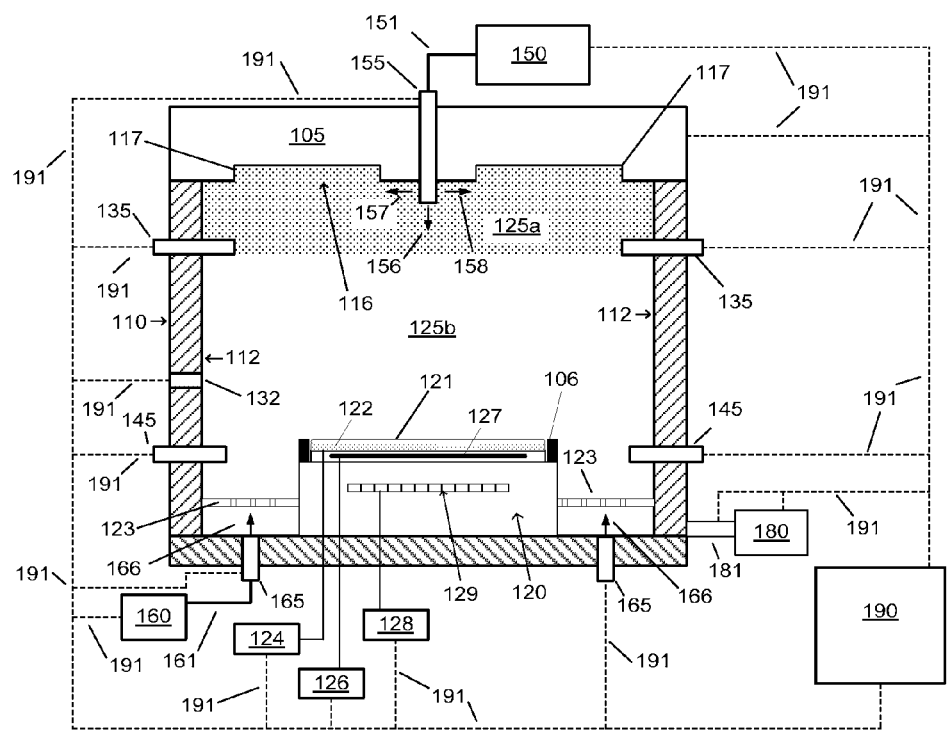
FIG. 1 illustrates a simplified schematic representation of a VUV/Electron Energy Distribution Function (VUV/EEDf) plasma system in accordance with embodiments of the invention.

In various plasma systems, the EEDf performance of the process chamber can be dependent on gaseous species and one or more Langmuir probes can be used to obtain EEDf data. In addition, the EEDf performance may be dependent on other process parameters.

In some examples, an EEDf optimized process can be an energetically de-coupled process in which the ionization electron population is separate from the dissociation/VUV-excitation population. For example, an energetically de-coupled EEDf process with a higher ionization population can produce $n_e$ (electron density) efficiently with a lower average value in the process chamber. In addition, an energetically de-coupled plasma source like an RLSA source can produce a diffusion plasma where the wafer-region is quiescent. During some tests, relatively strong VUV absorption has been observed by neutrals in RLSA plasma at pressures greater than 50 mT (milli-Torr) for $N_2$, Ar, and $O_2$ plasma, and at pressures less than 50 mT, relatively weak VUV absorption was observed, which usually gives the highest VUV current at wafer level.

During various experiments, VUV sensor measurements and Langmuir probe measurements were made at the top of the process chamber, the middle portion of the process chamber, and the bottom portion of the process chamber, and the middle portion is usually the highest for He (helium) plasma. In some examples, resonance conditions can occur in the bulk plasma in the middle portion of the process chamber. Alternatively, resonance conditions may occur in other regions of the process chamber.

When the He discharge is compared to the $N_2$, Ar, and $O_2$ discharge, the data showed that the He discharge starts quicker and more stable in the current test configuration. For example, He plasma has much larger ionization potential compared to other molecules, and this can be the reason that He plasma is immune to small fluctuations of power, pressure, and flow rate.

During various experiments, VUV induced current was measured using SiN (<250 nm photons) for $N_2$, Ar, $O_2$, and He Plasmas for power levels that can vary from about 1000 W to about 4000 W; and pressures that can vary from about 10 mT to about 500 mT. For example, the Ar plasma can have signals at one or more of the following wavelengths: 104.82 nm, 106.66 nm, and 876.06 nm; the $N_2$ plasma can have signals at one or more of the following wavelengths: 149.26 nm, 149.47 nm, 119.96 nm, 113.50 nm, 124.32 nm, 141.19 nm, and 692.70 nm; and the $O_2$ plasma can have signals at one or more of the following wavelengths: 130.22 nm, 130.49 nm, 130.60 nm, and 102.58 nm. Alternatively, other wavelengths may be used.

Some of the VUV sensors with dielectric films seemed to be easily damaged by direct exposure to MW irradiation and this damage data can be used to establish threshold values for some process chambers.

In some examples, strong VUV absorption by neutrals has been observed in RLSA plasma for $N_2$, Ar, and $O_2$ plasma, and higher absorption is usually observed at higher pressure. In addition, the VUV absorption by neutrals, the reduction of VUV current could also be related to the EEDF change in which high energy electrons are quickly thermalized with increasing distance from the top of the process chamber, and this effect is also more prominent at higher pressure.

In other examples, VUV photons can be absorbed, quenched, and re-emitted and the EEDf data can change, and this can make the understanding of the experimental data more difficult. For example, the general trend shown in the experimental results has clearly indicated the dramatic reduction of the VUV current (or plasma-induced current) in RLSA plasma with the increasing distance from the top of the plasma generation region. The results from this VUV measurement would reinforce the understanding on the decoupled nature of the RLSA plasma.

In still other examples, sensor calibration can be complicated, and the sensor calibration can be related to the position, the power, and gas type, etc.

VUV intensity in the RLSA plasma continually decreases with the distance, which is quite different from the ICP plasma, and this may imply that in the ICP plasma there exist bulk plasma heating by weak RF E-field that can result in higher mean electron energy and stronger VUV irradiation. VUV irradiations are much stronger in the ICP plasma than in the RLSA plasma even without density normalization, implying that much higher ionization efficiency in RLSA plasma.

VUV radiations in RLSA decrease at high pressure but can be saturated at low pressure, which is different from the ICP plasma in which VUV radiations always increases. This may imply that there exist bulk plasma heating in the ICP plasma by a weak RF E-field that then results in higher mean electron energy and stronger VUV radiations (local radiations exceed absorption in the ICP plasma).

VUV radiations are much stronger in the ICP plasma than in RLSA plasma even without density normalization, implying that much higher ionization efficiency in RLSA plasma.

In some experiments, trace-amount of $O_2$ addition (~1%) increases the VUV intensity significantly, and the EEDf data should not have been modified by this trace-amount of foreign gas addition. With further increasing $O_2$ addition, VUV intensity starts to decline with $O_2$ addition in the ICP plasma. This follows the general trend of VUV absorption by $O_2$ and EEDf should also be changed by $O_2$ addition. However, it appears that there is second peak near 30% $O_2$ addition in RLSA. With further increase of $O_2$, it starts to decrease as that in the ICP plasma but relatively slowly. One possible reason that may explain the observation of the second peak in the RLSA plasma, and the reduced possibility of observation in the ICP plasma, is the RLSA plasma has lower mean electron energy than the ICP plasma.

In some examples, the RLSA VUV intensity has only a moderate (×5) increase, while the ICP VUV intensity has a relatively larger (×35) increase. For example, a higher degree of $O_2$ dissociation would happen in the ICP plasma rather than in the RLSA plasma due to the following: (i) more middle energy electron population affecting the EEDf data and/or (ii) more Ar* and O* metastables in the ICP source, which have VUV emissions being transparent in plasma. Ionization and dissociation of $O_2$ by VUV photons emitting (~24 eV) from He would mainly contribute to the reduction of VUV intensity. In addition, $n_e$ would increase dramatically, and He EEDf data would also be cooled down with $O_2$ addition in both the RLSA plasma and the ICP plasma.

When experiments were performed using He—$N_2$ plasma, the VUV data versus the $N_2$ flow rate data showed that the ICP data is similar to the $O_2$ addition case, but the amount of increase is less (×4) and the decline at higher $N_2$ flow rate is slower. In addition, the RLSA system also showed a (×4) increase in VUV intensity with $N_2$ addition, it increases much more slowly and the decline at higher $N_2$ flow rate is also much slower than the ICP plasma.

Adding $N_2$ in the RLSA plasma may gradually modify the EEDf of the plasma even with small addition of $N_2$. Efficient ionization of $N_2$ ($N_2^+$) is more likely taken place in the RLSA plasma than to be dissociated into N radicals like that in the ICP plasma, and this can account for the different effects of $N_2$ addition. Ionization and dissociation of $N_2$ by VUV photons emitting (~21 eV) from He would mainly contribute to the reduction of VUV intensity. Because the $n_e$ can increase dramatically, the He EEDf data can also be cooled down by adding $N_2$ in both the RLSA system and ICP system.

When experiments were performed using Ar—$O_2$ plasma, the VUV data versus $O_2$ flow rate data showed that the trace-amount of $O_2$ addition (~1%) increases the VUV intensity significantly. For example, the EEDf data should not have been modified by this trace-amount of foreign gas addition. With further increasing $O_2$ addition, VUV intensity starts to decline with $O_2$ addition. This follows the general trend of VUV absorption by $O_2$ and EEDf should also be changed by $O_2$ addition. The RLSA data has only a moderate (×5) increase, while ICP VUV intensity has a relatively larger (×14) increase. In addition, the higher degree of $O_2$ dissociation can occur in the ICP plasma rather than in the RLSA plasma due to (i) more middle energy electron population affecting the EEDf data, and/or (ii) more Ar* and O* metastables in the ICP plasma which have VUV emissions being transparent in plasma.

When experiments were performed using Ar—N2 plasma, the VUV data versus the $N_2$ flow rate data showed that the ICP data is similar to the $O_2$ addition case, but the amount of increase is less (×7), and the decline at higher $N_2$ flow rate is slower. The RLSA data also had a (×4) increase in VUV intensity with $N_2$ addition at a middle position. For example, the VUV intensity increased much slower, and VUV intensity became saturated at 20% $N_2$ addition, which is actually the VUV intensity of pure $N_2$. Adding $N_2$ in the RLSA plasma may gradually modify the EEDf of the plasma even with small addition of $N_2$. Efficient ionization of $N_2$ ($N_2^+$) is more likely taken place in the RLSA plasma than to be dissociated into N radicals like that in the ICP plasma, and this can account for the different effects of the $N_2$ addition.

When experiments were performed using He—$O_2$ plasma, VUV versus $O_2$ flow rate data shows that a trace-amount of $O_2$ addition (~1%) increases the VUV intensity significantly. With further increasing $O_2$ addition, VUV intensity starts to decline with $O_2$ addition in the ICP plasma. This follows the general trend of VUV absorption by $O_2$ and EEDf should also be changed by $O_2$ addition. However, it appears that there is second peak near 30% $O_2$ addition in the RLSA plasma. With further increase of $O_2$, it starts to decrease as that in the ICP plasma but relatively slowly. One possible reason that may explain the observation of the second peak in the RLSA plasma, and the reduced possibility of observation in the ICP plasma, is the RLSA plasma has lower mean electron energy than the ICP plasma.

In some experiments, the RLSA data showed a (×5) increase, while ICP VUV intensity had a (×8) increase. Higher degree of $O_2$ dissociation would happen in the ICP plasma rather than in the RLSA plasma due to the following: (i) more middle energy electron population affecting EEDf data; and/or (ii) more Ar* and O* metastables in the ICP plasma, which have VUV emissions being transparent in plasma. Ionization and dissociation of $O_2$ by VUV photons emitting (~21 eV) from He would mainly contribute to the reduction of VUV intensity. In addition, $n_e$ would increase dramatically, and the He EEDf data can also be cooled down using the $O_2$ addition in both the RLSA plasma and the ICP plasma.

In some plasma systems, the following mechanisms can contribute to the significant increase of Ar and He VUV intensity when trace-amounts of $O_2$ and/or $N_2$ are added within the process chamber. In some cases, the EEDf effect can be the mechanism. For example, the threshold energy ($O_{E-th}$, $A_{E-th}$, $He_{E-th}$) for exciting the ground state electrons to the first excited state, i.e. threshold energy for VUV emission can vary. For example, because the O atoms have lower $E_{th}$ thresholds, more electrons can be involved into VUV excitations, but this effect alone cannot match the much higher VUV intensity increase.

In other examples, the metastable state effects can be the mechanism. For example, Ar metastables (Ar*) interacting with $O_2$ molecule can dissociate $O_2$. The O atoms can then be excited by Ar* again or by high energy electrons then decay to lower metastable or ground states with emission of VUV photons. In addition, the O atoms have more low energy metastables than Ar. Then, those emissions involving these metastables would be transparent in the plasma. Furthermore, these atomic physics processes and other similar processes can greatly increase the VUV intensity when trace-amounts of $O_2$ or $N_2$ are added.

In still other cases, the excimer effects can be the mechanism. For example, the $Ar^{2*}$ excimer can have an energy state that is almost the same as O atom first excited state. Therefore, resonant energy can be transferred to O atom and excite O atom. The resonant energy can decay with VUV emission, and this can be an efficient process. In addition, this process relies on the $Ar^{2*}$ density, which would be quite few because of the low pressure. However, it is a possible mechanism that can increase VUV efficiently by adding trace-amount of O2 into Ar plasma if the amount of $Ar^{2*}$ is not negligible.

The plasma experiments demonstrated that the VUV absorption by neutral is very similar between the RLSA plasma and the ICP plasma. However, the normalized VUV current of the ICP plasma is greater than about 6 times that of the RLSA plasma. For example, the normalization was done by roughly (×6) based on previous data. However, the ICP plasma density drops a little bit faster than the RLSA density with distance from the top of the process chamber. In order to compare the RLSA VUV and the ICP VUV, the VUV current was normalized to the same plasma density. The RLSA plasma has much lower VUV emission and one of the following can be the reason: (i) lower mean electron energy especially in the lower high-energy group; (ii) lower dissociation of molecule than in the ICP plasma.

The VUV intensity in the RLSA plasma continually decreases with the distance from the top of the process chamber, which is quite different from the ICP plasma. This may imply that in the ICP plasma there exist bulk plasma heating by a weak RF E-field that then results in higher mean electron energy and stronger VUV irradiations. For example, VUV irradiations are much stronger in the ICP plasma than in the RLSA plasma even without density normalization, implying that much higher ionization efficiency in the RLSA plasma. For the same chamber volume and quartz window thickness, the RLSA plasma has much lower mean electron energy at wafer level than the ICP plasma (~×0.5) at the same pressure and 2000 W source power.

In some examples, a diffusion plasma can have a quiescent, uniform, low temperature plasma near the wafer process region, and the wafer process region can be decoupled from the hot, non-uniform source of discharge.

These optical emission lines need high-energy electrons to first excite ground state of neutrals to highly excited states. Therefore, the intensity of these emission lines is related to the electron population that excites and emits VUV photons. The ICP plasma has much higher intensity of optical emission lines that involved high-energy electrons compared to that of the RLSA plasma, which then verified the EEDf and VUV sensor results.

VUV irradiation from one or more RLSA microwave plasmas and one or more RF-ICP plasmas have been investigated as a function of power, pressure, and distance from the plasma source. In general, the RLSA microwave plasma has much lower VUV irradiation than the RF-ICP plasma while maintaining a higher plasma density. EEDf measurements of the RLSA microwave plasmas and the RF-ICP plasmas revealed that the RLSA microwave plasmas have higher ionization electron populations with a lower dissociation/VUV excitation electron populations as compared to the RF-ICP plasma. The RLSA microwave plasmas can provide a higher electron density while maintaining a constantly low bulk Te, rendering a highly decoupled plasma source.

Strong VUV absorption by neutrals has been observed in the RLSA plasma for $N_2$, Ar, and $O_2$ plasma. Higher absorption is usually observed at higher pressure. Besides the VUV absorption by neutrals, the reduction of VUV current could also be related to the EEDf data changes in which high energy electrons are quickly thermalized with increasing distance from the top of the process chamber, and this effect is also more prominent at higher pressures.

For example, the VUV photons can be absorbed, quenched, and re-emitted, and this along with the EEDf data changes can make the understanding of the experimental data more difficult. However, the general trend shown in the experimental results has clearly indicated the dramatic reduction of the VUV current (or plasma-induced current) in the RLSA plasma with the increasing distance from the top of the process chamber (i.e., plasma generation region). In addition, the results from the VUV measurement can be used to reinforce the understanding on the decoupled nature of the RLSA plasma.

It is known in the art that vacuum ultraviolet (VUV) radiations generated in low temperature plasmas (e.g., CCP and ICP) can cause wafer damage, alteration of morphology of polymers and electrical properties of dielectrics. For example, electron-hole pairs generated in dielectric films by VUV radiations can be trapped in dielectrics and interfaces, and this can result in charge buildup and dielectric breakdown as well as the decrease of device reliability. In addition, synergistic effects of VUV exposure and energetic ion bombardment have been addressed to increase photoresist roughening.

The invention provides improved device and plasma process reliability by monitoring and evaluation of plasma generated VUV radiations. For example, RLSA plasma sources can operate within a wide power and pressure window and can be used to produce large area plasmas of high density. Due to its inherent diffusion characteristics, apart from the discharge source, quiescent, uniform, and low-temperature Maxwellian plasma near the wafer process region can be obtained. Therefore, understanding the spatial evolution of VUV irradiations in the RLSA plasma can help the development of microwave surface-wave plasma based hardware and the design of process recipes.

In addition, some of the ICP (RF) plasma sources can produce a diffusion plasma. Therefore, understanding the spatial evolution of VUV irradiations in the ICP (RF) plasma sources can help the development of RF plasma sources based on the hardware and the design of process recipes.

FIG. 1 illustrates a simplified schematic representation of a VUV/Electron Energy Distribution Function (VUV/EEDf) processing system in accordance with embodiments of the invention. The VUV/EEDf processing system 100 can comprise a dry plasma etching system or a plasma enhanced deposition system or any other plasma processing system. The VUV/EEDf processing system 100 can include a microwave source 105 coupled to the process chamber 110, a first VUV/EEDf sensor subsystem 135 coupled to the process chamber 110, a second VUV/EEDf sensor subsystem 145 coupled to the process chamber 110, a first gas supply system 150 coupled to the process chamber 110, a second gas supply system 160 coupled to the process chamber 110, a pumping system 180 coupled the process chamber 110. One or more of the control systems 190 can be coupled to the first VUV/EEDf processing subsystem 100, can be coupled to the first VUV/EEDf sensor subsystem 135, can be coupled to the second VUV/EEDf sensor subsystem 145, can be coupled to the first gas supply system 150, can be coupled to the second gas supply system 160, can be coupled to the pumping system 180, and can be coupled to a pressure control system 181. For example, control bus 191 can be used to couple the control system 190 to the required elements in the VUV/EEDf processing system 100 as shown in FIG. 1. Alternatively, one or more of the gas supply systems may not be required.

The VUV/EEDf processing system 100 can include process chamber 110 configured to define a plurality of plasma/processing spaces (125a and 125b). Alternatively, one or more of the plasma/processing spaces (125a and 125b) may be configured differently or may not be required. The process chamber 110 can include a substrate holder 120 configured to support a substrate 121. The substrate 121 can be exposed to plasma or process chemistry in the plasma processing space 125b when the process chamber includes a plurality of plasma/processing spaces (125a and 125b).

In some embodiments, the substrate holder 120 can be coupled to ground. For example, when the substrate 121 is clamped to substrate holder 120, a ceramic electrostatic clamp (ESC) layer may insulate the substrate 121 from the grounded substrate holder 120.

The VUV/EEDf processing system 100 can include a substrate temperature control system 128 coupled to temperature control elements 129 in the substrate holder 120 and configured to adjust and control the temperature of substrate 121. Alternatively, the VUV/EEDf processing system 100 can include temperature control elements (not shown) in one or more of the walls of the process chamber 110 and/or any other component within the VUV/EEDf processing system 100.

In order to improve the thermal transfer between the substrate 121 and substrate holder 120, the substrate holder 120 can include one or more thermal transfer elements 122 that can be coupled to a thermal control system 124. For example, the thermal transfer elements 122 can include an electrostatic clamping (ESC) electrode (not shown) that can be coupled to a clamping supply in the thermal control system 124 and that can be used to affix the substrate 121 to an upper surface of substrate holder 120. In some embodiments, one or more of the thermal transfer elements 122 can be used to isolate the substrate 121 from the substrate holder 120 when it is grounded. In addition, the thermal transfer elements 122 can further include backside gas elements (not shown) that can be coupled to a backside gas delivery system in the thermal control system 124. One or more of the thermal transfer elements 122 can be configured to introduce gas to the backside of the substrate 121 in order to improve the gas-gap thermal conductance between the substrate 121 and substrate holder 120, and temperature control of the substrate 121 is required at elevated or reduced temperatures. For example, the thermal transfer elements 122 can include two-zone (center/edge) backside gas elements, and the helium gas gap pressure can be independently varied between the center and the edge of the substrate 121.

In some embodiments, the substrate holder 120 can comprise an electrode 127 through which RF power can be coupled to the processing plasma in plasma processing space 125b. For example, the substrate holder 120 can be electrically biased at a RF voltage via the transmission of RF power from a RF generator 126 to the electrode 127 in the substrate holder 120. When the RF bias is used, the RF bias can serve to heat electrons to form and maintain the processing plasma in plasma processing space 125b. The operating frequency for the RF generator 126 can range from about 0.1 MHz to about 100 MHz. RF systems for plasma processing are well known to those skilled in the art. Alternatively, RF power may be applied to the substrate holder electrode at multiple frequencies or may not be required. In other embodiments, DC power can be provided to the electrode 127.

In addition, the substrate holder 120 may be surrounded by a baffle member 123 that extends beyond a peripheral edge of the substrate holder 120. The baffle member 123 may serve to homogeneously distribute the pumping speed delivered by the pressure control system 181 to the interior of the process chamber 110. The baffle member 123 may be fabricated from a dielectric material, such as quartz, or alumina. The baffle member 123 may provide a high RF impedance to ground for the plasma in the interior of the process chamber 110.

In some embodiments, a conductive focus ring 106 can be used, and the conductive focus ring 106 can include a silicon-containing material and can be disposed on the top of the substrate holder 120. In some examples, conductive focus ring 106 can be configured to surround the electrode 127, the thermal transfer elements 122, and the substrate 121 to improve uniformity at the edge of the substrate. In other examples, the conductive focus ring 106 can include a correction ring portion (not shown) that can be used to modify the edge temperature of the substrate 121. Alternatively, a non-conductive focus ring may be used.

Furthermore, the VUV/EEDf processing system 100 can include one or more process sensors 132 coupled to the process chamber 110. Alternatively, the number and position of the process sensors 132 may be different. In various embodiments, the process sensors 132 can include one or more optical devices for monitoring the light emitted from the plasma in the process chamber 110. For example, one or more Optical Emission Spectroscopy (OES) sensors may be used, and the OES data can be used as ignition data, operational data, or endpoint data.

The process sensors 132 can include gas-sensing devices for monitoring and/or controlling input gasses, process gasses, and/or exhaust gasses. In addition, the process sensors 132 can include pressure sensors, temperature sensors, current and/or voltage probes, power meters, spectrum analyzers, or an RF impedance analyzer, or any combination thereof. Furthermore, the process sensors 132 can include sensors pertaining to the helium backside gas pressure, the helium backside flow, electrostatic clamping (ESC) voltage, ESC current, substrate holder temperature (or lower electrode (LEL) temperature), coolant temperature, DC conductive bias electrode temperature, forward RF power, reflected RF power, electrode DC bias, RF peak-to-peak voltage, chamber wall temperature, process gas flow rates, process gas partial pressures, matching network settings, a focus ring thickness, RF hours, focus ring RF hours, and any statistic thereof.

In addition, the VUV/EEDf processing system 100 can include a microwave source 105 that is coupled to the process chamber 110, and is configured to form plasma in the plasma generation space 125a, to form second plasma in the plasma processing space 125b, or any combination thereof. The microwave source 105 can include a plasma-facing surface 116 having a plurality of recesses 117 therein. The microwave source 105 can include a surface wave plasma (SWP) source that can include a radial line slotted antenna (RLSA) as shown herein. In alternate embodiments, an ICP plasma source, a CCP plasma source, or any other plasma sources may be used.

In some embodiments, the VUV/EEDf processing system 100 can include one or more first gas supply elements 155 that can be coupled to the first gas supply system 150 using at least one first gas supply line 151. Alternatively, the first gas supply system 150, the at least one first gas supply line 151, and/or the first gas supply element 155 may be configured differently. The first gas supply element 155 can be coupled to the process chamber 110 and can be configured to introduce a first process gas into the process chamber 110 in a first direction 156, and/or in a second direction 157, and/or in a third direction 158, or in any combination thereof. In addition, the first gas supply element 155 can be configured to introduce the first process gas to the plasma generation space 125a and/or to the plasma processing space 125b.

In other embodiments, the VUV/EEDf processing system 100 can include one or more second gas supply elements 165 that can be coupled to the second gas supply system 160 using at least one second gas supply lines 161. Alternatively, the second gas supply system 160, the second gas supply lines 161, and/or the second gas supply element 165 may be configured differently. The second gas supply element 165 can be coupled to the process chamber 110 and can be configured to introduce a second process gas into the process chamber 110 in a first direction 166. In addition, the second gas supply element 165 can be configured to introduce the second process gas to plasma generation space 125a and/or to the plasma processing space 125b.

During dry plasma etching, the first and/or the second process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CH_3F$, $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or SF6 or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

In addition, the pressure control system 181 can be used to couple the pumping system 180 to the process chamber 110, and can be configured to evacuate the process chamber 110, as well as control the pressure within the process chamber 110. Furthermore, the control system 190 can be coupled to the process chamber 110, the substrate holder 120, and the microwave source 105. The control system 190 can be configured to execute a process recipe for performing at least one of an etch process and a deposition process in the VUV/EEDf processing system 100 using one or more VUV/EEDf-related procedures or models.

Referring still to FIG. 1, the VUV/EEDf processing system 100 may be configured to process 200 mm substrates, 300 mm substrates, or larger-sized substrates. In fact, it is contemplated that the plasma processing system may be configured to process substrates, wafers, solar panels, video screens, or LCDs regardless of their size, as would be appreciated by those skilled in the art. Therefore, while aspects of the invention will be described in connection with the processing of a semiconductor substrate, the invention is not limited solely thereto.

As described above, the process chamber 110 can be configured to facilitate the generation and stabilization of plasma in the plasma/processing spaces (125a and 125b) and to generate a stable process chemistry plasma in plasma processing space 125b adjacent a surface of the substrate 121. For example, in an etch process, the process gas can include molecular constituents that when dissociated are reactive with the material being etched on the substrate surface. For example, when one or more plasmas are formed in one or more of the plasma/processing spaces (125a and/or 125b) heated electrons can collide with molecules in the plasma-forming gases causing dissociation and the formation of reactive radicals for performing an etch process.

While FIG. 1 shows the first gas supply element 155 at a first position in the upper portion of the process chamber 110 and within the plasma generation space 125a, the invention is not limited to this configuration. In other configurations, the first gas supply element 155 may be positioned below the plasma generation space 125a. For example, the first gas supply element 155 can be located within 200 mm from the plasma-facing (outer) surface 116 of the microwave source 105 and, desirably, the first gas supply element 155 can be positioned within a range of approximately 10 mm to approximately 150 mm from the plasma-facing (outer) surface 116 of the microwave source 105.

While FIG. 1 shows the second gas supply element 165 at a second position in the lower portion of the process chamber 110 within the plasma processing space 125b, the invention is not limited to this configuration. For example, the second gas supply element 165 can be located within 200 mm from the bottom of the process chamber 110 and, desirably, the second gas supply element 165 can be positioned within a range of approximately 10 mm to approximately 150 mm from the bottom of the process chamber 110.

When the process chamber 110 is configured to use the VUV/EEDf-related procedures or techniques, separate plasma generation spaces 125a and plasma processing spaces 125b, such as that shown in the VUV/EEDf processing system 100 of FIG. 1 can provide improved process control and improved stability control over conventional plasma processing systems. In some examples, one or more gas mixtures can be provided by one or more of the gas supply elements (155 and 165), to control the formation of a dense plasma with a high population of high energy electrons in the plasma generation space 125a, while producing a less dense, lower temperature stable plasma in the plasma processing space 125b. When the gas mixture includes at least one light gas and at least one heavy-gas, the at least one light gas can separate from the at least one heavy-gas due to differences in their respective molecular weight or differences in gravity (i.e., ratio between the molecular weight of a gaseous constituent and a reference molecular weight). In other examples, separate injection schemes can also be used for the light-gas and the heavy-gas.

Additionally, the configuration of the exemplary VUV/EEDf processing system 100 shown in FIG. 1 can reduce damage to chamber components such as the substrate holder 120, by preventing high energy plasma species from passing through the plasma processing space (125b).

In some examples, when a pure $O_2$ or $Ar/O_2$ mixture is used to create plasma in a SWP source, stability control can present a problem. When stability control becomes a problem, one or more "light-gases" such as $H_2$, He, or Ne gases can be added into the pure $O_2$ or $Ar/O_2$ mixture in the plasma in the SWP source if the plasma generation region is on the top. The "light-gas" can be injected into the process chamber 110 from the side, from the bottom, or from the top of the process chamber 110 using one or more of the gas supply elements (155 and 165). Therefore, plasma generation would be mainly sustained by the light-gases in the plasma generation space 125a which would only have positive discharge and would be more stable than plasma generated by the mixture of electropositive and electronegative gases. At very low pressure, the separation between light-gases and heavy-gases may not be very apparent due to increased inter-diffusion. In this case, light-gases would still be highly concentrated near the top plasma generation region due to the gravity difference, and the light-gases would co-exist with the process gases of a reduced/diluted concentration. Depending on the balance situation between the electron attachment and the electron detachment, an easily ionized light-gas, such as $H_2$, or a "not easily ionized" light-gas, such as He or Ne, may be added to balance the electron attachment and electron detachment processes that can be originally broken by just using common process gases such as $Ar/O_2$ mixture as an example. At the substrate/wafer level, process gas ionization can be initiated at least partly by the plasma electrons generated at the top plasma. In such a way, two-zone plasma can be formed. The top electropositive plasma zone (plasma generation space 125a) can control the stability, and the bottom electronegative plasma zone (plasma processing space 125b) can control the wafer process (process chemistry). It is well known that $H_2$, He, and Ne have different ionization potentials that can be advantageously used during processing. Depending on process conditions and the process purposes, easily discharged $H_2$ or relatively difficult discharged He or Ne can be used and mixed during the process to stabilize the plasma and enable a wider process operating condition window. The flow rate ratio or partial pressure of light-gases to heavy-gases can be adjusted depending on process. When an $Ar/O_2$ mixture is used by itself, for example the $Ar/O_2$ mixture can cause a stability problem. Because Ar and $O_2$ have similar molecular weights, they would be mixed evenly in the process chamber 110, as an example. In this case, there can be a high population electronegative gas near plasma generation region, and this can cause a stability problem. In addition, after plasma is generated, additional $O_2$ molecules can be dissociated into O atoms or radicals that would be lighter than Ar atoms, and the O atoms would diffuse up more easily to the plasma generation region and may cause a more serious stability problem.

In other examples, when a pure $O_2$ or $Ar/O_2$ mixture is used to create plasma in a SWP source, EM radiation may be a problem that may depend on the discharge conditions. When EM radiation becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the process chamber 110 from the side, from the bottom, or from the top of the process chamber 110 using one or more of the gas supply elements (155 and 165). For example, plasma generation can be mainly sustained by the light-gases in the plasma generation space 125a which would only have positive discharge and would be more stable than plasma generated by the mixture of electropositive and electronegative gases. Because the plasma generation region (plasma generation space 125a) contains mainly positive discharged light-gases, such as He, $H_2$, Ne, the electron density near that region is much higher than the electron density established using only the $O_2$ or $Ar/O_2$ mixture as an example. As a result, EM radiation can be more easily blocked by plasma electrons near that region (plasma generation space 125a) giving a cleaner process space (plasma processing space 125b) for the substrate/wafer area. Experimental results attached to verify this procedure.

In still other examples, when a pure $O_2$ or $Ar/O_2$ mixture is used to create plasma in a SWP source, the size of the process window can present a problem. When the size of the process window becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the process chamber 110 from the side, from the bottom, or from the top of process chamber 110 using one or more of the gas supply elements (155 and 165). For example, when the "light-gases" are used to stabilize the plasma, more process conditions such as power and pressure can be used. In addition, by blocking EM radiation using the high electron density established in the local plasma created near the plasma generation region using the "light-gases", the under-dense plasma problem can be eliminated or reduced. Without EM blocking by light-gases, certain under-dense plasma conditions such as low power high pressure can put limits for the process window. However, with the blocking of EM radiation, such under-dense plasma conditions can be used without concern of EM radiation. In this manner, the power efficient can be increased for the SWP source.

In additional examples, when a pure $O_2$ or $Ar/O_2$ mixture is used to create plasma in a SWP source, the amount of contamination and/or erosion to the top dielectric plate and/or chamber wall can present a problem. When the amount of contamination and/or erosion to the top dielectric plate and/or chamber wall becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the process chamber 110 from the side, from the bottom, or from the top of process chamber 110 using one or more of the gas supply elements (155 and 165). For example, when the "light-gases" are concentrated near the top, both the chemical erosion and the physical sputtering to the dielectric plate would be dramatically reduced. The VUV/EEDf-related techniques can increase the lifetime of the dielectric plate, can reduce the contamination to the dielectric plate that will reduce the dielectric plate cleaning burden, and can reduce particle density in the plasma volume and on the substrate/wafer.

In some additional examples, when a pure $O_2$ or $Ar/O_2$ mixture is used to create plasma in a SWP source, the plasma uniformity can present a problem. When the plasma uniformity becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the process chamber 110 from the side, from the bottom, or from the top of process chamber 110 using one or more of the gas supply elements (155 and 165). For example, when the "light-gases" are used in the plasma, the plasma uniformity can be improved because the substantially pure electropositive discharge gas can be concentrated near plasma generation space 125a in process chamber 110. This can simplify the dielectric plate design because the design and machining of the recesses (cavities) can become simpler. A simpler pattern of recesses (cavities) can be used to obtain more uniform plasma because the problems associated with the electronegative gases can be reduced.

In some plasma uniformity control examples, one or more of the gas supply elements (155, and 165) can be used to pulse one or more of the "light-gases" to control the plasma uniformity. For example, "light-gases", such as He, can be injected at a frequency that can vary from about 1 Hz to about 100 Hz, and the first frequency can be based on the gas diffusion rate for the given pressure, and a variable duty cycle (on/off) can be used to control the ionization and the plasma uniformity near the dielectric plate.

In some additional plasma uniformity control examples, one or more of the gas supply elements (155, and 165) can be configured at the top of the process chamber 110 and can be used to inject and/or pulse at least one of the "light-gases", such as He, to the outer region close to the bottom portion of the microwave source 105, and this can be proximate to dielectric plate in the microwave source 105. In this manner, the plasma uniformity can be controlled from the edge to the center.

In some other examples, one or more of the gas supply elements (155 and 165) can be configured at the top and/or the bottom of the process chamber 110, and one or more of the gas supply elements (155 and 165) can be used to pulse two or more "light-gases", such as He and $H_2$. For example, the duty cycle can be for the two different gases when one of the gasses has low ionization energy, such as $H_2$ at 13.6 eV, and the other gas has high ionization energy, such as He, at 24.6 eV. In addition, the injection can be maintained at a constant flow, but different duty cycles can be used for the different gases. The duration of each gas pulse can be calculated based on the gas diffusion rate at the given chamber pressure. For example, gas supply elements (155, and/or 165) can have different pulse rates, different flow rates, or different directions, or any combination thereof.

In still other examples for plasma uniformity control, two or more "light-gases", such as He and $H_2$ can be pulsed to control the plasma density at the top of the process chamber 110. For example, gas supply elements (155 and/or 165) can have different pulse rates, different flow rates, or different directions, or any combination thereof.

In some uniformity examples, the first gas supply element 155 can be configured within the process chamber 110 and the first gas supply elements 155 can be used to pulse two or more "light-gases", such as He and $H_2$, to create a wall of highly ionized plasma near the outer regions of the process chamber 110

In some alternate plasma control examples, the plasma source may include a capacitively-coupled plasma source or an inductively-coupled plasma source, or any other type plasma sources such as microwave ECR plasma source. Plasma stability, plasma uniformity, plasma density, process window, contamination and erosion, EM radiation, gas plasma chemistry, and wafer plasma chemistry can be controlled using the methods and techniques described herein.

Figure 2:
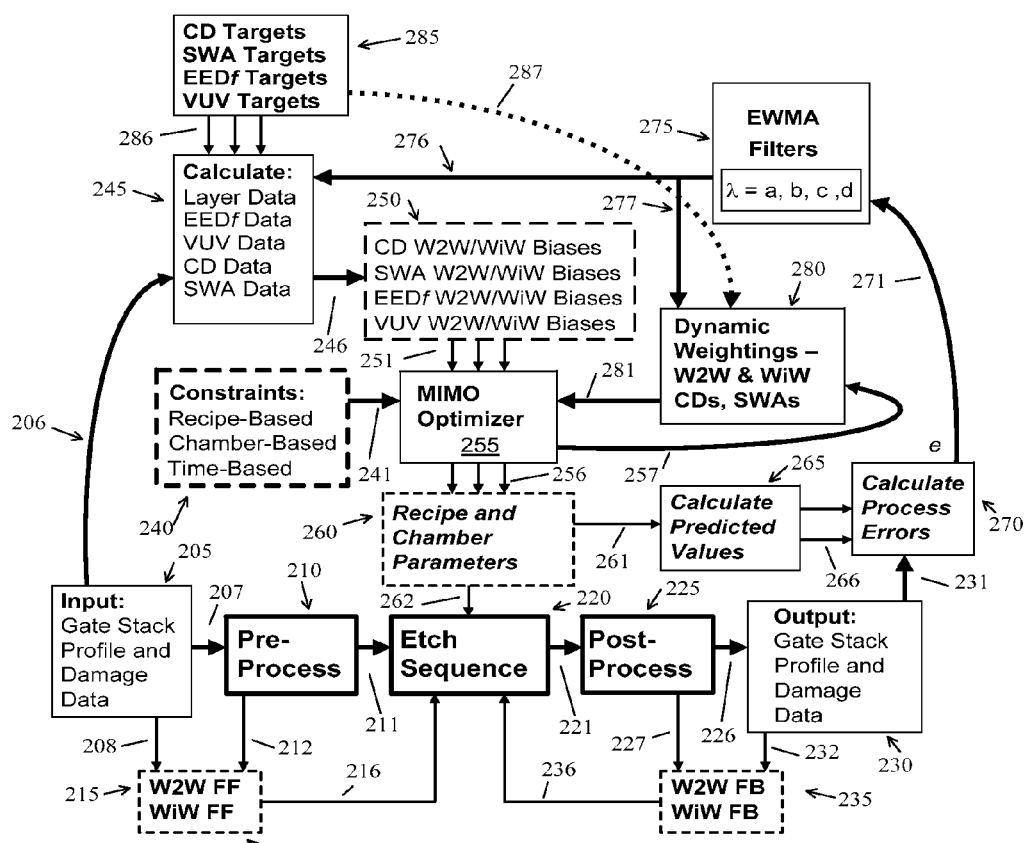
FIG. 2 shows a simplified block diagram of an exemplary Multi-Input/Multi-Output (MIMO) model optimization and control methodology in accordance with embodiments of the invention.

FIG. 2 shows a simplified block diagram of an exemplary Multi-Input/Multi-Output (MIMO) model optimization and control methodology in accordance with embodiments of the invention. In the illustrated MIMO model methodology 200, an exemplary image of a portion of a VUV/EEDf-related procedure for plasma processing is shown.

An input data element 205 can be characterized using a first set of parameters that can include input gate stack profile data and input damage data. For example, the input data element 205 can include first center and edge (C/E) profile data items, first C/E thickness data items, first C/E CD data items, first C/E SWA data items, and first C/E damage data items. Alternatively, a different set of input data parameters may be used. An output data element 230 can be characterized using a second set of parameters that can include output gate stack profile data and output damage data. For example, output data element 230 can include second center and edge (C/E) profile data items, second C/E thickness data items, second C/E CD data items, second C/E SWA data items, and second C/E damage data items. Alternatively, a different set of output parameters may be used.

In the illustrated methodology, the input data element 205 can be coupled to one or more of the first calculation elements 245 and can provide first input data items 206 to one or more of the first calculation elements 245. The input data element 205 can also be coupled to one or more of the pre-processing models 210 and can provide second input data items 207 to one or more of the pre-processing models 210. In addition, the input data element 205 can be coupled to one or more feed forward (FF) models 215 and can provide third input data items 208 to one or more of the FF models 215. For example, data items (206, 207, and 208) can include real-time measurement data that can include: wafer center (C) data, wafer edge (E) data, and bias (C/E) data for the wafer. In addition, data items (206, 207, and 208) can include layer data, CD data, SWA data, EEDf data, VUV data, and damage data for the wafer.

One or more of the pre-processing models 210 can be coupled to one or more of etch sequence models 220 and can provide first pre-processing data items 211 to one or more of the etch sequence models 220. One or more of the pre-processing models 210 can also be coupled to one or more of the FF models 215 and can provide second pre-processing data items 212 to one or more of the FF models 215. In addition, one or more of the FF models 215 can be coupled to one or more of the etch sequence models 220 and can provide first FF data items 216 to one or more of the etch sequence models 220. One or more of the FF models 215 can provide wafer-to-wafer (W2W) FF data and/or Within-Wafer (WiW) FF data to one or more of the etch sequence models 220. For example, data items (211, 212, and 216) can include real-time measurement data that can include: wafer center (C) data, wafer edge (E) data, and bias (C/E) data for the wafer. In addition, data items (211, 212, and 216) can include additional real-time measurement data and/or simulation data that can include: layer data, CD data, SWA data, EEDf data, VUV data, and damage data for the wafer.

One or more of the etch sequence models 220 can be coupled to one or more of the post-processing models 225 and can provide etch sequence data items 221 to one or more of the post-processing models 225. For example, etch sequence data items 221 can include real-time measurement data that can include: W2W data, WiW data, wafer center (C) data, wafer edge (E) data, and bias (C/E) data for the wafer. In addition, etch sequence data items 221 can include additional real-time measurement data and/or simulation data that can include: layer data, CD data, SWA data, EEDf data, VUV data, and damage data for the wafer.

One or more of the post-processing models 225 can be coupled to one or more of the output data elements 230 and can provide first post-processing data items 226 to one or more of the output data elements 230. One or more of the post-processing models 225 can be coupled to one or more of the feedback (FB) models 235 and can provide second post-processing data items 227 to one or more of the FB models 235. For example, data items (226 and 227) can include real-time measurement data that can include: wafer center (C) data, wafer edge (E) data, and bias (C/E) data for the wafer. In addition, data items (226 and 227) can include additional real-time measurement data and/or simulation data that can include: layer data, CD data, SWA data, EEDf data, VUV data, and damage data for the wafer.

One or more of the output data elements 230 can be coupled to one or more of the process error calculation elements 270 and can provide first output data items 231 to one or more of the process error calculation elements 270. One or more of the output data elements 230 can be coupled to one or more of the FB models 235 and can provide second output data items 232 to one or more of the FB models 235. In addition, one or more of the FB models 235 can be coupled to one or more of the etch sequence models 220 and can provide first FB data items 236 to one or more of the etch sequence models 220. One or more of the FB models 235 can provide wafer-to-wafer (W2W) FB and/or Within-Wafer (WiW) FB data to one or more of the etch sequence models 220. For example, data items (231, 232, and 236) can include real-time measurement data that can include: wafer center (C) data, wafer edge (E) data, and bias (C/E) data for the wafer. In addition, data items (231, 232, and 236) can include additional real-time measurement data and/or simulation data that can include: layer data, CD data, SWA data, EEDf data, VUV data, and damage data for the wafer.

One or more of the first calculation elements 245 can be coupled to one or more of the bias error calculation elements 250 and can provide first biasing data items 246 to one or more of the bias error calculation elements 250. For example, data items 246 can include real-time measurement data that can include: W2W data, WiW data, wafer center (C) data, wafer edge (E) data, and bias (C/E) data for the wafer. In addition, data items 246 can include additional real-time measurement data and/or simulation data that can include: layer data, CD data, SWA data, EEDf data, VUV data, and damage data for the wafer.

One or more of the bias error calculation elements 250 can be coupled to one or more of the Multi-Input Multi-Output (MIMO) optimizers 255 and can provide calculated bias error data items 251 to one or more of the MIMO optimizers 255. For example, data items 251 can include real-time measurement data that can include: W2W data, WiW data, wafer center (C) data, wafer edge (E) data, and bias (C/E) data for the wafer. In addition, data items 251 can include additional real-time measurement data and/or simulation data that can include: layer data, CD data, SWA data, EEDf data, VUV data, and damage data for the wafer.

One or more of the constraint calculation elements 240 can be coupled to one or more of the MIMO optimizers 255 and can provide calculated constraint data items 241 to one or more of the MIMO optimizers 255. For example, data items 241 can include real-time measurement data that can include: W2W data, WiW data, wafer center (C) data, wafer edge (E) data, and bias (C/E) data for the wafer. In addition, data items 241 can include additional real-time measurement data and/or simulation data that can include: layer data, CD data, SWA data, EEDf data, VUV data, and damage data for the wafer.

In some embodiments, one or more of the MIMO optimizers 255 can be provided calculated constraint data items 241 that can include tool limits, recipe limits, and/or time limits. For example, the calculated constraint data items 241 can include step-based wafer limits that can include EEDf limits, VUV limits, temperature limits, and/or process gas limits. One or more of the MIMO optimizers 255 can determine one or more sets of optimized recipe/chamber parameters 256 that can be sent to one or more of the models (210, 220, and 225).

One or more of the MIMO optimizers 255 can be coupled to one or more of the optimized data elements 260 and can provide first optimized data items 256 to one or more of the optimized data elements 260. One or more of the MIMO optimizers 255 can also be coupled to one or more of the dynamic weighting calculation data elements 280 and can provide second optimized data items 257 to one or more of the dynamic weighting calculation data elements 280. For example, data items (256 and 257) can include real-time modeling data that can include: W2W data, WiW data, wafer center (C) data, wafer edge (E) data, and bias (C/E) data for the wafer. In addition, data items (256 and 257) can include additional real-time measurement data and/or simulation data that can include: layer data, CD data, SWA data, EEDf data, VUV data, and damage data for the wafer.

One or more of the optimized data elements 260 can be coupled to one or more of the predicted data calculation elements 265 and can provide first optimized recipe and/or chamber data items 261 to one or more of the predicted data calculation elements 265. One or more of the optimized data elements 260 can be coupled to one or more of the etch sequence models 220 and can provide second optimized recipe and/or chamber data items 262 to one or more of the etch sequence models 220. For example, data items (261 and 262) can include real-time measurement data that can include: W2W data, WiW data, wafer center (C) data, wafer edge (E) data, and bias (C/E) data for the wafer. In addition, data items (261 and 262) can include additional real-time measurement data and/or simulation data that can include: layer data, CD data, SWA data, EEDf data, VUV data, and damage data for the wafer.

One or more of the predicted data calculation elements 265 can be coupled to one or more of the process error calculation elements 270 and can provide predicted and/or simulated data items 266 to one or more of the process error calculation elements 270. For example, data items 266 can include real-time prediction data that can include: W2W data, WiW data, wafer center (C) data, wafer edge (E) data, and bias (C/E) data for the wafer. In addition, data items 266 can include predicted layer data, predicted CD data, predicted SWA data, predicted EEDf data, predicted VUV data, and predicted damage data for the wafer. Furthermore, data items 266 can include one or more predicted etch biases, one or more predicted SWA biases, one or more predicted step times for one or more etch recipes, and one or more predicted process gas flows for one or more etch recipes.

In some examples, one or more of the output data elements 230 can provide one or more actual data items 231 to one or more of the process error calculation elements 270, and one or more of the data items 231 can be compared to one of more of the predicted data items 266. One or more of the error values 271 from one or more of the process error calculation elements 270 can be provided to one or more of the EWMA filters 275.

One or more of the process error calculation elements 270 can be coupled to one or more of the Exponentially Weighted Moving Average (EWMA) filters 275 and can provide process error data items 271 to one or more of the EWMA filters 275. For example, data items 271 can include real-time measurement data that can include: W2W data, WiW data, wafer center (C) data, wafer edge (E) data, and bias (C/E) data for the wafer. In addition, data items 271 can include additional real-time measurement data and/or simulation data that can include: layer data, CD data, SWA data, EEDf data, VUV data, and damage data for the wafer.

One or more of the EWMA filters 275 can be coupled to one or more of the constraint calculation elements 240 and can provide first filtered process error data items 276 to one or more of the constraint calculation elements 240. In addition, one or more of the EWMA filters 275 can be coupled to one or more of the dynamic weighting calculation data elements 280 and can provide second filtered process error data items 277 to one or more of the dynamic weighting calculation data elements 280. For example, data items (276 and 277) can include real-time filtered data that can include: W2W data, WiW data, wafer center (C) data, wafer edge (E) data, and bias (C/E) data for the wafer. In addition, data items (276 and 277) can include filtered layer data, filtered CD data, filtered SWA data, filtered EEDf data, filtered VUV data, and filtered damage data for the wafer. Furthermore, data (276 and 277) can include simulated and/or modeling data that can include: layer data, CD data, SWA data, EEDf data, VUV data, and damage data for the wafer.

Each of the EWMA filters 275 can filter and provide feedback data for a single parameter or error value. Alternatively, each of the EWMA filters 275 can filter and provide feedback data for a multiple parameters or error values.

One or more of the dynamic weighting calculation data elements 280 can be coupled to one or more of the MIMO optimizers 255 and can provide calculated dynamic weighting data items 281 to one or more of the MIMO optimizers 255. For example, data items 281 can include real-time weighting data that can include: W2W data, WiW data, wafer center (C) data, wafer edge (E) data, and bias (C/E) data for the wafer. In addition, data items 281 can include additional real-time weighting data and/or simulation data that can include: layer data, CD data, SWA data, EEDf data, VUV data, and damage data for the wafer.

One or more of the first input target data elements 285 can be coupled to one or more of the first calculation elements 245 and can provide first target data items 286 to one or more of the calculation elements 245. In addition, one or more of the first input target data elements 285 can be coupled to one or more of the dynamic weighting calculation data elements 280 and can provide second target data items 287 to one or more of the dynamic weighting calculation data elements 280. For example, data items (286 and 287) can include real-time target data that can include: W2W data, WiW data, wafer center (C) data, wafer edge (E) data, and bias (C/E) data for the wafer. In addition, data items (286 and 287) can include additional real-time target and/or simulated target data that can include: layer data, CD data, SWA data, EEDf data, VUV data, and damage data for the wafer.

The concept of using dynamic weightings based on the feedback error is to force the MIMO optimizer 255 to prioritize the weightings (rebalance) with a goal of better control of the most important control variables (CVs)—automation of a manual tuning of a control system in runtime.

One or more of the dynamic weighting calculation data elements 280 can receive one or more target data items 287 and one or more feedback data items 257 from one or more of the MIMO optimizers 255. In addition, one or more of the dynamic weighting calculation data elements 280 can provide one or more dynamically varying weighting data items 281 to one or more of the MIMO optimizers 255.

In some embodiments, one or more controlled variables (CVs) and the ranges associated with the CVs can be determined One or more of the CVs can be specified by an end user or a customer. The CVs can include: layer data, CD data, SWA data, EEDf data, VUV data, and damage data for the wafer. One or more manipulated variables (MVs) can be determined for candidate recipes for the etch sequence model 220. The MVs can include WiW manipulated variables (WiW-MVs), and the WiW-MVs can include "fast" MVs that can be controlled while a wafer is being processed. The MVs can include W2W manipulated variables (W2W-MVs), and the W2W-MVs can include "slow" MVs that can be controlled when a wafer lot is being processed. The ranges for the MVs can be examined for each step in a candidate recipe.

Design of Experiment (DOE) procedures can be performed to analyze the etch sequence and/or the MIMO model associated with the etch sequence model 220. Using VUV-sensor data from DOE wafers, VUV-related experiments can be performed to establish statistical models that can connect one or more of the MVs with each CV. A critical factor for DOE procedures is the format of the predicted model. One or more model types can be selected, ranges can be provided for the CVs and/or MVs, and statistical software, such as JMP® statistical software from the SAS Institute) can be used to establish one or more of the DOE tables). For example, the chamber state data for the etching chambers and the measurement chambers can be used as manipulated variables (MVs). Alternatively, the process modeling may assume that the chamber state is stable between wafers and/or lots. Nonlinear models with quadratic and interaction terms can be created from the DOE tables by using a least squares technique and statistical software. Furthermore, the manipulated variables (MVs) and/or the disturbance variables (DVs) used for control can include a calculated value that can be dynamically modeled and updated during the runtime processing.

In some embodiments, Relative Gain Array (RGA) techniques can be used to investigate the best combinations of MVs and CVs. For example, RGA techniques can be used for measured model parameter selection, and CV-MY pairs can be selected such that their sum is closest to one. In addition, the RGA techniques can be used to determine a number of candidate models and to identify the best case solution. When there are more CVs than MVs, RGA techniques can be used for selecting the most controllable CV (sensitivity analysis of CVs to MVs). For example, the modeling procedure can start with a basic model relationship that "pairs" VUV sensor data to a controlled variable (CV).

The RGA method can be used at run-time with production patterned wafers to evaluate when to use the VUV sensor data vs. CV feedback in place of just calculating a value. For example, the etch sequence model 220 can be associated with a poly-etch (P-E) sequence or a metal-gate-etch (MGE) sequence, and the CVs associated with one or more of the features created by the (P-E) sequence or the (MGE) sequence can include center VUV values, middle VUV values, and/or edge VUV values. The pre- and post-damage measurements can be performed using dynamic sampling.

In other embodiments, the manipulated variables can include back-side gas flows to one or more zones in the wafer holder, and the back-side gas flows can be dynamically controlled during processing to provide dynamic backside gas temperature control for improved within-wafer process uniformity by adjusting wafer areas that are non-radial in nature based on incoming CV requirements.

In still other embodiments, the manipulated variables can include flow rates for edge gas injection flow rates. This approach could also be used to reduce the starvation problem at the wafer edge, and make the edge starvation a controllable variable based on the incoming signature and chamber state.

In some MIMO models, the interaction terms can be updated between lots during an offline triggered calculation update procedure. For example, the cross term calculation update can be triggered by checking the sensitivity of the current system to changes in the cross terms, and by running a set of pre-defined delta offsets to see if adjusting the cross terms would have improved the average control. RGA could also be used in this calculation, and the trigger events can be used to perform adaptive feedback updates for the MIMO model. For example, adaptive feedback can be used when copying a MIMO model from chamber to chamber and allowing the MIMO model to adapt to the new chamber behavior. Another use arises when a new product is release and the old product equation can be used to start the model, then after so many wafers the model update is triggered and a new model is adjusted, and the resulting model can them be used and monitored for performance.

Figure 3:
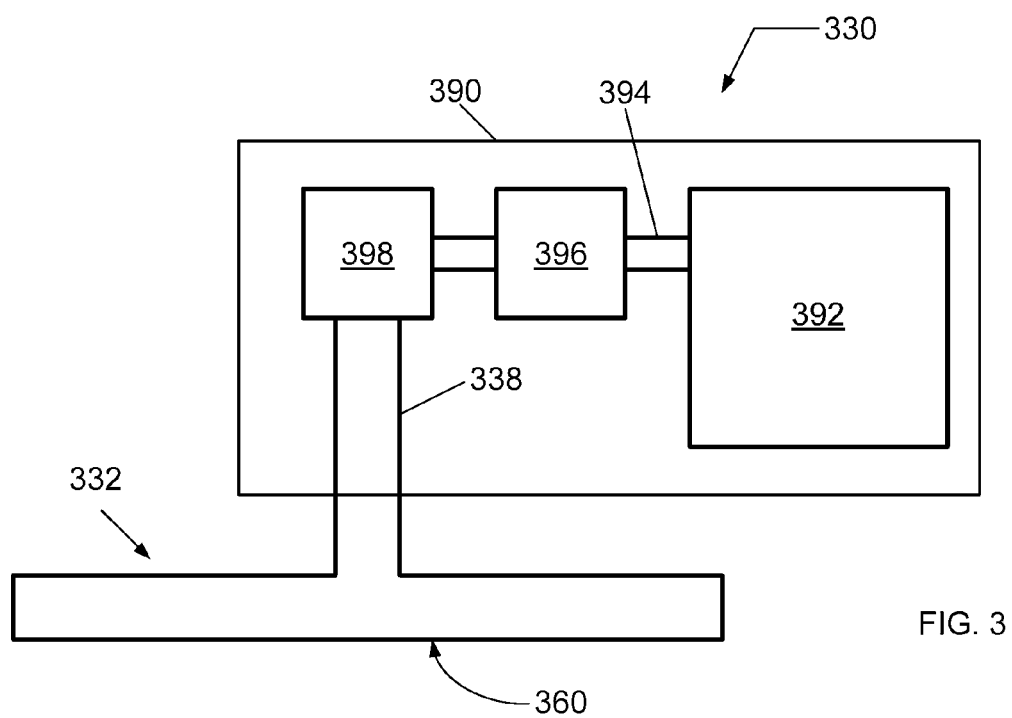
FIG. 3 illustrates a simplified schematic representation of a surface wave plasma (SWP) source that can be used in the (VUV/EEDf) plasma system in accordance with embodiments of the invention.

FIG. 3 illustrates a simplified schematic representation of a surface wave plasma (SWP) source that can be used in the (VUV/EEDf) plasma system in accordance with embodiments of the invention. A schematic representation of a SWP source 330 is provided according to an embodiment. The SWP source 330 can comprise an electromagnetic (EM) wave launcher 332 configured to couple EM energy in a desired EM wave mode to a plasma by generating a surface wave on a plasma-facing surface 360 of the EM wave launcher 332 adjacent to the plasma. Furthermore, the SWP source 330 comprises a power coupling system 390 coupled to the EM wave launcher 332, and configured to provide the EM energy to the EM wave launcher 332 for forming the plasma.

The EM wave launcher 332 includes a microwave launcher configured to radiate microwave power into plasma generation space (125a, FIG. 1). The EM wave launcher 332 can be coupled to the power coupling system 390 via coaxial feed 338 through which microwave energy is transferred. Alternatively, a waveguide feed may be used. The power coupling system 390 can include a microwave source 392, such as a 2.45 GHz microwave power source. Microwave energy generated by the microwave source 392 can be guided through a waveguide 394 to an isolator 396 for absorbing microwave energy reflected back to the microwave source 392. Alternatively, a circulator may be used. For example, the microwave energy can be converted to a coaxial TEM (transverse electromagnetic) mode via a coaxial converter 398. Alternatively, a waveguide converter may be used. A tuner (not shown) may be employed for impedance matching, and improved power transfer. When the microwave energy is coupled to the EM wave launcher 332 via the coaxial feed 338, another mode change can occur from the TEM mode in the coaxial feed 338 to a TM (transverse magnetic) mode. Additional details regarding the design of the coaxial feed 338 and the EM wave launcher 332 can be found in U.S. Pat. No. 5,024,716, entitled "Plasma processing apparatus for etching, ashing, and filmformation"; the content of which is herein incorporated by reference in its entirety.

Figure 4:
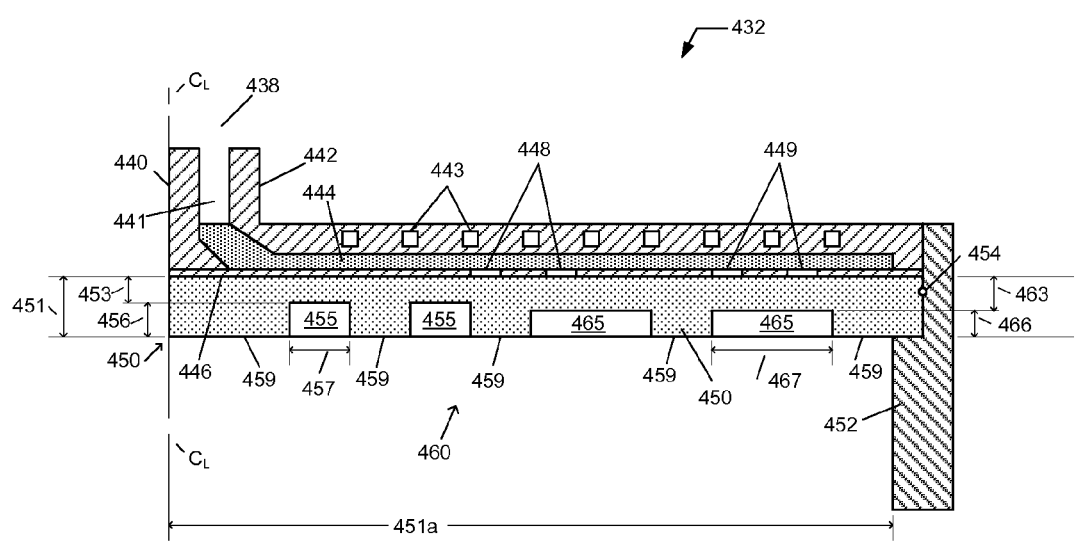
FIG. 4 illustrates a schematic cross-sectional view of an electromagnetic (EM) wave launcher in accordance with embodiments of the invention.

FIG. 4 illustrates a schematic cross-sectional view of EM wave launcher 432 in accordance with embodiments of the invention. The EM wave launcher 432 can comprise a coaxial feed 438 having an inner conductor 440, an outer conductor 442, and insulator 441, and a slotted antenna 446 having a plurality of slots (448 and 449) coupled between the inner conductor 440 and the outer conductor 442 as shown in FIG. 4. The plurality of slots (448 and 449) permits the coupling of EM energy from a first region above the slotted antenna 446 to a second region below the slotted antenna 446. The EM wave launcher 432 may further comprise a slow wave plate 444, and a resonator plate 450.

The number, geometry, size, and distribution of the slots (448 and 449) can contribute to the spatial uniformity and stability of the plasma formed in plasma generation space (125a, FIG. 1). Thus, the design of the slotted antenna 446 may be used to control the spatial uniformity and stability of the plasmas in the plasma/processing spaces (125a and/or 125b, FIG. 1), or other plasma spaces.

As shown in FIG. 4, the EM wave launcher 432 may comprise a fluid channel 443 that is configured to flow a temperature control fluid for temperature control of the EM wave launcher 432. Alternatively, the EM wave launcher 432 may further be configured to introduce a process gas through a plasma-facing surface 460 to the plasma.

Referring still to FIG. 4, the EM wave launcher 432 may be coupled to an upper chamber portion of a plasma processing system, wherein a vacuum seal can be formed between an upper chamber wall 452 and the EM wave launcher 432 using a sealing device 454. The sealing device 454 can include an elastomeric O-ring; however, other known sealing mechanisms may be used.

In general, the inner conductor 440 and the outer conductor 442 of the coaxial feed 438 can comprise a conductive material, such as a metal, while the slow wave plate 444 and the resonator plate 450 can comprise one or more dielectric materials. In some embodiments, the slow wave plate 444 and the resonator plate 450 can comprise the same material; however, different materials may be used. The material selected for fabrication of the slow wave plate 444 and the resonator plate 450 can be chosen to reduce the wavelength of the propagating electromagnetic (EM) wave relative to the corresponding free-space wavelength, and the dimensions of the slow wave plate 444 and the resonator plate 450 are chosen to ensure the formation of a standing wave effective for radiating EM energy into plasma generation space (125a, FIG. 1), or other plasma spaces.

The slow wave plate 444 and the resonator plate 450 can be fabricated from silicon-containing materials such as quartz (silicon dioxide), or a high dielectric constant (high-k) materials. For example, the high-k material may possess a dielectric constant greater than a value of four. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 450 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 450 can be fabricated from alumina ($Al_2O_3$), or sapphire.

Various measurements have shown that plasma uniformity, plasma stability, and VUV damage issues can be viewed as challenges for the practical implementation of a SWP source as described above. In the latter, the standing wave at the resonator plate-plasma interface, i.e., at the plasma-facing surface 460, may be prone to mode jumps as plasma parameters shift, which may create VUV radiation and cause VUV problems.

In various embodiments, the EM wave launcher 432 can be fabricated with a plurality of first recesses 455 configured in a first pattern formed in the plasma-facing surface 460 and a plurality of second recesses 465 configured in a second pattern formed in the plasma-facing surface 460.

Each of the first recesses 455 may comprise a unique indentation or dimple formed within the plasma-facing surface 460. For example, one or more of the first recesses 455 may comprise a cylindrical geometry, a spherical geometry, an aspherical geometry, a rectangular geometry, or any arbitrary shape. The first recesses 455 may include recesses characterized by a first size (e.g., latitudinal dimension (or width), and/or longitudinal dimension (or depth)).

Each of the second recesses 465 may also comprise a unique indentation or dimple formed within the plasma-facing surface 460. For example, one or more of the second recesses 465 may comprise a cylindrical geometry, a spherical geometry, an aspherical geometry, a rectangular geometry, or any arbitrary shape. The second recesses 465 may include recesses characterized by a second size (e.g., latitudinal dimension (or width), and/or longitudinal dimension (or depth)). The first size may or may not be the same as the second size. For instance, the second size may be smaller than the first size.

The number, geometry, size, and distribution of the recesses (455 and 465) can contribute to the spatial uniformity and stability of the plasma formed in plasma generation spaces (125a, FIG. 1), or other plasma spaces. Thus, the design of the recesses (455 and 465) may be used to control the spatial uniformity and stability of the plasmas in the plasma/processing spaces (125a and/or 125b, FIG. 1), or other plasma spaces.

As shown in FIG. 4, the resonator plate 450 comprises a dielectric plate having a plate thickness 451 and a plate radius 451a. In addition, the plasma-facing surface 460 on resonator plate 450 can comprise a planar surface 459 within which the plurality of first recesses 455 and the plurality of second recesses 465 are formed. Alternatively, the resonator plate 450 may comprise an arbitrary geometry that may include concave, and/or convex surfaces.

The propagation of EM energy in the resonator plate 450 may be characterized by an effective wavelength ($\lambda$) for a given frequency of EM energy and dielectric constant for the resonator plate 450. The plate thickness may be an integer number of quarter wavelengths (n $\lambda/4$, where n is an integer greater than zero) or an integer number of half wavelengths (m $\lambda/2$, where m is an integer greater than zero). For instance, the plate thickness 451 may be about half the effective wavelength ($\lambda/2$) or greater than half the effective wavelength ($>\lambda/2$). Alternatively, the plate thickness 451 may range from about 25 mm (millimeters) to about 45 mm.

As an example, the first recesses 455 can comprise one or more cylindrical recesses, and each of the first recesses 455 can be characterized by a first depth 456 and a first diameter 457. As shown in FIG. 4, one or more of the second recesses 465 can be located near an inner region of the plasma-facing surface 460.

The first diameter 457 may be an integer number of quarter wavelengths (n$\lambda/4$, where n is an integer greater than zero) or an integer number of half wavelengths (m$\lambda/2$, where m is an integer greater than zero). Additionally, a first difference 453 between the plate thickness 451 and the first depth 456 may be an integer number of quarter wavelengths (n$\lambda/4$, where n is an integer greater than zero) or an integer number of half wavelengths (m$\lambda/2$, where m is an integer greater than zero). For instance, the first diameter 457 may be about half the effective wavelength ($\lambda/2$), and the first difference 453 between the plate thickness 451 and the first depth 456 may be about half the effective wavelength ($\lambda/2$) or about quarter the effective wavelength ($\lambda/4$). The plate thickness 451 may be about half the effective wavelength ($\lambda/2$) or greater than half the effective wavelength ($>\lambda/2$).

Alternatively, the first diameter 457 may range from about 25 mm to about 35 mm, and the first difference 453 between the plate thickness 451 and the first depth 456 may range from about 10 mm to about 35 mm. Alternatively yet, the first diameter 457 may range from about 30 mm to about 35 mm, and the first difference 453 may range from about 10 mm to about 20 mm.

In the first recesses 455, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 460. For example, the surface radius may range from about 1 mm to about 3 mm.

In addition, the second recesses 465 may comprise a second plurality of cylindrical recesses, each of the second plurality of cylindrical recesses being characterized by a second depth 466 and a second diameter 467. As shown in FIG. 4, one or more of the second recesses 465 can be located near an outer region of the plasma-facing surface 460.

The second diameter 467 may be an integer number of quarter wavelengths ($n\lambda/4$, where n is an integer greater than zero) or an integer number of half wavelengths ($m\lambda/2$, where m is an integer greater than zero). Additionally, a second difference 463 between the plate thickness 451 and the second depth 466 may be an integer number of quarter wavelengths ($n\lambda/4$, where n is an integer greater than zero) or an integer number of half wavelengths ($m\lambda/2$, where m is an integer greater than zero). For instance, the second diameter 467 may be about half the effective wavelength ($\lambda/2$) or quarter the effective wavelength ($\lambda/4$), and a second difference 463 between the plate thickness 451 and the second depth 466 may be about half the effective wavelength ($\lambda/2$) or about quarter the effective wavelength ($\lambda/4$).

Alternatively, the second diameter 467 may range from about 25 mm (millimeters) to about 35 mm, and the second difference 463 between the plate thickness and the second depth 466 may range from about 10 mm to about 35 mm. Alternatively yet, the second diameter 467 may range from about 30 mm to about 35 mm, and the second difference 463 may range from about 10 mm to about 20 mm.

In the second recesses 465, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 460. For example, the surface radius may range from about 1 mm to about 3 mm.

FIG. 5A illustrates a bottom view of an EM wave launcher in accordance with embodiments of the invention, and FIG. 5B illustrates a schematic cross-sectional view of a portion of the EM wave launcher depicted in FIG. 5A. FIG. 5A illustrates a bottom view of an exemplary EM wave launcher 532, and a plurality of slots (548 and 549) in the slotted antenna 546 are illustrated as if one can see through resonator plate 550 to the slotted antenna 546. As shown in FIG. 5A, the plurality of slots (548 and 549) can be arranged in pairs, and each of the pair of slots comprises a first slot oriented orthogonal to a second slot. However, the orientation of slots in the plurality of slots (548 and 549) can be arbitrary. For example, the orientation of slots in the plurality of slots (548 and 549) can be according to a pre-determined pattern for plasma uniformity and/or plasma stability.

On a planar surface 561 of resonator plate 550, first recesses 555 and second recesses 565 may be formed. In some embodiments, the first recesses 555 can be either aligned or partly aligned with the first slots 548 in the slotted antenna 546 or not aligned with the first slots 548 in the slotted antenna 546. For example, one or more of the first recesses 555 can be either aligned or partly aligned with a first slot 548 in the slotted antenna 546. In addition, one or more of the second recesses 565 can be aligned with one or more of second slots 549 in the slotted antenna 546.

In some embodiments, when one or more of the first recesses 555 are not aligned with one or more of the first slots 548, the second recesses 565 can be used to control the plasma generation and plasma stability. For example, when optical monitoring is used, uniform plasma can be measured across a range of powers coupled to the EM wave launcher 532 and a range of pressures in the plasma/processing spaces (125a and/or 125b, FIG. 1), and uniform plasma can be formed adjacent the plasma-facing surface 560. Further, the optical monitoring has shown that the variability of the first recesses 555 can contribute to plasma generation, plasma uniformity, and plasma stability for a wide range of the DC voltages, microwave power, and/or chamber pressure.

In other embodiments, when one or more of the second recesses 565 are aligned with one or more of second slots 549 in the slotted antenna 546, stable plasma can be established at low power levels. Plasma can be formed via ionization proximate these (larger) dimples, and flows from the second recesses 565 to the first recesses 555 (i.e., not aligned/partly aligned with the first slots 548). As a result, the plasma formed proximate these second recesses 565 is stable over a wide range of power and pressure, as the first recesses 555 can receive an "overflow" of plasma from the second recesses 565 and compensate for fluctuations in the plasma generation proximate the second recesses 565.

For improved control of plasma uniformity, the regions adjacent the planar surface 561 should be controlled so that the risk for development of a mode-pattern is reduced. Therefore, as illustrated in FIG. 5A and FIG. 5B, the optimal placement of the first recesses 555 and the second recesses 565 may be such that a relatively large number of first recesses 555 are not aligned with the plurality of first slots 548 in slotted antenna 546, and a relatively large number of the second recesses 565 are aligned with the plurality of second slots 549. Although, the arrangement of recesses (555 and 565) may be chosen to achieve plasma uniformity, it may also be desirable to achieve a non-uniform plasma that cooperates with other process parameters to achieve a uniform process at a surface of a substrate being processed by the plasma.

Referring still to FIG. 5A and FIG. 5B, an exemplary EM wave launcher 532 is illustrated that can include a resonator plate 550 with plasma-facing surface 560. The EM wave launcher 532 further comprises a slotted antenna 546 having a plurality of first slots 548 and a plurality of second slots 549. The first slots 548 and the second slots 549 permit the coupling of EM energy from a first region above the slotted antenna 546 to a second region below the slotted antenna wherein the resonator plate 550 is located.

The number, geometry, size, and distribution of the first slots 548 and second slots 549 can be factors that can contribute to the spatial uniformity and stability of the plasma formed in plasma generation spaces (125a, FIG. 1). Thus, the design of the slotted antenna 546 may be used to control the spatial uniformity and stability of the plasmas in the plasma/processing spaces (125a and/or 125b, FIG. 1).

In various embodiments, the first recesses 555 can comprise a unique indentation or dimple formed within the plasma-facing surface 560. For example, a first recess 555 can comprise a cylindrical geometry, a spherical geometry, an aspherical geometry, a rectangular geometry, or any arbitrary shape. The first recess 555 can be characterized by a first depth 556 and a first diameter 557.

In addition, each of the second recesses 565 can include a unique indentation or dimple formed within the plasma-facing surface 560. For example, a second recess 565 can comprise a cylindrical geometry, a spherical geometry, an aspherical geometry, a rectangular geometry, or any arbitrary shape.

The second recess 565 can be characterized by a second depth 566 and a second diameter 567. The dimensions of the first recesses 555 may or may not be the same as the dimensions of the second recesses 565. For instance, the first recesses 555 can be smaller than the second recesses 565.

Still referring to FIG. 5A and FIG. 5B, the resonator plate 550 comprises a dielectric plate having a plate thickness 551 and a plate diameter 552. For example, the plasma-facing surface 560 on resonator plate 550 can comprise a planar surface 561 within which the first recesses 555 and the second recesses 565 can be formed. Alternatively, the resonator plate 550 may comprise an arbitrary geometry that can include concave, and/or convex surfaces.

The propagation of EM energy in the resonator plate 550 may be characterized by an effective wavelength ($\lambda$) for a given frequency of EM energy and dielectric constant for the resonator plate 550. The plate thickness 551 may be an integer number of quarter wavelengths (n $\lambda$/4), where n is an integer greater than zero) or an integer number of half wavelengths (m $\lambda$/2), where m is an integer greater than zero). For instance, the plate thickness 551 may be about a half wavelength thick ($\lambda$/2) or greater than about half the effective wavelength (>$\lambda$/2). Alternatively, the plate thickness 551 may range from about 25 mm (millimeters) to about 45 mm.

As an example, the first recesses 555 can be configured as cylindrical recesses, with first depths 556 and first diameters 557, and the first recesses can be located near an inner region of the plasma-facing surface 560.

The first diameter 567 may be an integer number of quarter wavelengths (n$\lambda$/4, where n is an integer greater than zero) or an integer number of half wavelengths (m$\lambda$/2, where m is an integer greater than zero). Additionally, a first difference 553 between the plate thickness 551 and the first depth 556 may be an integer number of quarter wavelengths (n$\lambda$/4, where n is an integer greater than zero) or an integer number of half wavelengths (m$\lambda$/2, where m is an integer greater than zero). For instance, the first diameter 557 may be about half the effective wavelength ($\lambda$/2), and a first difference 553 between the plate thickness 551 and the first depth 556 may be about half the effective wavelength ($\lambda$/2) or about quarter the effective wavelength ($\lambda$/4). The plate thickness 551 may be about half the effective wavelength ($\lambda$/2) or greater than half the effective wavelength (>$\lambda$/2).

Alternatively, the first diameter 557 may range from about 25 mm to about 35 mm, and the first difference 553 between the plate thickness 551 and the first depth 556 may range from about 10 mm to about 35 mm. Alternatively yet, the first diameter may range from about 30 mm to about 35 mm, and the first difference may range from about 10 mm to about 20 mm.

In the first recesses 555, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 560. For example, the surface radius may range from about 1 mm to about 3 mm.

In addition, the second recesses 565 can also be configured as cylindrical recesses with a second depth 566 and a second diameter 567, and the second recesses can be located near an outer region of the plasma-facing surface 560. The second diameter 567 may be an integer number of quarter wavelengths (n$\lambda$/4, where n is an integer greater than zero) or an integer number of half wavelengths (m$\lambda$/2, where m is an integer greater than zero). Additionally, a second difference 563 between the plate thickness 551 and the second depth 566 may be an integer number of quarter wavelengths (n$\lambda$/4, where n is an integer greater than zero) or an integer number of half wavelengths (m$\lambda$/2, where m is an integer greater than zero). For instance, the second diameter 567 may be about half the effective wavelength ($\lambda$/2), and a second difference 563 between the plate thickness 551 and the second depth 566 may be about half the effective wavelength ($\lambda$/2) or about quarter the effective wavelength ($\lambda$/4).

Alternatively, the second diameter 567 may range from about 25 mm (millimeters) to about 35 mm, and the second difference 563 between the plate thickness 551 and the second depth 566 may range from about 10 mm to about 35 mm. Alternatively yet, the second diameter may range from about 30 mm to about 35 mm, and the second difference may range from about 10 mm to about 20 mm.

In the second recesses 565, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 560. For example, the surface radius may range from about 1 mm to about 3 mm.

Figures 6A, 6B:
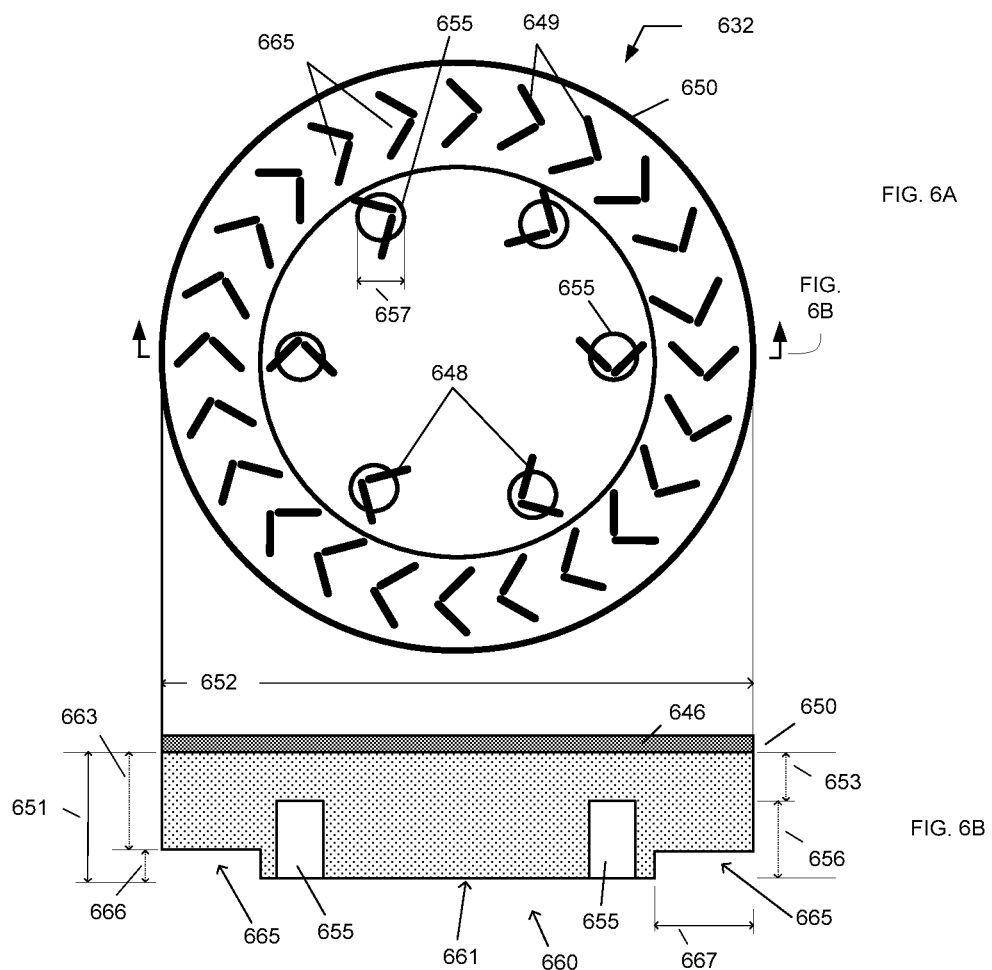
FIG. 6A illustrates a bottom view of an EM wave launcher in accordance with embodiments of the invention.
FIG. 6B illustrates a schematic cross-sectional view of a portion of the EM wave launcher depicted in FIG. 6A.

FIG. 6A illustrates a bottom view of an EM wave launcher in accordance with embodiments of the invention, and FIG. 6B illustrates a schematic cross-sectional view of a portion of the EM wave launcher depicted in FIG. 6A. FIG. 6A illustrates a bottom view of an exemplary EM wave launcher 632, and a plurality of slots (648 and 649) in the slotted antenna 646 are illustrated as if one can see through resonator plate 650 to the slotted antenna 646. As shown in FIG. 6A, the plurality of slots (648 and 649) can be arranged in pairs, and each of the pair of slots comprises a first slot oriented orthogonal to a second slot. However, the orientation of slots in the plurality of slots (648 and 649) can be arbitrary. For example, the orientation of slots in the plurality of slots (648 and 649) can be according to a pre-determined pattern for plasma uniformity and/or plasma stability.

In some embodiments, a plurality of first recesses 655 can be configured in the resonator plate 650 and one or more of the first recesses 655 are not aligned with one or more of the first slots 648 in the slotted antenna 646. Alternatively, one or more of the first recesses 655 may not be aligned with the first slots 648 in the slotted antenna 646. In addition, a shelf recess 665 can be configured in the resonator plate 650, and the shelf recess 665 can comprise an arbitrary geometry including, for example, a cylindrical geometry, a spherical geometry, an aspherical geometry, a rectangular geometry, or any arbitrary shape. The shelf recess 665 can include a shelf depth 666 and a shelf width 667.

Referring still to FIG. 6A and FIG. 6B, an exemplary EM wave launcher 632 is illustrated that can include a resonator plate 650 with plasma-facing surface 660. The EM wave launcher 632 further comprises a slotted antenna 646 having a plurality of first slots 648 and a plurality of second slots 649. The first slots 648 and the second slots 649 permit the coupling of EM energy from a first region above the slotted antenna 646 to a second region below the slotted antenna wherein the resonator plate 650 is located.

The number, geometry, size, and distribution of the first slots 648 and second slots 649 can be factors that can contribute to the spatial uniformity and stability of the plasma formed in plasma generation space (125a, FIG. 1). Thus, the design of the slotted antenna 646 may be used to control the spatial uniformity and stability of the plasmas in the plasma/processing spaces (125a and/or 125b, FIG. 1).

In various embodiments, the first recesses 655 can comprise a unique indentation or dimple formed within the plasma-facing surface 660. For example, a first recess 655 can comprise a cylindrical geometry, a spherical geometry, an aspherical geometry, a rectangular geometry, or any arbitrary shape. The first recess 655 can be characterized by a first depth 656 and a first diameter 657.

In addition, the shelf recess 665 can include a unique indentation or dimple formed within the plasma-facing surface 660. For example, a shelf recess 665 can comprise a cylindrical geometry, a spherical geometry, an aspherical geometry, a rectangular geometry, or any arbitrary shape.

Still referring to FIG. 6A and FIG. 6B, the resonator plate 650 comprises a dielectric plate having a plate thickness 651 and a plate diameter 652. For example, the plasma-facing surface 660 on resonator plate 650 can comprise a planar surface 661 within which the first recesses 655 and the shelf recess 665 can be formed. Alternatively, the resonator plate 650 may comprise an arbitrary geometry that can include concave, and/or convex surfaces.

The propagation of EM energy in the resonator plate 650 may be characterized by an effective wavelength ($\lambda$) for a given frequency of EM energy and dielectric constant for the resonator plate 650. The plate thickness 651 may be an integer number of quarter wavelengths (n $\lambda$/4), where n is an integer greater than zero) or an integer number of half wavelengths (m$\lambda$/2), where m is an integer greater than zero). For instance, the plate thickness 651 may be about a half wavelength thick ($\lambda$/2) or greater than about half the effective wavelength (>$\lambda$/2). Alternatively, the plate thickness 651 may range from about 25 mm (millimeters) to about 45 mm.

As an example, the first recesses 655 can be configured as cylindrical recesses, with first depths 656 and first diameters 657, and the first recesses can be located near an inner region of the plasma-facing surface 660.

The first diameter 657 may be an integer number of quarter wavelengths (n$\lambda$/4, where n is an integer greater than zero) or an integer number of half wavelengths (m$\lambda$/2, where m is an integer greater than zero). Additionally, a first difference 653 between the plate thickness 651 and the first depth 656 may be an integer number of quarter wavelengths (n$\lambda$/4, where n is an integer greater than zero) or an integer number of half wavelengths (m$\lambda$/2, where m is an integer greater than zero). For instance, the first diameter 657 may be about half the effective wavelength ($\lambda$/2), and a first difference 653 between the plate thickness 651 and the first depth 656 may be about half the effective wavelength ($\lambda$/2) or about quarter the effective wavelength ($\lambda$/4). The plate thickness 651 may be about half the effective wavelength ($\lambda$/2) or greater than half the effective wavelength (>$\lambda$/2).

Alternatively, the first diameter 657 may range from about 25 mm to about 35 mm, and the first difference 653 between the plate thickness 651 and the first depth 656 may range from about 10 mm to about 35 mm. Alternatively yet, the first diameter may range from about 30 mm to about 35 mm, and the first difference may range from about 10 mm to about 20 mm.

In the first recesses 655, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 660. For example, the surface radius may range from about 1 mm to about 3 mm.

In addition, the shelf recess 665 can be configured as cylindrical ring with a shelf depth 666 and a shelf width 667, and the shelf recess can be located near an outer region of the plasma-facing surface 660.

The shelf width 667 may be an integer number of quarter wavelengths (n$\lambda$/4, where n is an integer greater than zero) or an integer number of half wavelengths (m$\lambda$/2, where m is an integer greater than zero). Additionally, a second difference 663 between the plate thickness 651 and the shelf depth 666 may be an integer number of quarter wavelengths (n$\lambda$/4, where n is an integer greater than zero) or an integer number of half wavelengths (m$\lambda$/2, where m is an integer greater than zero). For instance, the shelf width 667 may be about half the effective wavelength ($\lambda$/2), and a second difference 663 between the plate thickness 651 and the shelf depth 666 may be about half the effective wavelength ($\lambda$/2) or about quarter the effective wavelength ($\lambda$/4).

Alternatively, the shelf width 667 may range from about 25 mm (millimeters) to about 35 mm, and the second difference 663 between the plate thickness 651 and the shelf depth 666 may range from about 10 mm to about 35 mm. Alternatively yet, the shelf width may range from about 30 mm to about 35 mm, and the second difference may range from about 10 mm to about 20 mm.

In the shelf recess 665, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 660. For example, the surface radius may range from about 1 mm to about 3 mm.

FIG. 7A illustrates a bottom view of an EM wave launcher in accordance with embodiments of the invention, and FIG. 7B illustrates a schematic cross-sectional view of a portion of the EM wave launcher depicted in FIG. 7A. FIG. 7A illustrates a bottom view of an exemplary EM wave launcher 732, and a plurality of slots (748 and 749) in the slotted antenna 746 are illustrated as if one can see through resonator plate 750 to the slotted antenna 746. As shown in FIG. 7A, the plurality of slots (748 and 749) can be arranged in pairs, and each of the pair of slots comprises a first slot oriented orthogonal to a second slot. However, the orientation of slots in the plurality of slots (748 and 749) can be arbitrary. For example, the orientation of slots in the plurality of slots (748 and 749) can be according to a pre-determined pattern for plasma uniformity and/or plasma stability.

In some embodiments, a plurality of first recesses 755 can be configured in the resonator plate 750 and one or more of the first recesses 755 can be substantially aligned with the first slots 748 in the slotted antenna 746. Alternatively, one or more of the first recesses 755 may not be aligned with one or more of the first slots 748 in the slotted antenna 746. In addition, a shelf recess 765 can be configured in the resonator plate 750, and the shelf recess 765 can comprise an arbitrary geometry including, for example, a cylindrical geometry, a spherical geometry, an aspherical geometry, a rectangular geometry, or any arbitrary shape. The shelf recess 765 can include a shelf depth 766 and a shelf width 767. For example, the shelf recess 765 can be substantially aligned with the plurality of second 749. Alternatively, the shelf recess 765 may be aligned, partly aligned, or not aligned with the plurality of second slots 749.

Referring still to FIG. 7A and FIG. 7B, an exemplary EM wave launcher 732 is illustrated that can include a resonator plate 750 with plasma-facing surface 760. The EM wave launcher 732 further comprises a slotted antenna 746 having a plurality of first slots 748 and a plurality of second slots 749. The first slots 748 and the second slots 749 permit the coupling of EM energy from a first region above the slotted antenna 746 to a second region below the slotted antenna wherein the resonator plate 750 is located.

The number, geometry, size, and distribution of the first slots 748 and second slots 749 can be factors that can contribute to the spatial uniformity and stability of the plasma formed in plasma generation space (125a, FIG. 1). Thus, the design of the slotted antenna 746 may be used to control the spatial uniformity and stability of the plasmas in the plasma/processing spaces (125a and/or 125b, FIG. 1).

In various embodiments, the first recesses 755 can comprise a unique indentation or dimple formed within the plasma-facing surface 760. For example, a first recess 755 can comprise a cylindrical geometry, a spherical geometry, an aspherical geometry, a rectangular geometry, or any arbitrary shape. The first recess 755 can be characterized by a first depth 756 and a first diameter 757.

In addition, the shelf recess 765 can include a unique indentation or dimple formed within the plasma-facing surface 760. For example, a shelf recess 765 can comprise a cylindrical geometry, a spherical geometry, an aspherical geometry, a rectangular geometry, or any arbitrary shape.

Still referring to FIG. 7A and FIG. 7B, the resonator plate 750 comprises a dielectric plate having a plate thickness 751 and a plate diameter 752. For example, the plasma-facing surface 760 on resonator plate 750 can comprise a planar surface 761 within which the first recesses 755 and the shelf recess 765 can be formed. Alternatively, the resonator plate 750 may comprise an arbitrary geometry that can include concave, and/or convex surfaces.

The propagation of EM energy in the resonator plate 750 may be characterized by an effective wavelength ($\lambda$) for a given frequency of EM energy and dielectric constant for the resonator plate 750. The plate thickness 751 may be an integer number of quarter wavelengths (n $\lambda$/4, where n is an integer greater than zero) or an integer number of half wavelengths (m $\lambda$/2, where m is an integer greater than zero). For instance, the plate thickness 751 may be about a half wavelength thick ($\lambda$/2) or greater than about half the effective wavelength (>$\lambda$/2). Alternatively, the plate thickness 751 may range from about 25 mm (millimeters) to about 45 mm.

As an example, the first recesses 755 can be configured as cylindrical recesses, with first depths 756 and first diameters 757, and the first recesses can be located near an inner region of the plasma-facing surface 760.

The first diameter 757 may be an integer number of quarter wavelengths (n $\lambda$/4, where n is an integer greater than zero) or an integer number of half wavelengths (m $\lambda$/2, where m is an integer greater than zero). Additionally, a first difference 753 between the plate thickness 751 and the first depth 756 may be an integer number of quarter wavelengths (n $\lambda$/4, where n is an integer greater than zero) or an integer number of half wavelengths (m $\lambda$/2, where m is an integer greater than zero). For instance, the first diameter 757 may be about half the effective wavelength ($\lambda$/2), and a first difference 753 between the plate thickness 751 and the first depth 756 may be about half the effective wavelength ($\lambda$/2) or about quarter the effective wavelength ($\lambda$/4). The plate thickness 751 may be about half the effective wavelength ($\lambda$/2) or greater than half the effective wavelength (>$\lambda$/2).

Alternatively, the first diameter 757 may range from about 25 mm to about 35 mm, and the first difference 753 between the plate thickness 751 and the first depth 756 may range from about 10 mm to about 35 mm. Alternatively yet, the first diameter may range from about 30 mm to about 35 mm, and the first difference may range from about 10 mm to about 20 mm.

In the first recesses 755, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 760. For example, the surface radius may range from about 1 mm to about 3 mm.

In addition, the shelf recess 765 can be configured as cylindrical ring with a shelf depth 766 and a shelf width 767, and the shelf recess can be located near an outer region of the plasma-facing surface 760.

The shelf width 767 may be an integer number of quarter wavelengths (n$\lambda$/4, where n is an integer greater than zero) or an integer number of half wavelengths (m$\lambda$/2, where m is an integer greater than zero). Additionally, a second difference 763 between the plate thickness 751 and the shelf depth 766 may be an integer number of quarter wavelengths (n$\lambda$/4, where n is an integer greater than zero) or an integer number of half wavelengths (m$\lambda$/2, where m is an integer greater than zero). For instance, the shelf width 767 may be about half the effective wavelength ($\lambda$/2), and a second difference 763 between the plate thickness 751 and the shelf depth 766 may be about half the effective wavelength ($\lambda$/2) or about quarter the effective wavelength ($\lambda$/4).

Alternatively, the shelf width 767 may range from about 25 mm (millimeters) to about 35 mm, and the second difference 763 between the plate thickness 751 and the shelf depth 766 may range from about 10 mm to about 35 mm. Alternatively yet, the shelf width may range from about 30 mm to about 35 mm, and the second difference may range from about 10 mm to about 20 mm.

In the shelf recess 765, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 760. For example, the surface radius may range from about 1 mm to about 3 mm.

Figures 8A, 8B:
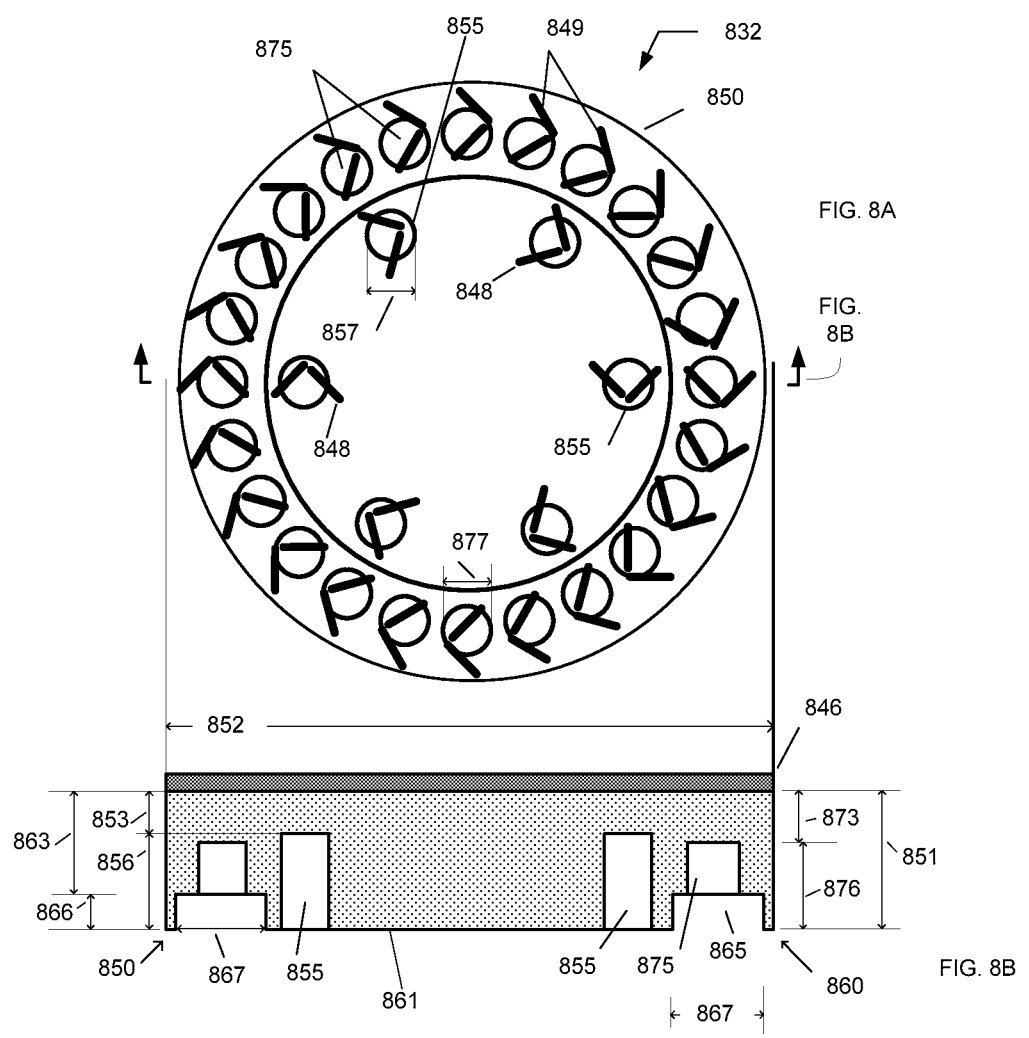
FIG. 8A illustrates a bottom view of an EM wave launcher in accordance with embodiments of the invention.
FIG. 8B illustrates a schematic cross-sectional view of a portion of the EM wave launcher depicted in FIG. 8A.

FIG. 8A illustrates a bottom view of an EM wave launcher in accordance with embodiments of the invention, and FIG. 8B illustrates a schematic cross-sectional view of a portion of the EM wave launcher depicted in FIG. 8A. FIG. 8A illustrates a bottom view of an exemplary EM wave launcher 832, and a plurality of slots (848 and 849) in the slotted antenna 846 are illustrated as if one can see through resonator plate 850 to the slotted antenna 846. As shown in FIG. 8A, the plurality of slots (848 and 849) can be arranged in pairs, and each of the pair of slots comprises a first slot oriented orthogonal to a second slot. However, the orientation of slots in the plurality of slots (848 and 849) can be arbitrary. For example, the orientation of slots in the plurality of slots (848 and 849) can be according to a pre-determined pattern for plasma uniformity and/or plasma stability.

In some embodiments, a plurality of first recesses 855 can be configured in the resonator plate 850 and one or more of the first recesses 855 can be substantially non-aligned with the first slots 848 in the slotted antenna 846. Alternatively, one or more of the first recesses 855 may be aligned or partially aligned with one or more of the first slots 848 in the slotted antenna 846. In addition, a slot recess 865 can be configured in the resonator plate 850, and the slot recess 865 can comprise an arbitrary geometry including, for example, a cylindrical geometry, a spherical geometry, an aspherical geometry, a rectangular geometry, or any arbitrary shape. The slot recess 865 can include a slot depth 866 and a slot width 867. For example, the slot recess 865 can be substantially aligned with the plurality of second slots 849. Alternatively, the slot recess 865 may be either aligned, partly aligned, or not aligned with the plurality of second slots 849. Furthermore, a second recess 875 can be configured in the slot recess 865 in the resonator plate 850, and the second recess 875 can comprise an arbitrary geometry including, for example, a cylindrical geometry, a spherical geometry, an aspherical geometry, a rectangular geometry, or any arbitrary shape.

Referring still to FIG. 8A and FIG. 8B, an exemplary EM wave launcher 832 is illustrated that can include a resonator plate 850 with plasma-facing surface 860. The EM wave launcher 832 further comprises a slotted antenna 846 having a plurality of first slots 848 and a plurality of second slots 849. The first slots 848 and the second slots 849 permit the coupling of EM energy from a first region above the slotted antenna 846 to a second region below the slotted antenna wherein the resonator plate 850 is located.

The number, geometry, size, and distribution of the first slots 848 and second slots 849 can be factors that can contribute to the spatial uniformity and stability of the plasma formed in plasma generation space (125a, FIG. 1). Thus, the design of the slotted antenna 846 may be used to control the spatial uniformity and stability of the plasmas in the plasma/processing spaces (125a and/or 125b, FIG. 1).

In various embodiments, the first recesses 855 can comprise a unique indentation or dimple formed within the plasma-facing surface 860. For example, a first recess 855 can comprise a cylindrical geometry, a spherical geometry, an aspherical geometry, a rectangular geometry, or any arbitrary shape. The first recess 855 can be characterized by a first depth 856 and a first diameter 857.

In addition, the slot recess 865 can include a unique indentation or dimple formed within the plasma-facing surface 860. For example, a slot recess 865 can comprise a cylindrical geometry, a spherical geometry, an aspherical geometry, a rectangular geometry, or any arbitrary shape.

Furthermore, the second recesses 875 can comprise a unique indentation or dimple formed within the plasma-facing surface 860. For example, a second recess 875 can comprise a cylindrical geometry, a spherical geometry, an aspherical geometry, a rectangular geometry, or any arbitrary shape. The second recess 875 can be characterized by a second depth 876 and a second diameter 877.

Still referring to FIG. 8A and FIG. 8B, the resonator plate 850 comprises a dielectric plate having a plate thickness 851 and a plate diameter 852. For example, the plasma-facing surface 860 on resonator plate 850 can comprise a planar surface 861 within which the first recesses 855 and the slot recess 865 can be formed. Alternatively, the resonator plate 850 may comprise an arbitrary geometry that can include concave, and/or convex surfaces.

The propagation of EM energy in the resonator plate 850 may be characterized by an effective wavelength ($\lambda$) for a given frequency of EM energy and dielectric constant for the resonator plate 850. The plate thickness 851 may be an integer number of quarter wavelengths (n $\lambda$/4, where n is an integer greater than zero) or an integer number of half wavelengths (m $\lambda$/2, where m is an integer greater than zero). For instance, the plate thickness 851 may be about a half wavelength thick ($\lambda$/2) or greater than about half the effective wavelength (>$\lambda$/2). Alternatively, the plate thickness 851 may range from about 25 mm (millimeters) to about 45 mm.

As an example, the first recesses 855 can be configured as cylindrical recesses, with first depths 856 and first diameters 857, and the first recesses can be located near an inner region of the plasma-facing surface 860.

The first diameter 857 may be an integer number of quarter wavelengths (n $\lambda$/4, where n is an integer greater than zero) or an integer number of half wavelengths (m $\lambda$/2, where m is an integer greater than zero). Additionally, a first difference 853 between the plate thickness 851 and the first depth 856 may be an integer number of quarter wavelengths (n $\lambda$/4, where n is an integer greater than zero) or an integer number of half wavelengths (m $\lambda$/2, where m is an integer greater than zero). For instance, the first diameter 857 may be about half the effective wavelength ($\lambda$/2), and a first difference 853 between the plate thickness 851 and the first depth 856 may be about half the effective wavelength ($\lambda$/2) or about quarter the effective wavelength ($\lambda$/4). Alternatively, the first diameter 857 may range from about 25 mm to about 35 mm, and the first difference 853 between the plate thickness 851 and the first depth 856 may range from about 10 mm to about 35 mm. Alternatively yet, the first diameter may range from about 30 mm to about 35 mm, and the first difference may range from about 10 mm to about 20 mm.

In the first recesses 855, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 860. For example, the surface radius may range from about 1 mm to about 3 mm.

In addition, the slot recess 865 can be configured as cylindrical ring with a slot depth 866 and a slot width 867, and the slot recess can be located near an outer region of the plasma-facing surface 860.

The slot width 867 may be an integer number of quarter wavelengths (n $\lambda$/4, where n is an integer greater than zero) or an integer number of half wavelengths (m $\lambda$/2, where m is an integer greater than zero). Additionally, a second difference 863 between the plate thickness 851 and the slot depth 866 may be an integer number of quarter wavelengths (n $\lambda$/4, where n is an integer greater than zero) or an integer number of half wavelengths (m $\lambda$/2, where m is an integer greater than zero). For instance, the slot width 867 may be about half the effective wavelength ($\lambda$/2), and a second difference 863 between the plate thickness 851 and the slot depth 866 may be about half the effective wavelength ($\lambda$/2) or about quarter the effective wavelength ($\lambda$/4).

Alternatively, the slot width 867 may range from about 25 mm (millimeters) to about 35 mm, and the second difference 863 between the plate thickness 851 and the slot depth 866 may range from about 10 mm to about 35 mm. Alternatively yet, the slot width may range from about 30 mm to about 35 mm, and the second difference may range from about 10 mm to about 20 mm.

In the slot recess 865, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 860. For example, the surface radius may range from about 1 mm to about 3 mm.

As another example, the second recesses 875 can be configured as cylindrical recesses, with second depths 876 and second diameters 877, and the second recesses can be located near an outer region of the plasma-facing surface 860.

The third diameter 877 may be an integer number of quarter wavelengths (n $\lambda$/4, where n is an integer greater than zero) or an integer number of half wavelengths (m $\lambda$/2, where m is an integer greater than zero). Additionally, a third difference 873 between the plate thickness 851 and the second depth 876 may be an integer number of quarter wavelengths (n $\lambda$/4, where n is an integer greater than zero) or an integer number of half wavelengths (m $\lambda$/2, where m is an integer greater than zero). For instance, the third diameter 877 may be about half the effective wavelength ($\lambda$/2), and a third difference 873 between the plate thickness 851 and the second depth 876 may be about half the effective wavelength ($\lambda$/2) or about quarter the effective wavelength ($\lambda$/4). Alternatively, the third diameter 877 may range from about 25 mm to about 35 mm, and the third difference 873 between the plate thickness 851 and the second depth 876 may range from about 10 mm to about 35 mm. Alternatively yet, the third diameter 877 may range from about 30 mm to about 35 mm, and the third difference 873 may range from about 10 mm to about 20 mm.

In the second recesses 875, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess 875, a surface radius may be disposed at the corner between the cylindrical sidewall and the plasma-facing surface 860. For example, the surface radius may range from about 1 mm to about 3 mm.

Figures 9A, 9B:
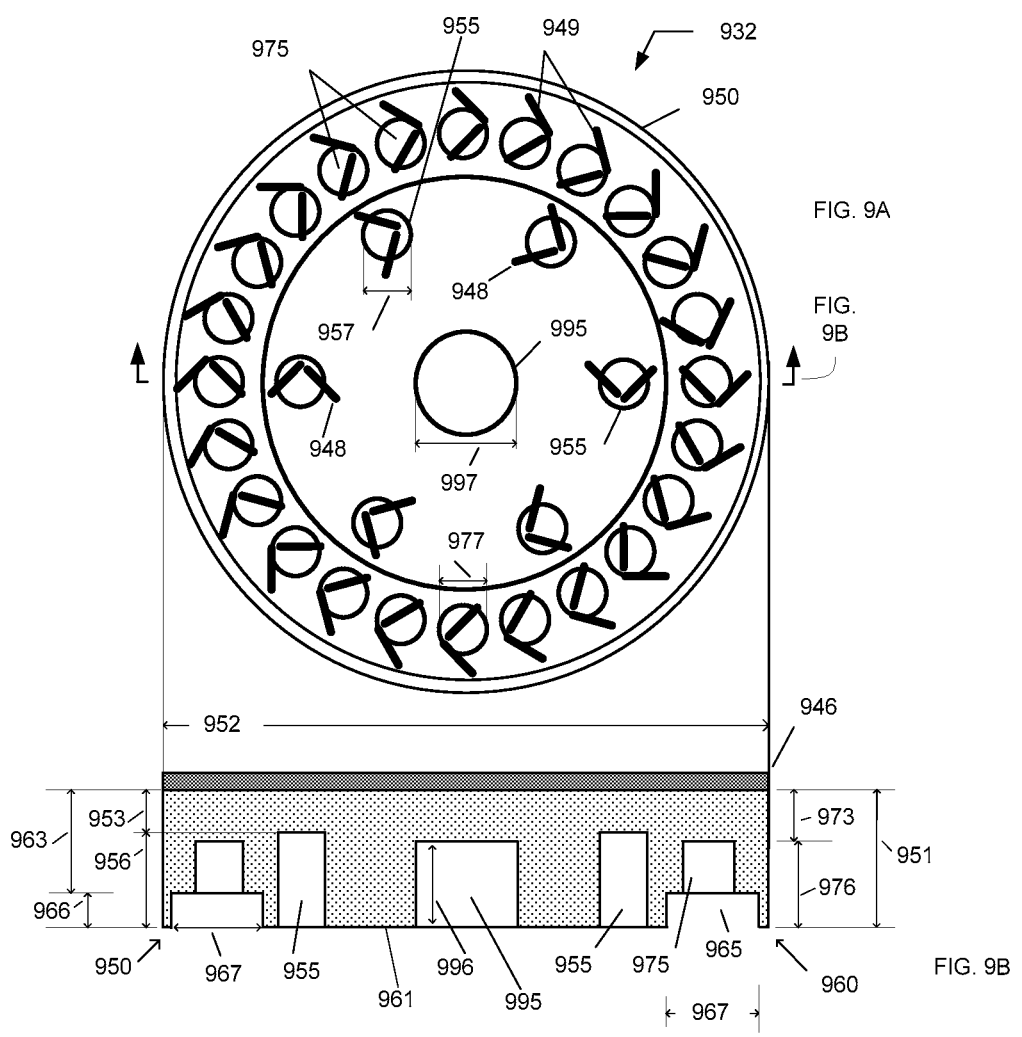
FIG. 9A illustrates a bottom view of an EM wave launcher in accordance with embodiments of the invention.
FIG. 9B illustrates a schematic cross-sectional view of a portion of the EM wave launcher depicted in FIG. 9A.

FIG. 9A illustrates a bottom view of an EM wave launcher in accordance with embodiments of the invention, and FIG. 9B illustrates a schematic cross-sectional view of a portion of the EM wave launcher depicted in FIG. 9A. FIG. 9A illustrates a bottom view of an exemplary EM wave launcher 932, and a plurality of slots (948 and 949) in the slotted antenna 946 are illustrated as if one can see through resonator plate 950 to the slotted antenna 946. As shown in FIG. 9A, the plurality of slots (948 and 949) can be arranged in pairs, and each of the pair of slots comprises a first slot oriented orthogonal to a second slot. However, the orientation of slots in the plurality of slots (948 and 949) can be arbitrary. For example, the orientation of slots in the plurality of slots (948 and 949) can be according to a pre-determined pattern for plasma uniformity and/or plasma stability.

In some embodiments, a plurality of first recesses 955 can be configured in the resonator plate 950 and one or more of the first recesses 955 can be substantially non-aligned with the first slots 948 in the slotted antenna 946. Alternatively, one or more of the first recesses 955 may be aligned or partially aligned with one or more of the first slots 948 in the slotted antenna 946. One or more slot recesses 965 can also be configured in the resonator plate 950, and the slot recess 965 can comprise an arbitrary geometry including, for example, a cylindrical geometry, a spherical geometry, an aspherical geometry, a rectangular geometry, or any arbitrary shape. The slot recess 965 can include a slot depth 966 and a slot width 967. For example, the slot recess 965 can be substantially aligned with the plurality of second slots 949. Alternatively, the slot recess 965 may be either aligned, partly aligned, or not aligned with the plurality of second slots 949.

In addition, a plurality of second recesses 975 can be configured in the slot recess 965, and the second recesses 975 can comprise an arbitrary geometry including, for example, a cylindrical geometry, a spherical geometry, an aspherical geometry, a rectangular geometry, or any arbitrary shape. The second recesses 975 can include a second depths 976 and second widths 977. For example, the second recesses 975 can be substantially aligned with the plurality of second slots 949. Alternatively, the second recesses 975 may be either aligned, partly aligned, or not aligned with the plurality of second slots 949.

Furthermore, one or more third recesses 995 can be configured in the resonator plate 950, and the third recesses 995 can comprise an arbitrary geometry including, for example, a cylindrical geometry, a spherical geometry, an aspherical geometry, a rectangular geometry, or any arbitrary shape. The third recesses 995 can include third depths 996 and third widths 997. For example, the third recesses 995 can be substantially aligned within the plurality of first slots 948. Alternatively, the third recesses 995 may be either aligned, partly aligned, or not aligned within the plurality of first slots 948.

Referring still to FIG. 9A and FIG. 9B, an exemplary EM wave launcher 932 is illustrated that can include a resonator plate 950 with plasma-facing surface 960. The EM wave launcher 932 further comprises a slotted antenna 946 having a plurality of first slots 948 and a plurality of second slots 949. The first slots 948 and the second slots 949 permit the coupling of EM energy from a first region above the slotted antenna 946 to a second region below the slotted antenna wherein the resonator plate 950 is located.

The number, geometry, size, and distribution of the first slots 948 and second slots 949 can be factors that can contribute to the spatial uniformity and stability of the plasma formed in plasma generation space (125a, FIG. 1). Thus, the design of the slotted antenna 946 may be used to control the spatial uniformity and stability of the plasmas in the plasma/processing spaces (125a and/or 125b, FIG. 1).

In various embodiments, the first recesses 955, the second recesses 975, and the third recesses 995 can comprise a unique indentation or dimple formed within the plasma-facing surface 960. For example, the first recesses 955, the second recesses 975, and the third recesses 995 can comprise a cylindrical geometry, a spherical geometry, an aspherical geometry, a rectangular geometry, or any arbitrary shape. The first recess 955 can be characterized by a first depth 956 and a first diameter 957. The second recess 975 can be characterized by a second depth 976 and a second diameter 977. The third recess 995 can be characterized by a third depth 996 and a third diameter 997.

In addition, the slot recess 965 can include a unique indentation or dimple formed within the plasma-facing surface 960. For example, a slot recess 965 can comprise a cylindrical geometry, a spherical geometry, an aspherical geometry, a rectangular geometry, or any arbitrary shape.

Still referring to FIG. 9A and FIG. 9B, the resonator plate 950 comprises a dielectric plate having a plate thickness 951 and a plate diameter 952. For example, the plasma-facing surface 960 on resonator plate 950 can comprise a planar surface 961 within which the first recesses 955 and the slot recess 965 can be formed. Alternatively, the resonator plate 950 may comprise an arbitrary geometry that can include concave, and/or convex surfaces.

The propagation of EM energy in the resonator plate 950 may be characterized by an effective wavelength ($\lambda$) for a given frequency of EM energy and dielectric constant for the resonator plate 950. The plate thickness 951 may be an integer number of quarter wavelengths (n $\lambda$/4), where n is an integer greater than zero) or an integer number of half wavelengths (m λ/2), where m is an integer greater than zero). For instance, the plate thickness 951 may be about a half wavelength thick (λ/2) or greater than about half the effective wavelength (>λ/2). Alternatively, the plate thickness 951 may range from about 25 mm (millimeters) to about 45 mm.

As an example, the first recesses 955 can be configured as cylindrical recesses, with first depths 956 and first diameters 957, and the first recesses can be located near an inner region of the plasma-facing surface 960. In addition, the second recesses 975 can be configured as cylindrical recesses, with second depths 976 and second diameters 977, and the second recesses 975 can be located near an outer region of the plasma-facing surface 960.

The first diameter 957 and the second diameter 977 can be an integer number of quarter wavelengths (n λ/4), where n is an integer greater than zero) or an integer number of half wavelengths (m λ/2), where m is an integer greater than zero). Additionally, a first difference 953 between the plate thickness 951 and the first depth 956 may be an integer number of quarter wavelengths (n λ/4), where n is an integer greater than zero) or an integer number of half wavelengths (m λ/2), where m is an integer greater than zero). For instance, the first diameter 957 and the second diameter 977 can be about one half the effective wavelength (λ/2), and a first difference 953 between the plate thickness 951 and the first depth 956 may be about half the effective wavelength (λ/2) or about quarter the effective wavelength (λ/4). The plate thickness 951 may be about half the effective wavelength (λ/2) or greater than half the effective wavelength (>λ/2).

Alternatively, the first diameter 957 may range from about 25 mm to about 35 mm, and the first difference 953 between the plate thickness 951 and the first depth 956 may range from about 10 mm to about 35 mm. Alternatively yet, the first diameter may range from about 30 mm to about 35 mm, and the first difference may range from about 10 mm to about 20 mm.

In the first recesses 955, the second recesses 975, and the third recesses 995 rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 960. For example, the surface radius may range from about 1 mm to about 3 mm.

In addition, the slot recess 965 can be configured as cylindrical ring with a slot depth 966 and a slot width 967, and the slot recess can be located near an outer region of the plasma-facing surface 960.

The slot width 967 may be an integer number of quarter wavelengths (n λ/4), where n is an integer greater than zero) or an integer number of half wavelengths (m λ/2), where m is an integer greater than zero). Additionally, a second difference 963 between the plate thickness 951 and the slot depth 966 may be an integer number of quarter wavelengths (n λ/4), where n is an integer greater than zero) or an integer number of half wavelengths (m λ/2), where m is an integer greater than zero). For instance, the slot width 967 may be about half the effective wavelength (λ/2), and a second difference 963 between the plate thickness 951 and the slot depth 966 may be about half the effective wavelength (λ/2) or about quarter the effective wavelength (λ/4).

Alternatively, the slot width 967 may range from about 25 mm (millimeters) to about 35 mm, and the second difference 963 between the plate thickness 951 and the slot depth 966 may range from about 10 mm to about 35 mm. Alternatively yet, the slot width may range from about 30 mm to about 35 mm, and the second difference may range from about 10 mm to about 20 mm.

In the slot recess 965, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 960. For example, the surface radius may range from about 1 mm to about 3 mm.

The second diameter 977 can be an integer number of quarter wavelengths (n λ/4), where n is an integer greater than zero) or an integer number of half wavelengths (m λ/2), where m is an integer greater than zero). Additionally, a third difference 973 between the plate thickness 951 and the second depth 976 may be an integer number of quarter wavelengths (n λ/4), where n is an integer greater than zero) or an integer number of half wavelengths (m λ/2), where m is an integer greater than zero).

Furthermore, the third diameter 997 can be an integer number of quarter wavelengths (n λ/4), where n is an integer greater than zero) or an integer number of half wavelengths (m λ/2), where m is an integer greater than zero). Alternatively, the third diameter 997 may range from about 25 mm to about 35 mm, and the third difference 973 between the plate thickness 951 and the second depth 976 may range from about 10 mm to about 35 mm. Alternatively yet, the third diameter 997 may range from about 30 mm to about 35 mm, and the third difference 973 may range from about 10 mm to about 20 mm.

Figures 10A, 10B:
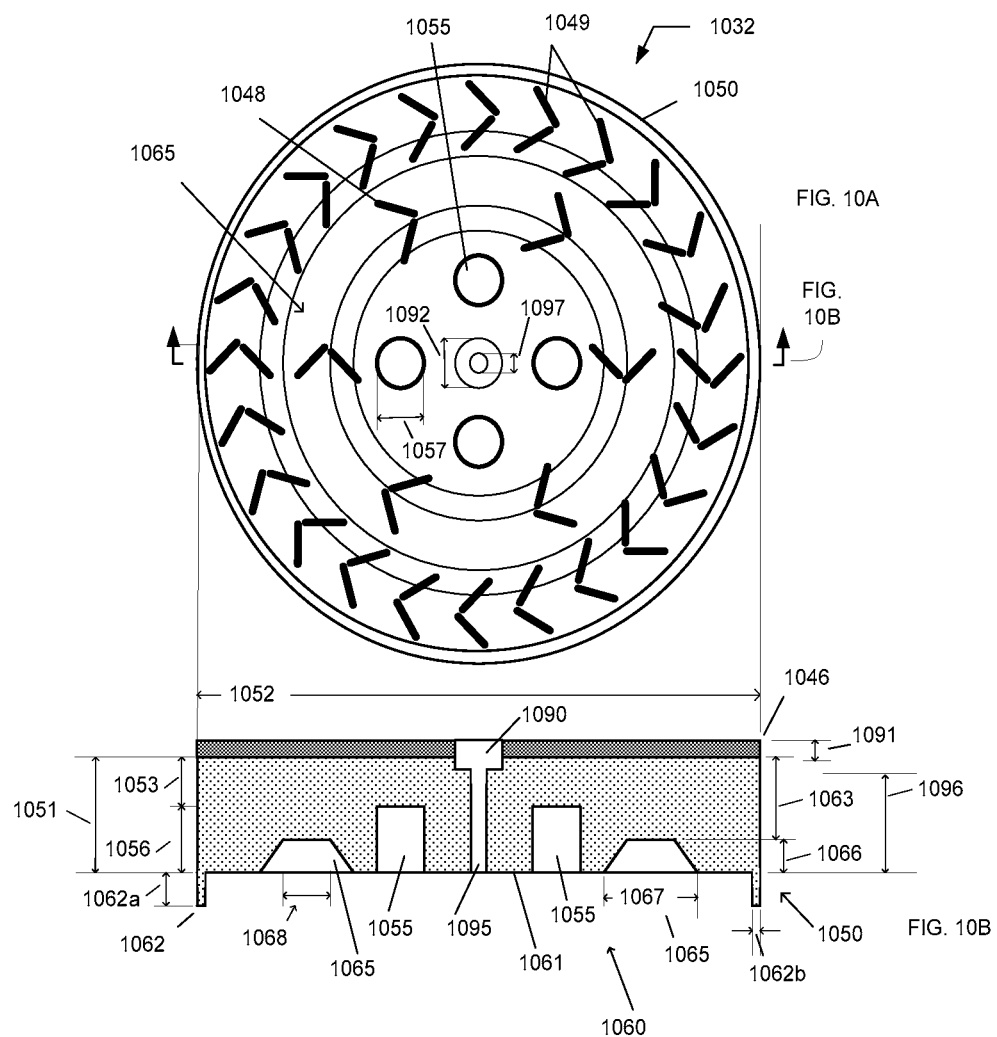
FIG. 10A illustrates a bottom view of an EM wave launcher in accordance with additional embodiments of the invention.
FIG. 10B illustrates a schematic cross-sectional view of a portion of the EM wave launcher depicted in FIG. 10A.

FIG. 10A illustrates a bottom view of an EM wave launcher in accordance with embodiments of the invention, and FIG. 10B illustrates a schematic cross-sectional view of a portion of the EM wave launcher depicted in FIG. 10A. FIG. 10A illustrates a bottom view of an exemplary EM wave launcher 1032, and a plurality of slots (1048 and 1049) in the slotted antenna 1046 are illustrated as if one can see through resonator plate 1050 to the slotted antenna 1046. As shown in FIG. 10A, the plurality of slots (1048 and 1049) can be arranged in pairs, and each of the pair of slots comprises a first slot oriented orthogonal to a second slot. However, the orientation of slots in the plurality of slots (1048 and 1049) can be arbitrary. For example, the orientation of slots in the plurality of slots (1048 and 1049) can be according to a pre-determined pattern for plasma uniformity and/or plasma stability.

In some embodiments, a plurality of first recesses 1055 can be configured in the resonator plate 1050 and one or more of the first recesses 1055 can be substantially non-aligned with the first slots 1048 in the slotted antenna 1046. Alternatively, one or more of the first recesses 1055 may be aligned or partially aligned with one or more of the first slots 1048 in the slotted antenna 1046. In addition, a channel recess 1065 can be configured in the resonator plate 1050, and the channel recess 1065 can comprise an arbitrary geometry including, for example, a cylindrical geometry, a spherical geometry, an aspherical geometry, a rectangular geometry, or any arbitrary shape. The channel recess 1065 can include a channel depth 1066 and a channel width 1067. For example, the channel recess 1065 can be substantially aligned with the plurality of second slots 1049. Alternatively, the channel recess 1065 may be either aligned, partly aligned, or not aligned with the plurality of second slots 1049.

In some embodiments, opening 1090 can include an opening depth 1091 and an opening width 1092, and the gas passage 1095 can include a passage length 1096 and a passage width 1097. For example, the opening 1090 and the gas passage 1095 can be substantially aligned with the center of the resonator plate 1050. Alternatively, the opening 1090 and the gas passage 1095 may be aligned differently.

Referring still to FIG. 10A and FIG. 10B, an exemplary EM wave launcher 1032 is illustrated that can include a resonator plate 1050 with plasma-facing surface 1060. The EM wave launcher 1032 further comprises a slotted antenna 1046 having a plurality of first slots 1048 and a plurality of second slots 1049. The first slots 1048 and the second slots 1049 permit the coupling of EM energy from a first region above the slotted antenna 1046 to a second region below the slotted antenna wherein the resonator plate 1050 is located.

The number, geometry, size, and distribution of the first slots 1048 and second slots 1049 can be factors that can contribute to the spatial uniformity and stability of the plasma formed in plasma generation space (125a, FIG. 1). Thus, the design of the slotted antenna 1046 may be used to control the spatial uniformity and stability of the plasmas in the plasma/processing spaces (125a and/or 125b, FIG. 1).

In various embodiments, the first recesses 1055 and the channel recesses 1065 can comprise a unique indentation or dimple formed within the plasma-facing surface 1060. For example, a first recess 1055 can comprise a cylindrical geometry, a spherical geometry, an aspherical geometry, a rectangular geometry, or any arbitrary shape. The first recess 1055 can be characterized by a first depth 1056 and a first diameter 1057.

In addition, the channel recess 1065 can comprise a channel having a trapezoidal or frusto-triangular cross-section. However, the channel in the channel recess 1065 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The channel recess 1065 may comprise a channel depth 1066, a first channel width 1067, and a second channel width 1068.

Still referring to FIG. 10A and FIG. 10B, the resonator plate 1050 comprises a dielectric plate having a plate thickness 1051 and a plate diameter 1052. For example, the plasma-facing surface 1060 on resonator plate 1050 can comprise a planar surface 1061 within which the first recesses 1055 and the channel recess 1065 can be formed. Alternatively, the resonator plate 1050 may comprise an arbitrary geometry that can include concave, and/or convex surfaces.

The propagation of EM energy in the resonator plate 1050 may be characterized by an effective wavelength ($\lambda$) for a given frequency of EM energy and dielectric constant for the resonator plate 1050. The plate thickness 1051 may be an integer number of quarter wavelengths (n $\lambda/4$), where n is an integer greater than zero) or an integer number of half wavelengths (m $\lambda/2$, where m is an integer greater than zero). For instance, the plate thickness 1051 may be about a half wavelength thick ($\lambda/2$) or greater than about half the effective wavelength ($>\lambda/2$). Alternatively, the plate thickness 1051 may range from about 25 mm (millimeters) to about 45 mm.

As an example, the first recesses 1055 can be located near an inner region of the plasma-facing surface 1060. In addition, the channel recesses 1065 can be located near an outer region of the plasma-facing surface 1060.

The first diameter 1057, the first channel width 1067, the second channel width 1068, the opening width 1092, and the passage width 1097 can be an integer number of quarter wavelengths (n $\lambda/4$), where n is an integer greater than zero) or an integer number of half wavelengths (m $\lambda/2$, where m is an integer greater than zero). Additionally, a first difference 1053 between the plate thickness 1051 and the first depth 1056 may be an integer number of quarter wavelengths (n $\lambda/4$), where n is an integer greater than zero) or an integer number of half wavelengths (m $\lambda/2$, where m is an integer greater than zero). For instance, the first diameter 1057, the first channel width 1067, the second channel width 1068, and the opening width 1092, and the passage width 1097 can be about one half the effective wavelength ($\lambda/2$), and a first difference 1053 between the plate thickness 1051 and the first depth 1056 may be about half the effective wavelength ($\lambda/2$) or about quarter the effective wavelength ($\lambda/4$). The plate thickness 1051 may be about half the effective wavelength ($\lambda/2$) or greater than half the effective wavelength ($>\lambda/2$).

Alternatively, the first diameter 1057, the first channel width 1067, the second channel width 1068, the opening width 1092, and the passage width 1097 may range from about 10 mm to about 35 mm, and the first difference 1053 between the plate thickness 1051 and the depths (1056, 1066, 1091, and 1096) may range from about 10 mm to about 35 mm.

In the first recesses 1055, the channels recesses 1065, the openings 1090, and/or the gas passages 1095, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1060. For example, the surface radius may range from about 1 mm to about 3 mm.

In addition, as shown in FIG. 10, the EM wave launcher 1032 can be fabricated with a mating element 1062 having a first mating length 1062a and a first mating width 1068b. For example, the first mating length 1062a and the first mating width 1062b may range from about 1 mm (millimeters) to about 5 mm.

The mating element 1062 may comprise an edge wall extension located at or near a periphery of the resonator plate 1150 and can be configured to couple with the process chamber wall.

Furthermore, the EM wave launcher may comprise an opening 1090 and a gas passage 1095. The opening 1090 may be configured to receive fastening devices for securing a gas line through the inner portion of the antenna 1046 to the gas passage 1095 in resonator plate 1050.

Although only one gas passage is shown, additional gas passages may be fabricated in the resonator plate 1050. Moreover, although the shape of the gas passage is straight having a cylindrical cross-section, it may be arbitrary, e.g., helical having an arbitrary cross-section. Any one or more of these features described in FIG. 10 may be implemented in any one of the embodiments described in FIGS. 3 through 9.

The channel widths (1067 and 1068) can be an integer number of quarter wavelengths (n $\lambda/4$), where n is an integer greater than zero) or an integer number of half wavelengths (m $\lambda/2$), where m is an integer greater than zero). Additionally, a second difference 1063 between the plate thickness 1051 and the channel depth 1066 may be an integer number of quarter wavelengths (n $\lambda/4$), where n is an integer greater than zero) or an integer number of half wavelengths (m $\lambda/2$), where m is an integer greater than zero). For instance, the channel widths (1067 and 1068) may be about half the effective wavelength ($\lambda/2$), and a second difference 1063 between the plate thickness 1051 and the channel depth 1066 may be about half the effective wavelength ($\lambda/2$) or about quarter the effective wavelength ($\lambda/4$).

Alternatively, the channel widths (1067 and 1068) may range from about 25 mm (millimeters) to about 35 mm, and the second difference 1063 between the plate thickness 1051 and the channel depth 1066 may range from about 10 mm to about 35 mm. Alternatively yet, the channel widths (1067 and 1068) may range from about 30 mm to about 35 mm, and the second difference may range from about 10 mm to about 20 mm.

In the channel recess 1065, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1060. For example, the surface radius may range from about 1 mm to about 3 mm.

FIG. 11A illustrates a bottom view of an EM wave launcher in accordance with embodiments of the invention, and FIG. 11B illustrates a schematic cross-sectional view of a portion of the EM wave launcher depicted in FIG. 11A. FIG. 11A illustrates a bottom view of an exemplary EM wave launcher 1132, and a plurality of slots (1148 and 1149) in the slotted antenna 1146 are illustrated as if one can see through resonator plate 1150 to the slotted antenna 1146. As shown in FIG. 11A, the plurality of slots (1148 and 1149) can be arranged in pairs, and each of the pair of slots comprises a first slot oriented orthogonal to a second slot. However, the orientation of slots in the plurality of slots (1148 and 1149) can be arbitrary. For example, the orientation of slots in the plurality of slots (1148 and 1149) can be according to a pre-determined pattern for plasma uniformity and/or plasma stability.

In some embodiments, a first recess 1155 can be configured in the resonator plate 1150, and the outer edge of the first recess 1155 can be substantially aligned with the second slots 1149 in the slotted antenna 1146. Alternatively, the first recess 1155 may be smaller and may be aligned or partially aligned with one or more of the first slots 1148 in the slotted antenna 1146. In addition, the first recess 1155 can have a trapezoidal or frusto-triangular cross-section. However, the first recess 1155 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess 1155 may comprise a recess depth 1156, a first recess width 1157, and a second recess width 1158.

In addition, as shown in FIG. 11B, the EM wave launcher 1132 can be fabricated with a mating element 1162 having a first mating length 1162a and a first mating width 1162b. For example, the first mating length 1162a and the first mating width 1162b may range from about 1 mm (millimeters) to about 5 mm.

The mating element 1162 may comprise an edge wall extension located at or near a periphery of the resonator plate 1150 and can be configured to couple with the process chamber wall. Furthermore, the EM wave launcher may comprise an opening 1190 and a gas passage 1195. The opening 1190 may be configured to receive fastening devices for securing a gas line through the inner portion of the antenna 1146 to the gas passage 1195 in resonator plate 1150.

Although only one gas passage is shown, additional gas passages may be fabricated in the resonator plate 1150. Moreover, although the shape of the gas passage is straight having a cylindrical cross-section, it may be arbitrary, e.g., helical having an arbitrary cross-section. Any one or more of these features described in FIGS. 11A and 11B may be implemented in any one of the embodiments described in FIGS. 3 through 9.

In some embodiments, opening 1190 can include an opening depth 1191 and an opening width 1192, and the gas passage 1195 can include a passage length 1196 and passage width 1197. For example, the opening 1190 and the gas passage 1195 can be substantially aligned with the center of the resonator plate 1150. Alternatively, the opening 1190 and the gas passage 1195 may be aligned differently.

Referring still to FIG. 11A and FIG. 11B, an exemplary EM wave launcher 1132 is illustrated that can include a resonator plate 1150 with plasma-facing surface 1160. The EM wave launcher 1132 further comprises a slotted antenna 1146 having a plurality of first slots 1148 and a plurality of second slots 1149. The first slots 1148 and the second slots 1149 permit the coupling of EM energy from a first region above the slotted antenna 1146 to a second region below the slotted antenna wherein the resonator plate 1150 is located.

The number, geometry, size, and distribution of the first slots 1148 and second slots 1149 can be factors that can contribute to the spatial uniformity and stability of the plasma formed in plasma generation space (125a, FIG. 1). Thus, the design of the slotted antenna 1146 may be used to control the spatial uniformity and stability of the plasmas in the plasma/processing spaces (125a and/or 125b, FIG. 1).

Still referring to FIG. 11A and FIG. 11B, the resonator plate 1150 comprises a dielectric plate having a plate thickness 1151 and a plate diameter 1152. For example, the plasma-facing surface 1160 on resonator plate 1150 can comprise a planar surface 1161 within which the first recess 1155 can be formed. Alternatively, the resonator plate 1150 may comprise an arbitrary geometry that can include concave, and/or convex surfaces.

The propagation of EM energy in the resonator plate 1150 may be characterized by an effective wavelength ($\lambda$) for a given frequency of EM energy and dielectric constant for the resonator plate 1150. The plate thickness 1151 may be an integer number of quarter wavelengths (n $\lambda/4$), where n is an integer greater than zero) or an integer number of half wavelengths (m $\lambda/2$), where m is an integer greater than zero). For instance, the plate thickness 1151 may be about a half wavelength thick ($\lambda/2$) or greater than about half the effective wavelength ($>\lambda/2$). Alternatively, the plate thickness 1151 may range from about 25 mm (millimeters) to about 45 mm.

The first recess width 1157, the second recess width 1168, the opening width 1192, and the gas passage width 1197 can be an integer number of quarter wavelengths (n $\lambda/4$), where n is an integer greater than zero) or an integer number of half wavelengths (m $\lambda/2$), where m is an integer greater than zero). Additionally, a first difference 1153 between the plate thickness 1151 and the first depth 1156 may be an integer number of quarter wavelengths (n $\lambda/4$), where n is an integer greater than zero) or an integer number of half wavelengths (m $\lambda/2$), where m is an integer greater than zero). For instance, the first recess width 1157, the second recess width 1168, the opening width 1192, and the gas passage width 1197 can be about one half the effective wavelength ($\lambda/2$), and a first difference 1153 between the plate thickness 1151 and the first depth 1156 may be about half the effective wavelength ($\lambda/2$) or about quarter the effective wavelength ($\lambda/4$). The plate thickness 1151 may be about half the effective wavelength ($\lambda/2$) or greater than half the effective wavelength ($>\lambda/2$).

Alternatively, the first recess width 1157, the second recess width 1168, the opening width 1192, and the gas passage width 1197 may range from about 2 mm to about 35 mm, and the first difference 1153 between the plate thickness 1151 and the depths (1156, 1166, and 1196) may range from about 2 mm to about 35 mm.

In the first recess 1155, the opening 1190, and/or the gas passage 1195, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1160. For example, the surface radius may range from about 1 mm to about 3 mm.

Figures 12A, 12B:
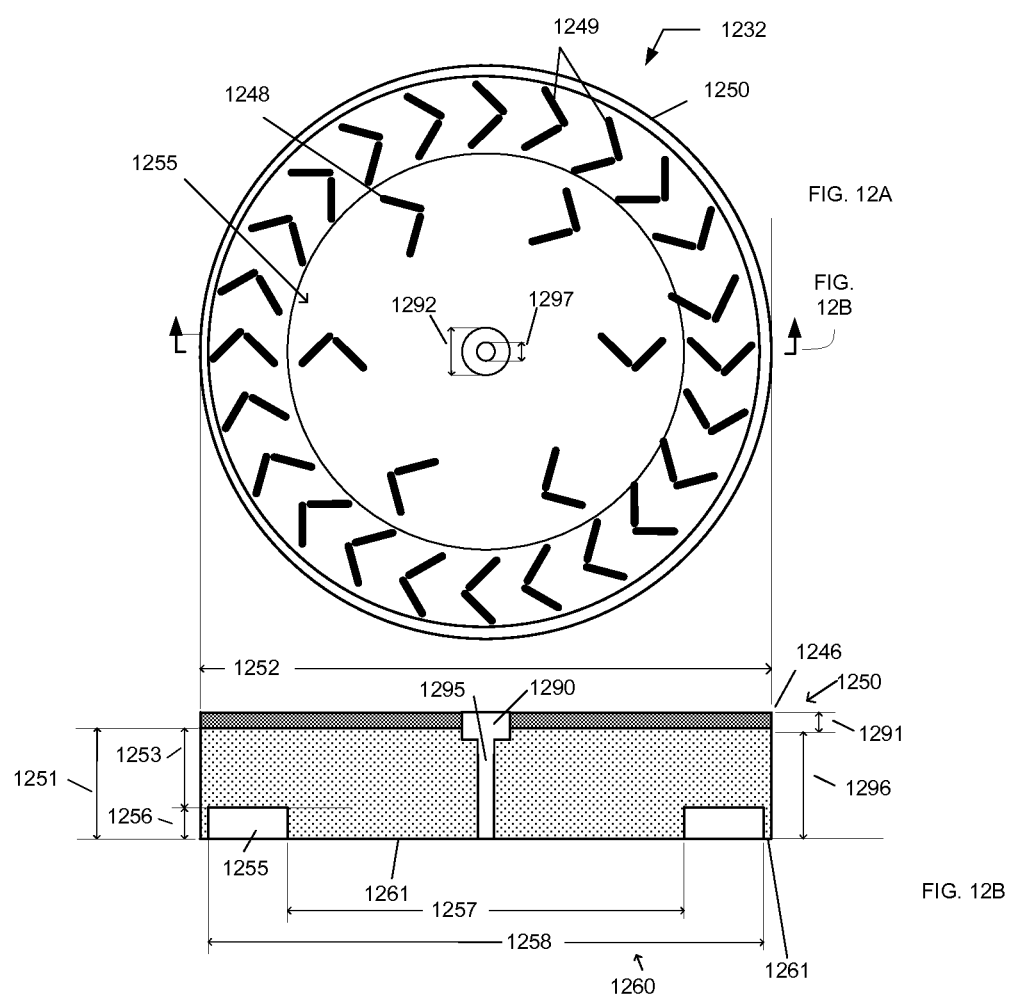
FIG. 12A illustrates a bottom view of an EM wave launcher in accordance with additional embodiments of the invention.
FIG. 12B illustrates a schematic cross-sectional view of a portion of the EM wave launcher depicted in FIG. 12A.

FIG. 12A illustrates a bottom view of an EM wave launcher in accordance with embodiments of the invention, and FIG. 12B illustrates a schematic cross-sectional view of a portion of the EM wave launcher depicted in FIG. 12A. FIG. 12A illustrates a bottom view of an exemplary EM wave launcher 1232, and a plurality of slots (1248 and 1249) in the slotted antenna 1246 are illustrated as if one can see through resonator plate 1250 to the slotted antenna 1246. As shown in FIG. 12A, the plurality of slots (1248 and 1249) can be arranged in pairs, and each of the pair of slots comprises a first slot oriented orthogonal to a second slot. However, the orientation of slots in the plurality of slots (1248 and 1249) can be arbitrary. For example, the orientation of slots in the plurality of slots (1248 and 1249) can be according to a pre-determined pattern for plasma uniformity and/or plasma stability.

In some embodiments, a channel recess 1255 can be configured in the resonator plate 1250, and the channel recess 1255 can be substantially aligned with the second slots 1249 in the slotted antenna 1246. Alternatively, the channel recess 1255 may be smaller and may be aligned or partially aligned with one or more of the first slots 1248 in the slotted antenna 1246. In addition, the channel recess 1255 can comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The channel recess 1255 may comprise a channel depth 1256, a first channel diameter 1257, and a second channel diameter 1258.

In addition, as shown in FIG. 12B, the EM wave launcher 1232 can be fabricated with an opening 1290 and a gas passage 1295. The opening 1290 may be configured to receive fastening devices for securing a gas line through the inner portion of the antenna 1246 to the gas passage 1295 in resonator plate 1250.

Although only one gas passage is shown, additional gas passages may be fabricated in the resonator plate 1250. Moreover, although the shape of the gas passage is straight having a cylindrical cross-section, it may be arbitrary, e.g., helical having an arbitrary cross-section. Any one or more of these features described in FIGS. 12A and 12B may be implemented in any one of the embodiments described in FIGS. 3 through 9.

In some embodiments, opening 1290 can include an opening depth 1291 and an opening width 1292, and the gas passage 1295 can include a passage length 1296 and passage width 1297. For example, the opening 1290 and the gas passage 1295 can be substantially aligned with the center of the resonator plate 1250. Alternatively, the opening 1290 and the gas passage 1295 may be aligned differently.

Referring still to FIG. 12A and FIG. 12B, an exemplary EM wave launcher 1232 is illustrated that can include a resonator plate 1250 with plasma-facing surface 1260. The EM wave launcher 1232 further comprises a slotted antenna 1246 having a plurality of first slots 1248 and a plurality of second slots 1249. The first slots 1248 and the second slots 1249 permit the coupling of EM energy from a first region above the slotted antenna 1246 to a second region below the slotted antenna wherein the resonator plate 1250 is located.

The number, geometry, size, and distribution of the first slots 1248 and second slots 1249 can be factors that can contribute to the spatial uniformity and stability of the plasma formed in plasma generation space (125a, FIG. 1). Thus, the design of the slotted antenna 1246 may be used to control the spatial uniformity and stability of the plasmas in the plasma/processing spaces (125a and/or 125b, FIG. 1).

Still referring to FIG. 12A and FIG. 12B, the resonator plate 1250 comprises a dielectric plate having a plate thickness 1251 and a plate diameter 1252. For example, the plasma-facing surface 1260 on resonator plate 1250 can comprise a planar surface 1261 within which the channel recess 1255 can be formed. Alternatively, the resonator plate 1250 may comprise an arbitrary geometry that can include concave, and/or convex surfaces.

The propagation of EM energy in the resonator plate 1250 may be characterized by an effective wavelength ($\lambda$) for a given frequency of EM energy and dielectric constant for the resonator plate 1250. The plate thickness 1251 may be an integer number of quarter wavelengths (n $\lambda/4$, where n is an integer greater than zero) or an integer number of half wavelengths (m $\lambda/2$, where m is an integer greater than zero). For instance, the plate thickness 1251 may be about a half wavelength thick ($\lambda/2$) or greater than about half the effective wavelength ($>\lambda/2$). Alternatively, the plate thickness 1251 may range from about 25 mm (millimeters) to about 45 mm.

The first channel diameter 1257, the second channel diameter 1258, the opening width 1292, and the gas passage width 1297 can be an integer number of quarter wavelengths (n $\lambda/4$), where n is an integer greater than zero) or an integer number of half wavelengths (m $\lambda/2$), where m is an integer greater than zero). Additionally, a first difference 1253 between the plate thickness 1251 and the channel depth 1256 may be an integer number of quarter wavelengths (n $\lambda/4$, where n is an integer greater than zero) or an integer number of half wavelengths (m $\lambda/2$, where m is an integer greater than zero). For instance, the channel width, the opening width 1292, and the gas passage width 1297 can be about one half the effective wavelength ($\lambda/2$). Alternatively, the opening width 1292, and the gas passage width 1297 may range from about 2 mm to about 15 mm, and the first difference 1253 between the plate thickness 1251 and the depths (1256, 1291, and 1296) may range from about 1 mm to about 35 mm.

In the channel recess 1255, the opening 1290, and/or the gas passage 1295, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1160. For example, the surface radius may range from about 1 mm to about 3 mm.

Although not shown in any one of the embodiments provided in FIGS. 5 through 12, one or more recesses may be interconnected. Additionally, one or more recesses of one recess configuration may be interconnected with one or more recesses of another recess configuration. For example, one or more recesses may be interconnected or linked by a groove or channel.

During various VUV/EEDf-related procedures, the plasma sources (115, FIG. 1) can comprise an electromagnetic (EM)

wave launcher (332, FIG. 3), or the EM wave launcher (432, FIG. 4), or the EM wave launcher (532, FIG. 5), or the EM wave launcher (632, FIG. 6), or the EM wave launcher (732, FIG. 7), or the EM wave launcher (832, FIG. 8), or the EM wave launcher (932, FIG. 9), or the EM wave launcher 1032, FIG. 10), or the EM wave launcher (1132, FIG. 11), or the EM wave launcher (1232, FIG. 12), or any combination thereof. In addition, the plasma-facing surfaces (116, FIG. 1) of the plasma sources (115, FIG. 1) can comprise plasma-facing surface (360, FIG. 3), or the plasma-facing surface (460, FIG. 4), or the plasma-facing surface (560, FIG. 5), or the plasma-facing surface (660, FIG. 6), or the plasma-facing surface (760, FIG. 7), or the plasma-facing surface (860, FIG. 8), or the plasma-facing surface (960, FIG. 9), or the plasma-facing surface (1060, FIG. 10), or the plasma-facing surface (1160, FIG. 11), or the plasma-facing surface (1260, FIG. 12), or any combination thereof. Furthermore, the recesses (117, FIG. 1) in the plasma-facing surfaces (116, FIG. 1) can comprise the recesses (455 and/or 465, FIG. 4), or the recesses (555 and/or 565, FIG. 5), or the recesses (655 and/or 665, FIG. 6), or the recesses (755 and/or 765, FIG. 7), or the recesses (855 and/or 865, FIG. 8), or the recesses (955 and/or 965, FIG. 9), or the recesses (1055 and/or 1065, FIG. 10), or the recesses (1155 and/or 1165, FIG. 11), or the channel recesses (1255, FIG. 12), or any combination thereof.

Figure 13:
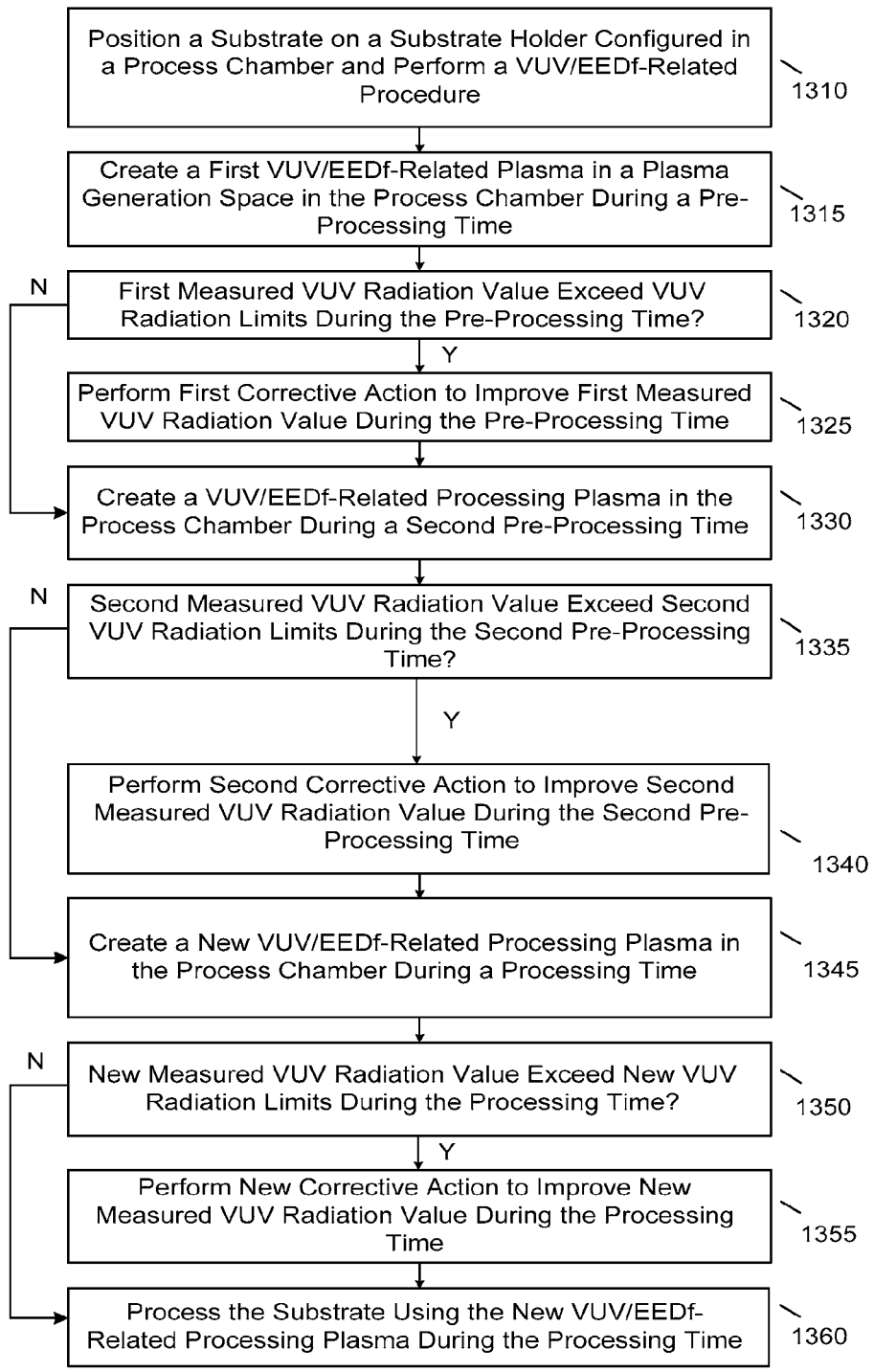
FIG. 13 illustrates an exemplary flow diagram of a method for processing a wafer using VUV/EEDf-related procedures in accordance with embodiments of the invention.

FIG. 13 illustrates an exemplary flow diagram of a method for processing a wafer using VUV/EEDf-related procedures in accordance with embodiments of the invention. FIG. 13 illustrates a procedure 1300 for processing a substrate using the plasma processing subsystem (100, FIG. 1). Procedure 1300 can include a number of processing steps. During some VUV/EEDf-related procedures, different chamber pressures can be established using the pumping system (180, FIG. 1) and the pressure control system (181, FIG. 1). For example, the chamber pressures can vary from about 1 mTorr to about 1000 mTorr. In addition, different substrate temperatures can be established using the substrate temperature control system (128, FIG. 1) and the temperature control elements (129, FIG. 1). For example, the substrate temperatures can vary from about −10° C. to about 250° C.

In 1310, a substrate (121, FIG. 1) can be positioned on a substrate holder (120, FIG. 1) in a process chamber (110, FIG. 1) that is configured to create a VUV/EEDf-related plasma during a VUV/EEDf-related procedure, and the processing time for the VUV/EEDf-related procedures can vary from about 2 seconds to about 2 minutes. A plasma source (115, FIG. 1) can be coupled to the top of the process chamber (110, FIG. 1), and the plasma source (115, FIG. 1) can comprise a plasma-facing surface (116, FIG. 1) having a plurality of recesses (117, FIG. 1) that forms the top wall of the process chamber (110, FIG. 1).

In 1315, initial VUV/EEDf-related pre-processing plasma can be created during a first pre-processing time associated with the VUV/EEDf-related procedure. In some embodiments, an initial gas mixture can be provided to the top portion and/or the bottom portion of the process chamber (110, FIG. 1) during the first pre-processing time associated with the VUV/EEDf-related procedure, and the initial gas mixture can include an initial plasma stabilization gas and/or an initial process gas. For example, a gravity separation effect can be used to allow the initial plasma stabilization gas to move (diffuse) into a plasma generation space (125a, FIG. 1) at the top of the process chamber (110, FIG. 1) during the first pre-processing time. Alternatively, the gravity separation effect may not be required. In addition, one or more gas supply elements (155 and/or 165, FIG. 1) can be coupled to the process chamber (110, FIG. 1), and one or more of the gas supply elements (155 and/or 165, FIG. 1) can be configured to provide the initial gas mixture, can be configured to control the initial gas mixture components, the initial gas mixture flow rates and the initial gas mixture flow directions.

In other embodiments, one or more initial plasma stabilization gases can flow into a plasma generation space (125a, FIG. 1) at the top of the process chamber (110, FIG. 1) during the first pre-processing time associated with the VUV/EEDf-related procedure. For example, one or more gas supply elements (155, FIG. 1) can be coupled to the process chamber (110, FIG. 1) proximate to the top portion of the process chamber, and one or more of the gas supply elements (155, FIG. 1) can be configured to provide the initial plasma stabilization gas to a plasma generation space (125a, FIG. 1) proximate to the plasma-facing surface (116, FIG. 1) during the first pre-processing time. In some examples, the initial plasma stabilization gas can diffuse into at least one of the recesses (117, FIG. 1) in the plasma-facing surface (116, FIG. 1) at the top of the process chamber (110, FIG. 1) during the first pre-processing time.

In addition, the plasma source (115, FIG. 1) can be configured to provide an initial pre-processing power through the plasma-facing surface (116, FIG. 1) to the plasma generation gas during the first pre-processing time, thereby creating the initial VUV/EEDf-related pre-processing plasma in the plasma generation space proximate to the plasma-facing surface (116, FIG. 1) during the first pre-processing time. In various embodiments, the initial pre-processing power can be provided by a surface wave plasma (SWP) source, a microwave source, and/or a radio frequency (RF) source, and the initial pre-processing power can vary from about 100 watts to about 10000 watts. For example, the first pre-processing time can vary from about 10 micro-seconds to about 10 seconds.

In 1320, a first measured VUV radiation value can be measured and/or determined for the initial VUV/EEDf-related pre-processing plasma and can be compared to first VUV radiation limits during the first pre-processing time. A first query can be performed to determine if the first VUV radiation value exceeds the first VUV radiation limits. When the first VUV radiation value exceeds one or more of the first VUV radiation limits, procedure 1300 can branch to 1325 and continue as shown in FIG. 13. When the first VUV radiation value does not exceed at least one of the first VUV radiation limits, procedure 1300 can branch to 1330 and continue as shown in FIG. 13. One or more of the VUV/EEDf sensor subsystems (135, 145) or one or more of the process sensors (132) coupled to the process chamber (110) can be used to determine the first VUV radiation values during the first pre-processing time. The intensity and intermittency of EM radiation and/or VUV radiation intensity emanating from the initial pre-processing plasma may be used to evaluate the stability of the plasma. For example, unstable plasma can create intermittent EM radiation and/or VUV radiation signals. In addition, the initial pre-processing plasma can be stopped to prevent damage to the substrate if the first VUV radiation value exceeds a first limit and/or if the EEDf data is not correct. For example, the first VUV limit can be dependent upon the gate size, the photoresist materials, the dielectric materials, the semiconductor materials, and/or the metallic materials associated with the gate stacks being processed.

In 1325, at least one first corrective action can be performed to improve the first VUV radiation value during the first pre-processing time. The initial gas mixture components, the initial gas mixture flow rates, the initial gas mixture directions, the number of initial pre-processing gases, the initial pre-processing gas flow rates, the initial pre-processing gas flow directions, the chamber pressure, the chamber temperature, the initial pre-processing power, or the substrate temperature, or any combination thereof can be updated during corrective actions.

In 1330, one or more first VUV/EEDf-related plasmas can be created in the processing chamber during a second pre-processing time associated with the VUV/EEDf-related procedure. In some embodiments, a first gas mixture can be provided to the top portion and/or the bottom portion of the process chamber (110, FIG. 1) during the second pre-processing time associated with the VUV/EEDf-related procedure, and the first gas mixture can include a first plasma stabilization gas and/or a first plasma process gas. The first plasma stabilization gas, when used, can move (diffuse) into a plasma generation space (125a, FIG. 1) at the top of the process chamber (110, FIG. 1), and can be used to create a first stabilization plasma during the second pre-processing time. The first plasma process gas, when used, can move (diffuse) into a plasma process space (125b, FIG. 1) at the bottom of the process chamber (110, FIG. 1), and can be used to create a first process plasma during the second pre-processing time. Alternatively, the first plasma stabilization gas and/or the first plasma process gas may be present through-out the process chamber. For example, one or more gas supply elements (155 and/or 165, FIG. 1) can be coupled to the process chamber (110, FIG. 1), and one or more of the gas supply elements (155 and/or 165, FIG. 1) can be configured to provide the first gas mixture, can be configured to control the first gas mixture components, the first gas mixture flow rates and the first gas mixture flow directions.

In other embodiments, one or more first plasma stabilization gases can flow into a plasma generation space (125a, FIG. 1) at the top of the process chamber (110, FIG. 1) during the second pre-processing time associated with the VUV/EEDf-related procedure. For example, one or more gas supply elements (155, FIG. 1) can be coupled to the process chamber (110, FIG. 1) proximate to the top portion of the process chamber, and one or more of the gas supply elements (155, FIG. 1) can be configured to provide the first plasma stabilization gas to a plasma generation space (125a, FIG. 1) proximate to the plasma-facing surface (116, FIG. 1) during the second pre-processing time. In some examples, the first plasma stabilization gas can diffuse into at least one of the recesses (117, FIG. 1) in the plasma-facing surface (116, FIG. 1) at the top of the process chamber (110, FIG. 1) during a second pre-processing time.

In addition, the plasma source (115, FIG. 1) can be configured to provide a second pre-processing power through the plasma-facing surface (116, FIG. 1) to the first plasma stabilization gas and/or to the plasma process gas in the process chamber (110, FIG. 1) during the second pre-processing time, thereby creating the first stabilization plasma and/or the first process plasma in the process chamber (110, FIG. 1) during the second pre-processing time. In other embodiments, the first process gas may not be provided during the second pre-processing time. For example, the second pre-processing times for these VUV/EEDf-related plasma processes can vary from about one millisecond to about 10 seconds. In various embodiments, the second pre-processing power can be provided by a surface wave plasma (SWP) source, a microwave source, and/or a radio frequency (RF) source, and the second pre-processing power can vary from about 100 watts to about 10000 watts.

In 1335, a second measured VUV radiation value can be measured and/or determined when one or more of the VUV/EEDf-related plasmas are created during the second pre-processing time and can be compared to second VUV radiation limits during the second pre-processing time. A second query can be performed to determine if the second VUV radiation value exceeds the second VUV radiation limits. When the second VUV radiation value exceeds one or more of the second VUV radiation limits, procedure 1300 can branch to 1340 and continue as shown in FIG. 13. When the second VUV radiation value does not exceed at least one of the second VUV radiation limits, procedure 1300 can branch to 1345 and continue as shown in FIG. 13. One or more of the VUV/EEDf sensor subsystems (135, 145) or one or more of the process sensors (132) coupled to the process chamber (110) can be used to determine the second VUV radiation values. The intensity and intermittency of EM radiation and/or VUV radiation intensity emanating from one or more of the VUV/EEDf-related plasmas during the second pre-processing time may be used to evaluate the stability of the first stabilization plasma and/or the first process plasma. For example, an unstable first stabilization plasma and/or unstable first process plasma can create intermittent EM radiation and/or VUV radiation signals. In addition, the first stabilization plasma and/or the first process plasma can be stopped to prevent damage to the substrate if the VUV radiation value exceeds a limit and/or if the EEDf data is not correct.

In 1340, at least one second corrective action can be performed to improve the second VUV radiation value during the second pre-processing time. The first gas mixture components, the first gas mixture flow rates, the first gas mixture directions, the number of first pre-processing gases, the first pre-processing gas flow rates, the first pre-processing gas flow directions, the chamber pressure, the chamber temperature, the second pre-processing power, or the substrate temperature, or any combination thereof can be updated during the second corrective actions.

In 1345, one or more new VUV/EEDf-related plasmas can be created in the processing chamber during a new processing time associated with the VUV/EEDf-related procedure. In some embodiments, a new gas mixture can be provided to the top portion and/or the bottom portion of the process chamber (110, FIG. 1) during the new processing time associated with the VUV/EEDf-related procedure, and the new gas mixture can include a new plasma stabilization gas and/or a new plasma process gas. The new plasma stabilization gas, when used, can move (diffuse) into a plasma generation space (125a, FIG. 1) at the top of the process chamber (110, FIG. 1), and can be used to create a new stabilization plasma during the new processing time. The new plasma process gas, when used, can move (diffuse) into a plasma process space (125b, FIG. 1) at the bottom of the process chamber (110, FIG. 1), and can be used to create a new process plasma during the new processing time. Alternatively, the new plasma stabilization gas and/or the new plasma process gas may be present through-out the process chamber. For example, one or more gas supply elements (155 and/or 165, FIG. 1) can be coupled to the process chamber (110, FIG. 1), and one or more of the gas supply elements (155 and/or 165, FIG. 1) can be configured to provide the new gas mixture, can be configured to control the new gas mixture components, the new gas mixture flow rates and the new gas mixture flow directions.

In other embodiments, one or more new plasma stabilization gases and/or plasma process gases can flow into the top of the process chamber (110, FIG. 1) during the new processing time associated with the VUV/EEDf-related procedure. For example, one or more gas supply elements (155, FIG. 1) can be coupled to the process chamber (110, FIG. 1) proximate to the top portion of the process chamber, and one or more of the gas supply elements (155, FIG. 1) can be configured to provide the new plasma stabilization gases and/or new plasma process gases to the process chamber (110, FIG. 1) during the new processing time. In some examples, the new plasma stabilization gases and/or new plasma process gases can diffuse into at least one of the recesses (117, FIG. 1) in the plasma-facing surface (116, FIG. 1) at the top of the process chamber (110, FIG. 1) during a new processing time.

In addition, the plasma source (115, FIG. 1) can be configured to provide a new processing power through the plasma-facing surface (116, FIG. 1) to the new plasma stabilization gas and/or to the new plasma process gas in the process chamber (110, FIG. 1) during the new processing time, thereby creating the new stabilization plasma and/or the new process plasma in the process chamber (110, FIG. 1) during the new processing time. In other embodiments, the new plasma stabilization gas and/or to the new plasma process gas may not be provided during some portions of the new processing time. For example, the new processing times for the new VUV/EEDf-related plasma processes can vary from about ten seconds to about 10 minutes. In various embodiments, the new processing power can be provided by a surface wave plasma (SWP) source, a microwave source, and/or a radio frequency (RF) source, and the second pre-processing power can vary from about 100 watts to about 10000 watts.

In 1350, one or more new measured VUV radiation values can be measured and/or determined when one or more of the VUV/EEDf-related plasmas are created during the new processing time and can be compared to new VUV radiation limits during the new processing time. At least one new query can be performed to determine if the new VUV radiation value exceeds any of the new VUV radiation limits. When the new VUV radiation value exceeds one or more of the new VUV radiation limits, procedure 1300 can branch to 1355 and continue as shown in FIG. 13. When the new VUV radiation value does not exceed at least one of the new VUV radiation limits, procedure 1300 can branch to 1360 and continue as shown in FIG. 13. One or more of the VUV/EEDf sensor subsystems (135, 145) or one or more of the process sensors (132) coupled to the process chamber (110) can be used to determine the new VUV radiation values. The intensity and intermittency of EM radiation and/or VUV radiation intensity emanating from one or more of the VUV/EEDf-related plasmas during the new processing time may be used to evaluate the stability of the new stabilization plasma and/or the new process plasma. For example, an unstable new stabilization plasma and/or unstable new process plasma can create intermittent EM radiation and/or VUV radiation signals during the new processing time. In addition, the new stabilization plasma and/or the new process plasma can be stopped to prevent damage to the substrate if the VUV radiation value exceeds a limit and/or if the EEDf data is not correct during the new processing time.

In 1355, at least one new corrective action can be performed to improve the new VUV radiation value during the new processing time. The new gas mixture components, the new gas mixture flow rates, the new gas mixture directions, the number of new processing gases, the new processing gas flow rates, the new processing gas flow directions, the chamber pressure, the chamber temperature, the new processing power, or the substrate temperature, or any combination thereof can be updated during the new corrective actions.

In 1360, the VUV/EEDf-related procedure can continue and the substrate can be processed using one or more of the new VUV/EEDf-related plasmas can be created in the processing chamber during a new processing time associated with the VUV/EEDf-related procedure. For example, one or more new measured VUV radiation values can be measured and/or determined when one or more of the VUV/EEDf-related plasmas are used to process the substrate during the new processing time and can be compared to new VUV radiation limits during the new processing time. For example, the flow rates for the new plasma stabilization gas and/or to the new plasma process gas can vary from about zero sccm to about 400 sccm during the pre-processing times and/or during the new processing time.

Figure 14:
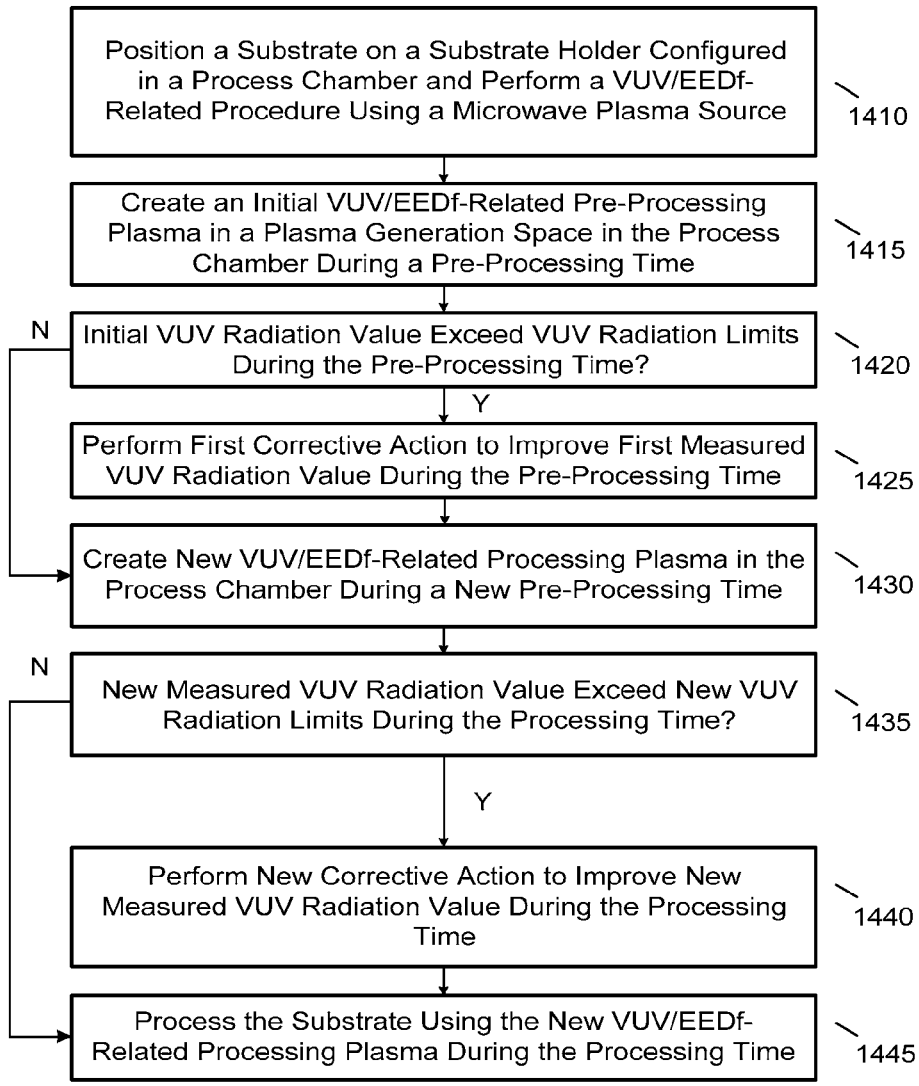
FIG. 14 illustrates another exemplary flow diagram of a method for processing a wafer using VUV/EEDf-related procedures in accordance with embodiments of the invention.

FIG. 14 illustrates another exemplary flow diagram of a method for processing a wafer using VUV/EEDf-related procedures in accordance with embodiments of the invention. FIG. 14 illustrates a procedure 1400 for processing a substrate using the plasma processing subsystem (100, FIG. 1). Procedure 1400 can include a number of processing steps. During some VUV/EEDf-related procedures, different chamber pressures can be established using the pumping system (180, FIG. 1) and the pressure control system (181, FIG. 1). For example, the chamber pressures can vary from about 1 mTorr to about 1000 mTorr. In addition, different substrate temperatures can be established using the substrate temperature control system (128, FIG. 1) and the temperature control elements (129, FIG. 1). For example, the substrate temperatures can vary from about −10° C. to about 250° C.

In 1410, a substrate (121, FIG. 1) can be positioned on a substrate holder (120, FIG. 1) in a process chamber (110, FIG. 1) that is configured to create a VUV/EEDf-related plasma during a VUV/EEDf-related procedure, and the processing time for the VUV/EEDf-related procedures can vary from about 2 seconds to about 2 minutes. A plasma source (115, FIG. 1) can be coupled to the top of the process chamber (110, FIG. 1), and the plasma source (115, FIG. 1) can comprise a plasma-facing surface (116, FIG. 1) having a plurality of recesses (117, FIG. 1) that forms the top wall of the process chamber (110, FIG. 1).

In 1415, initial VUV/EEDf-related pre-processing plasma can be created during a first pre-processing time associated with the VUV/EEDf-related procedure. In some embodiments, an initial gas mixture can be provided to the top portion and/or the bottom portion of the process chamber (110, FIG. 1) during the first pre-processing time associated with the VUV/EEDf-related procedure, and the initial gas mixture can include an initial plasma stabilization gas and/or an initial process gas. For example, a gravity separation effect can be used to allow the initial plasma stabilization gas to move (diffuse) into a plasma generation space (125a, FIG. 1) at the top of the process chamber (110, FIG. 1) during the first pre-processing time. In addition, one or more gas supply elements (155 and/or 165, FIG. 1) can be coupled to the process chamber (110, FIG. 1), and one or more of the gas supply elements (155 and/or 165, FIG. 1) can be configured to provide the initial gas mixture, can be configured to control the initial gas mixture components, the initial gas mixture flow rates and the initial gas mixture flow directions.

In other embodiments, one or more initial plasma stabilization gases can flow into a plasma generation space (125a, FIG. 1) at the top of the process chamber (110, FIG. 1) during the first pre-processing time associated with the VUV/EEDf-related procedure. For example, one or more gas supply elements (155, FIG. 1) can be coupled to the process chamber (110, FIG. 1) proximate to the top portion of the process chamber, and one or more of the gas supply elements (155, FIG. 1) can be configured to provide the initial plasma stabilization gas to a plasma generation space (125a, FIG. 1) proximate to the plasma-facing surface (116, FIG. 1) during the first pre-processing time. In some examples, the initial plasma stabilization gas can diffuse into at least one of the recesses (117, FIG. 1) in the plasma-facing surface (116, FIG. 1) at the top of the process chamber (110, FIG. 1) during the first pre-processing time.

In addition, the plasma source (115, FIG. 1) can be configured to provide an initial pre-processing power through the plasma-facing surface (116, FIG. 1) to the plasma generation gas during the first pre-processing time, thereby creating the initial VUV/EEDf-related pre-processing plasma in the plasma generation space proximate to the plasma-facing surface (116, FIG. 1) during the first pre-processing time. In various embodiments, the initial pre-processing power can be provided by a surface wave plasma (SWP) source, a microwave source, and/or a radio frequency (RF) source, and the initial pre-processing power can vary from about 100 watts to about 10000 watts. For example, the first pre-processing time can vary from about 10 micro-seconds to about 10 seconds.

In 1420, an initial VUV radiation value can be measured and/or determined for the initial VUV/EEDf-related pre-processing plasma and can be compared to first VUV radiation limits during the first pre-processing time. A first query can be performed to determine if the first VUV radiation value exceeds the first VUV radiation limits. When the first VUV radiation value exceeds one or more of the first VUV radiation limits, procedure 1400 can branch to 1425 and continue as shown in FIG. 14. When the first VUV radiation value does not exceed at least one of the first VUV radiation limits, procedure 1400 can branch to 1430 and continue as shown in FIG. 14. One or more of the VUV/EEDf sensor subsystems (135, 145) or one or more of the process sensors (132) coupled to the process chamber (110) can be used to determine the first VUV radiation values during the first pre-processing time. The intensity and intermittency of EM radiation and/or VUV radiation intensity emanating from the initial pre-processing plasma may be used to evaluate the stability of the plasma. For example, unstable plasma can create intermittent EM radiation and/or VUV radiation signals. In addition, the initial pre-processing plasma can be stopped to prevent damage to the substrate if the first VUV radiation value exceeds a first limit and/or if the EEDf data is not correct.

In 1425, at least one first corrective action can be performed to improve the first VUV radiation value during the first pre-processing time. The initial gas mixture components, the initial gas mixture flow rates, the initial gas mixture directions, the number of initial pre-processing gases, the initial pre-processing gas flow rates, the initial pre-processing gas flow directions, the chamber pressure, the chamber temperature, the initial pre-processing power, or the substrate temperature, or any combination thereof can be updated during corrective actions.

In 1430, one or more new VUV/EEDf-related plasmas can be created in the processing chamber during a new processing time associated with the VUV/EEDf-related procedure. In some embodiments, a new gas mixture can be provided to the top portion and/or the bottom portion of the process chamber (110, FIG. 1) during the new processing time associated with the VUV/EEDf-related procedure, and the new gas mixture can include a new plasma stabilization gas and/or a new plasma process gas. The new plasma stabilization gas, when used, can move (diffuse) into a plasma generation space (125*a*, FIG. 1) at the top of the process chamber (110, FIG. 1), and can be used to create a new stabilization plasma during the new processing time. The new plasma process gas, when used, can move (diffuse) into a plasma process space (125*b*, FIG. 1) at the bottom of the process chamber (110, FIG. 1), and can be used to create a new process plasma during the new processing time. Alternatively, the new plasma stabilization gas and/or the new plasma process gas may be present through-out the process chamber. For example, one or more gas supply elements (155 and/or 165, FIG. 1) can be coupled to the process chamber (110, FIG. 1), and one or more of the gas supply elements (155 and/or 165, FIG. 1) can be configured to provide the new gas mixture, can be configured to control the new gas mixture components, the new gas mixture flow rates and the new gas mixture flow directions.

In other embodiments, one or more new plasma stabilization gases and/or plasma process gases can flow into the top of the process chamber (110, FIG. 1) during the new processing time associated with the VUV/EEDf-related procedure. For example, one or more gas supply elements (155, FIG. 1) can be coupled to the process chamber (110, FIG. 1) proximate to the top portion of the process chamber, and one or more of the gas supply elements (155, FIG. 1) can be configured to provide the new plasma stabilization gases and/or new plasma process gases to the process chamber (110, FIG. 1) during the new processing time. In some examples, the new plasma stabilization gases and/or new plasma process gases can diffuse into at least one of the recesses (117, FIG. 1) in the plasma-facing surface (116, FIG. 1) at the top of the process chamber (110, FIG. 1) during a new processing time.

In addition, the plasma source (115, FIG. 1) can be configured to provide a new processing power through the plasma-facing surface (116, FIG. 1) to the new plasma stabilization gas and/or to the new plasma process gas in the process chamber (110, FIG. 1) during the new processing time, thereby creating the new stabilization plasma and/or the new process plasma in the process chamber (110, FIG. 1) during the new processing time. In other embodiments, the new plasma stabilization gas and/or to the new plasma process gas may not be provided during some portions of the new processing time. For example, the new processing times for the new VUV/EEDf-related plasma processes can vary from about ten seconds to about 10 minutes. In various embodiments, the new processing power can be provided by a surface wave plasma (SWP) source, a microwave source, and/or a radio frequency (RF) source, and the second pre-processing power can vary from about 100 watts to about 10000 watts.

In 1435, one or more new measured VUV radiation values can be measured and/or determined when one or more of the VUV/EEDf-related plasmas are created during the new processing time and can be compared to new VUV radiation limits during the new processing time. At least one new query can be performed to determine if the new VUV radiation value exceeds any of the new VUV radiation limits. When the new VUV radiation value exceeds one or more of the new VUV radiation limits, procedure 1400 can branch to 1440 and continue as shown in FIG. 14. When the new VUV radiation value does not exceed at least one of the new VUV radiation limits, procedure 1400 can branch to 1445 and continue as shown in FIG. 14. One or more of the VUV/EEDf sensor subsystems (135, 145) or one or more of the process sensors (132) coupled to the process chamber (110) can be used to determine the new VUV radiation values. The intensity and intermittency of EM radiation and/or VUV radiation intensity emanating from one or more of the VUV/EEDf-related plasmas during the new processing time may be used to evaluate the stability of the new stabilization plasma and/or the new process plasma. For example, an unstable new stabilization plasma and/or unstable new process plasma can create intermittent EM radiation and/or VUV radiation signals during the new processing time. In addition, the new stabilization plasma and/or the new process plasma can be stopped to prevent damage to the substrate if the VUV radiation value exceeds a limit and/or if the EEDf data is not correct during the new processing time.

In 1440, at least one new corrective action can be performed to improve the new VUV radiation value during the new processing time. The new gas mixture components, the new gas mixture flow rates, the new gas mixture directions, the number of new processing gases, the new processing gas flow rates, the new processing gas flow directions, the chamber pressure, the chamber temperature, the new processing power, or the substrate temperature, or any combination thereof can be updated during the new corrective actions.

In 1445, the VUV/EEDf-related procedure can continue and the substrate can be processed using one or more of the new VUV/EEDf-related plasmas can be created in the processing chamber during a new processing time associated with the VUV/EEDf-related procedure. For example, one or more new measured VUV radiation values can be measured and/or determined when one or more of the VUV/EEDf-related plasmas are used to process the substrate during the new processing time and can be compared to new VUV radiation limits during the new processing time. For example, the flow rates for the new plasma stabilization gas and/or to the new plasma process gas can vary from about zero sccm to about 400 sccm during the pre-processing times and/or during the new processing time.

In some embodiments, a new gas mixture can be provided to the top portion and/or the bottom portion of the process chamber (110, FIG. 1) during the new processing time, and the new gas mixture can include new light plasma stabilization gas and new heavy process gas. When the new "light-gas" stabilization plasma is created, high-energy electrons and/or ions can be created in the plasma generation space (125a, FIG. 1) and can be transferred to the new "heavy gas" process plasma in the plasma processing space (125b, FIG. 1) during the new processing time.

What is claimed:

1. A method for processing a substrate using a Vacuum Ultra-Violet and Electron Energy Distribution Function (VUV and EEDf)-related procedure, the method comprising:
positioning a substrate on a substrate holder in a process chamber configured to perform the VUV and EEDf-related procedure;
creating an initial VUV and EEDf-related pre-processing plasma during a first pre-processing time associated with the VUV and EEDf-related procedure using a microwave source;
determining a first measured Vacuum Ultra-Violet (VUV) radiation value for the initial VUV and EEDf-related pre-processing plasma;
comparing the first measured VUV radiation value to first VUV radiation limits during the first pre-processing time;
performing at least one first corrective action to improve the first measured VUV radiation value when the first measured VUV radiation value exceeds one or more of the first VUV radiation limits during the first pre-processing time; and
creating one or more first VUV and EEDf-related plasmas in the processing chamber during a second pre-processing time associated with the VUV and EEDf-related procedure using the microwave source.

2. The method of claim 1, further comprising:
determining a second measured VUV radiation value for at least one of the first VUV and EEDf-related plasmas during the second pre-processing time;
comparing the second measured VUV radiation value to second VUV radiation limits during the second pre-processing time;
performing at least one second corrective action to improve the second measured VUV radiation value when the second measured VUV radiation value exceeds one or more of the second VUV radiation limits during the second pre-processing time; and
creating one or more new VUV and EEDf-related plasmas in the processing chamber during a new processing time associated with the VUV and EEDf-related procedure using the microwave source.

3. The method of claim 2, further comprising:
determining a new measured VUV radiation value for at least one of the new VUV and EEDf-related plasmas during the new processing time;
comparing the new measured VUV radiation value to new VUV radiation limits during the new processing time;
performing at least one new corrective action to improve the new measured VUV radiation value when the new measured VUV radiation value exceeds one or more of the new VUV radiation limits during the new processing time; and
processing the substrate using one or more of the new VUV and EEDf-related plasmas in the processing chamber during a second new processing time associated with the VUV and EEDf-related procedure.

4. The method of claim 2, wherein the new VUV and EEDf-related plasmas comprise a stabilization plasma, or a process plasma, or any combination thereof.

5. The method of claim 1, wherein the microwave plasma source comprises a radial line slotted antenna (RLSA) plasma source, a surface wave plasma source, or a microwave electron cyclotron resonance (ECR) source, or any combination thereof.

6. The method of claim 1, wherein one or more initial plasma stabilization gases are flowed into a plasma generation space at the top of the process chamber during the first pre-processing time associated with the VUV and EEDf-related procedure.

7. The method of claim 1, wherein the microwave source comprises a resonator plate having a plasma-facing surface, the microwave source being configured to provide an initial pre-processing power through the plasma-facing surface to a plasma generation gas during the first pre-processing time, thereby creating the initial VUV and EEDf-related pre-processing plasma in the plasma generation space proximate to the plasma-facing surface during the first pre-processing time.

8. The method of claim 1, wherein one or more VUV and EEDf sensor subsystems are coupled to the process chamber and are used to determine the first measured VUV radiation value during the first pre-processing time.

9. The method of claim 1, wherein performing at least one first corrective action comprises updating at least one of: an initial gas mixture component, an initial gas mixture flow rate, an initial gas mixture direction, a number of initial pre-processing gases, an initial pre-processing gas flow rate, an initial pre-processing gas flow direction, a chamber pressure, a chamber temperature, an initial pre-processing power, and a substrate temperature.

10. A method for processing a substrate using a Vacuum Ultra-Violet and Electron Energy Distribution Function (VUV and EEDf)-related procedure, the method comprising:
positioning a substrate on a substrate holder in an upper portion of a process chamber configured to perform the VUV and EEDf-related procedure;

creating an initial VUV and EEDf-related pre-processing plasma during a first pre-processing time associated with the VUV and EEDf-related procedure using a microwave source;

determining a first measured Vacuum Ultra-Violet (VUV) radiation value for the initial VUV and EEDf-related pre-processing plasma;

comparing the first measured VUV radiation value to first VUV radiation limits during the first pre-processing time;

performing at least one first corrective action to improve the first measured VUV radiation value when the first measured VUV radiation value exceeds one or more of the first VUV radiation limits during the first pre-processing time; and creating one or more new VUV and EEDf-related plasmas in the processing chamber during a new processing time associated with the VUV and EEDf-related procedure using the microwave source.

11. The method of claim 10, further comprising:

determining a new measured VUV radiation value for at least one of the new VUV and EEDf-related plasmas during the new processing time;

comparing the new measured VUV radiation value to new VUV radiation limits during the new processing time;

performing at least one new corrective action to improve the new measured VUV radiation value when the new measured VUV radiation value exceeds one or more of the new VUV radiation limits during the new processing time; and processing the substrate using one or more of the new VUV and EEDf-related plasmas in the processing chamber during a second new processing time associated with the VUV and EEDf-related procedure.

12. The method of claim 10, wherein the new VUV and EEDf-related plasmas comprise a stabilization plasma, or a process plasma, or any combination thereof.

13. The method of claim 10, wherein the microwave plasma source comprises a radial line slotted antenna (RLSA) plasma source, a surface wave plasma source, or a microwave electron cyclotron resonance (ECR) source, or any combination thereof.

14. The method of claim 10, wherein one or more initial plasma stabilization gases are flowed into a plasma generation space at the top of the process chamber during the first pre-processing time associated with the VUV and EEDf-related procedure.

15. The method of claim 10, wherein the microwave source comprises a resonator plate having a plasma-facing surface, the microwave source being configured to provide an initial pre-processing power through the plasma-facing surface to a plasma generation gas during the first pre-processing time, thereby creating the initial VUV and EEDf-related pre-processing plasma in the plasma generation space proximate to the plasma-facing surface during the first pre-processing time.

16. The method of claim 10, wherein one or more VUV and EEDf sensor subsystems are coupled to the process chamber and are used to determine the first measured VUV radiation value during the first pre-processing time.

17. The method of claim 10, wherein performing at least one first corrective action comprises updating at least one of: an initial gas mixture component, an initial gas mixture flow rate, an initial gas mixture direction, a number of initial pre-processing gases, an initial pre-processing gas flow rate, an initial pre-processing gas flow direction, a chamber pressure, a chamber temperature, an initial pre-processing power, and a substrate temperature.

* * * * *